United States Patent
Ware et al.

(10) Patent No.: US 8,395,951 B2
(45) Date of Patent: *Mar. 12, 2013

(54) MEMORY CONTROLLER

(75) Inventors: Frederick A. Ware, Los Altos, CA (US);
Ely K. Tsern, Los Altos, CA (US);
Richard E. Perego, San Jose, CA (US);
Craig E. Hampel, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/461,923

(22) Filed: May 2, 2012

(65) Prior Publication Data

US 2012/0213020 A1    Aug. 23, 2012

Related U.S. Application Data

(63) Continuation of application No. 12/111,816, filed on Apr. 29, 2008, which is a continuation of application No. 11/280,560, filed on Nov. 15, 2005, which is a continuation of application No. 11/094,137, filed on Mar. 31, 2005, now Pat. No. 7,209,397, which is a (Continued)

(51) Int. Cl.
*G11C 7/00* (2006.01)
(52) U.S. Cl. ............ 365/194; 365/189.011; 365/189.16; 365/191
(58) Field of Classification Search .................. 365/194, 365/191, 189.011, 189.16
See application file for complete search history.

(56) References Cited

U.S. PATENT DOCUMENTS

| | | | |
|---|---|---|---|
| 3,820,081 A | 6/1974 | Donahue | 360/172.5 |
| 3,950,735 A | 4/1976 | Patel | 340/172.5 |
| 4,183,095 A | 1/1980 | Ward | 365/189 |
| 4,266,282 A | 5/1981 | Henle et al. | 365/52 |
| 4,280,221 A | 7/1981 | Chun et al. | 375/17 |
| 4,315,308 A | 2/1982 | Jackson | 364/200 |
| 4,330,852 A | 5/1982 | Redwine et al. | 365/221 |
| 4,337,523 A | 6/1982 | Hotta et al. | 365/194 |
| 4,445,204 A | 4/1984 | Nishiguchi | 365/194 |
| 4,499,536 A | 2/1985 | Gemma et al. | 364/200 |
| 4,567,545 A | 1/1986 | Mettler | 361/401 |
| 4,637,018 A | 1/1987 | Flora et al. | 371/1 |

(Continued)

FOREIGN PATENT DOCUMENTS

| | | |
|---|---|---|
| DE | 1291778 | 3/2003 |
| EP | 0379772 A2 | 8/1990 |

(Continued)

OTHER PUBLICATIONS

Ware, Frederick, U.S. Appl. No. 12/111,816, filed Apr. 29, 2008, Notice of Allowance and Fees Due dated Mar. 9, 2011. 24 pages.

(Continued)

*Primary Examiner* — Pho M Luu
(74) *Attorney, Agent, or Firm* — Charles Shemwell

(57) ABSTRACT

A memory component having a first and second interface. The first interface is provided to sample address information in response to a first clock signal. The first interface includes inputs to sample at least two bits of the address information in succession during a clock cycle of the first clock signal. The second interface is provided to sample data in response to a second clock signal, having a frequency that is at least twice the frequency of the first clock signal. The second interface includes inputs to sample at least two bits of data in succession during a clock cycle of the second clock signal.

38 Claims, 34 Drawing Sheets

Related U.S. Application Data continuation of application No. 10/732,533, filed on Dec. 11, 2003, now Pat. No. 7,225,311, which is a continuation of application No. 09/841,911, filed on Apr. 24, 2001, now Pat. No. 6,675,272.

(56) References Cited

U.S. PATENT DOCUMENTS

| | | | |
|---|---|---|---|
| 4,646,270 A | 2/1987 | Voss | 365/230 |
| 4,654,790 A | 3/1987 | Woffinden | |
| 4,656,605 A | 4/1987 | Clayton | 365/52 |
| 4,712,190 A | 12/1987 | Guglielmi et al. | 364/900 |
| 4,719,602 A | 1/1988 | Hag et al. | 365/230 |
| 4,755,937 A | 7/1988 | Glier | 364/200 |
| 4,763,249 A | 8/1988 | Bomba et al. | 364/200 |
| 4,792,926 A | 12/1988 | Roberts | 365/189 |
| 4,792,929 A | 12/1988 | Olson et al. | 365/233 |
| 4,799,199 A | 1/1989 | Scales, III et al. | 365/230 |
| 4,800,530 A | 1/1989 | Itoh et al. | 365/189 |
| 4,821,226 A | 4/1989 | Christopher et al. | 364/900 |
| 4,825,411 A | 4/1989 | Hamano | 365/189 |
| 4,845,664 A | 7/1989 | Aichelmann, Jr. et al. | 364/900 |
| 4,845,677 A | 7/1989 | Chappell et al. | 365/189.02 |
| 4,849,937 A | 7/1989 | Yoshimoto | 365/189.05 |
| 4,866,675 A | 9/1989 | Kawashima | 365/194 |
| 4,866,676 A | 9/1989 | Crisp et al. | 365/200 |
| 4,866,677 A | 9/1989 | Sakurai | 365/222 |
| 4,866,678 A | 9/1989 | Pinkham et al. | 365/230.01 |
| 4,866,679 A | 9/1989 | Chambers | 367/47 |
| 4,866,680 A | 9/1989 | Scherbatskoy | 367/83 |
| 4,875,192 A | 10/1989 | Matsumoto | 365/193 |
| 4,882,712 A | 11/1989 | Ohno et al. | 365/206 |
| 4,891,791 A | 1/1990 | Iijima | 365/189.01 |
| 4,916,670 A | 4/1990 | Suzuki et al. | 365/233 |
| 4,920,483 A | 4/1990 | Pogue et al. | 364/200 |
| 4,928,265 A | 5/1990 | Higuchi et al. | 365/189.01 |
| 4,937,734 A | 6/1990 | Bechtolsheim | 364/200 |
| 4,945,516 A | 7/1990 | Kashiyama | 365/189.05 |
| 4,953,128 A | 8/1990 | Kawai et al. | 365/194 |
| 5,001,672 A | 3/1991 | Ebbers et al. | 365/230.05 |
| 5,077,693 A | 12/1991 | Hardee et al. | 365/230.08 |
| 5,083,296 A | 1/1992 | Hara et al. | 365/230.02 |
| 5,097,489 A | 3/1992 | Tucci | 375/120 |
| 5,111,386 A | 5/1992 | Fujishima et al. | 395/425 |
| 5,117,389 A | 5/1992 | Yiu | 365/104 |
| 5,124,589 A | 6/1992 | Shiomi et al. | 307/465 |
| 5,140,688 A | 8/1992 | White et al. | 395/550 |
| 5,164,916 A | 11/1992 | Wu et al. | 365/52 |
| 5,179,687 A | 1/1993 | Hidaka et al. | 395/425 |
| 5,239,639 A * | 8/1993 | Fischer et al. | 713/600 |
| 5,260,905 A | 11/1993 | Mori | 365/230.05 |
| 5,276,858 A | 1/1994 | Oak et al. | 395/550 |
| 5,301,278 A | 4/1994 | Bowater et al. | 395/275 |
| 5,305,278 A | 4/1994 | Inoue | 365/230.03 |
| 5,311,483 A | 5/1994 | Takasugi | 365/233 |
| 5,319,755 A | 6/1994 | Horowitz | 395/325 |
| 5,323,358 A | 6/1994 | Toda et al. | 365/230.09 |
| 5,327,390 A | 7/1994 | Takasugi | 365/230 |
| 5,329,484 A | 7/1994 | Tsuiki | 365/45 |
| 5,339,276 A | 8/1994 | Takasugi | 365/230.02 |
| 5,341,341 A | 8/1994 | Fukuzo | 365/233 |
| 5,343,427 A * | 8/1994 | Teruyama | 365/189.04 |
| 5,345,573 A | 9/1994 | Bowden, III et al. | 395/400 |
| 5,357,621 A | 10/1994 | Cox | 395/400 |
| 5,365,489 A | 11/1994 | Jeong | 365/230.03 |
| 5,379,438 A | 1/1995 | Bell et al. | 395/800 |
| 5,381,376 A | 1/1995 | Kim et al. | 365/230.03 |
| 5,381,538 A | 1/1995 | Amini et al. | 395/425 |
| 5,384,745 A | 1/1995 | Konishi et al. | 365/230.03 |
| 5,386,375 A | 1/1995 | Smith | 364/748 |
| 5,386,385 A | 1/1995 | Stephens, Jr. | 365/189.05 |
| 5,390,149 A | 2/1995 | Vogley et al. | 365/189.01 |
| 5,392,239 A | 2/1995 | Margulis et al. | 365/189.01 |
| 5,404,338 A | 4/1995 | Murai et al. | 365/233 |
| 5,404,463 A | 4/1995 | McGarvey | 395/325 |
| 5,422,858 A | 6/1995 | Mizukami et al. | 365/233 |
| 5,428,389 A | 6/1995 | Ito | 348/231 |
| 5,430,676 A | 7/1995 | Ware | 365/189.02 |
| 5,444,667 A | 8/1995 | Obara et al. | 365/233 |
| 5,455,803 A | 10/1995 | Kodama | 365/233 |
| 5,475,690 A | 12/1995 | Burns et al. | 370/105.3 |
| 5,504,874 A | 4/1996 | Galles et al. | 395/472 |
| 5,511,024 A | 4/1996 | Ware | 365/189.04 |
| 5,511,025 A | 4/1996 | Smith et al. | 365/189.05 |
| 5,530,623 A | 6/1996 | Sanwo et al. | 361/788 |
| 5,533,204 A | 7/1996 | Tipley | 395/288 |
| 5,548,786 A | 8/1996 | Amini et al. | 395/842 |
| 5,553,248 A | 9/1996 | Melo et al. | 395/296 |
| 5,560,000 A | 9/1996 | Vogley | 395/550 |
| 5,568,445 A | 10/1996 | Park et al. | 365/233 |
| 5,577,236 A | 11/1996 | Johnson et al. | 395/551 |
| 5,578,940 A | 11/1996 | Dillon | 326/30 |
| 5,579,352 A | 11/1996 | Llewellyn | 375/376 |
| 5,606,717 A | 2/1997 | Farmwald | 395/856 |
| 5,611,058 A | 3/1997 | Moore et al. | 395/309 |
| 5,615,358 A | 3/1997 | Vogley | 395/556 |
| 5,638,531 A | 6/1997 | Crump et al. | 395/450 |
| 5,646,904 A | 7/1997 | Ohno et al. | 365/233 |
| 5,649,161 A | 7/1997 | Andrade et al. | 395/494 |
| 5,655,113 A | 8/1997 | Leung et al. | 395/552 |
| 5,663,661 A | 9/1997 | Dillon | 326/30 |
| 5,680,361 A | 10/1997 | Ware | 365/230.01 |
| 5,708,297 A | 1/1998 | Clayton | 257/723 |
| 5,742,798 A | 4/1998 | Goldrian | 395/551 |
| 5,748,914 A | 5/1998 | Ware | 395/285 |
| 5,764,963 A | 6/1998 | Ware | 395/507 |
| 5,778,419 A | 7/1998 | Hansen et al. | 711/112 |
| 5,796,624 A | 8/1998 | Sridhar et al. | 364/489 |
| 5,819,076 A | 10/1998 | Jeddeloh et al. | 395/552 |
| 5,844,855 A | 12/1998 | Ware | 365/230.01 |
| 5,857,095 A | 1/1999 | Jeddeloh | 395/552 |
| 5,867,541 A | 2/1999 | Tanaka et al. | 375/354 |
| 5,880,998 A | 3/1999 | Tanimura et al. | 365/189.05 |
| 5,892,981 A | 4/1999 | Wiggers | 395/878 |
| 5,928,343 A | 7/1999 | Farmwald | 710/104 |
| 5,933,379 A | 8/1999 | Park et al. | 365/201 |
| 5,933,387 A | 8/1999 | Worley | 365/230.03 |
| 5,943,573 A | 8/1999 | Wen | 438/275 |
| 5,952,691 A | 9/1999 | Yamaguchi | 257/316 |
| 5,966,343 A | 10/1999 | Thurston | 365/233 |
| 5,987,576 A | 11/1999 | Johnson et al. | 711/167 |
| 6,003,118 A | 12/1999 | Chen | 711/167 |
| 6,005,776 A | 12/1999 | Holman et al. | 361/760 |
| 6,016,282 A | 1/2000 | Keeth | 365/233 |
| 6,029,250 A | 2/2000 | Keeth | 713/400 |
| 6,034,878 A | 3/2000 | Osaka et al. | 365/52 |
| 6,041,419 A | 3/2000 | Huang et al. | 713/401 |
| 6,044,429 A | 3/2000 | Ryan et al. | 710/131 |
| 6,049,238 A | 4/2000 | Shimizu et al. | 327/156 |
| 6,049,467 A | 4/2000 | Tamarkin et al. | 361/790 |
| 6,057,743 A | 5/2000 | Aekins | 333/1 |
| 6,065,092 A | 5/2000 | Roy | 711/5 |
| 6,067,594 A | 5/2000 | Perino | 710/126 |
| 6,070,217 A | 5/2000 | Connolly | 710/131 |
| 6,075,393 A | 6/2000 | Tomita et al. | 327/153 |
| 6,075,728 A | 6/2000 | Inoue | 698/189.01 |
| 6,075,730 A | 6/2000 | Anderson | 365/191 |
| 6,088,774 A | 7/2000 | Gillingham | 711/167 |
| 6,105,144 A | 8/2000 | Wu | 713/401 |
| 6,111,757 A | 8/2000 | Dell et al. | 361/737 |
| 6,115,318 A | 9/2000 | Keeth | 365/233 |
| 6,124,727 A | 9/2000 | Bridgewater, Jr. et al. | 326/33 |
| 6,125,419 A | 9/2000 | Umemura et al. | 710/129 |
| 6,131,149 A | 10/2000 | Lu et al. | 711/167 |
| 6,137,734 A | 10/2000 | Schoner et al. | 365/194 |
| 6,151,271 A | 11/2000 | Lee | 365/233 |
| 6,154,417 A | 11/2000 | Kim | 365/233 |
| 6,154,821 A | 11/2000 | Barth | 711/170 |
| 6,160,754 A | 12/2000 | Suh | 365/233 |
| 6,172,895 B1 | 1/2001 | Brown et al. | 365/6.3 |
| 6,178,517 B1 | 1/2001 | Bertin et al. | 713/324 |
| 6,185,644 B1 | 2/2001 | Farmwald | 710/102 |
| 6,191,997 B1 | 2/2001 | Son et al. | 365/230.04 |
| 6,211,703 B1 | 4/2001 | Takekuma et al. | 326/101 |
| 6,219,384 B1 | 4/2001 | Kliza et al. | 375/258 |

| | | | |
|---|---|---|---|
| 6,226,723 B1 | 5/2001 | Gustavson et al. | 711/170 |
| 6,226,757 B1 | 5/2001 | Ware | 713/503 |
| 6,232,792 B1 | 5/2001 | Starr | 326/30 |
| 6,233,157 B1 | 5/2001 | Yoon | 361/760 |
| 6,240,039 B1 | 5/2001 | Lee et al. | 365/230.06 |
| 6,253,266 B1 | 6/2001 | Ohanian | 710/102 |
| 6,260,097 B1 | 7/2001 | Horowitz | 710/129 |
| 6,266,285 B1 | 7/2001 | Farmwald | 365/194 |
| 6,266,730 B1 | 7/2001 | Perino | 710/126 |
| 6,266,737 B1 | 7/2001 | Ware | 711/105 |
| 6,278,300 B1 | 8/2001 | Urakawa | 327/112 |
| 6,292,877 B1 | 9/2001 | Ryan | 711/169 |
| 6,292,903 B1 | 9/2001 | Coteus et al. | 713/401 |
| 6,304,937 B1 | 10/2001 | Farmwald | 710/129 |
| 6,310,171 B1 * | 10/2001 | Naito et al. | 528/49 |
| 6,314,051 B1 | 11/2001 | Farmwald | 365/233 |
| 6,321,282 B1 | 11/2001 | Horowitz | 710/104 |
| 6,336,205 B1 | 1/2002 | Kurokawa et al. | 716/2 |
| 6,343,352 B1 | 1/2002 | Davis | 711/158 |
| 6,356,260 B1 | 3/2002 | Montalbo | 345/204 |
| 6,359,815 B1 | 3/2002 | Sato et al. | 365/198 |
| 6,388,886 B1 | 5/2002 | Tobita | 361/760 |
| 6,388,934 B1 | 5/2002 | Tobita | 365/222 |
| 6,400,625 B2 * | 6/2002 | Arimoto et al. | 365/201 |
| 6,401,167 B1 | 6/2002 | Barth | 711/106 |
| 6,404,258 B2 | 6/2002 | Ooishi | 327/278 |
| 6,442,644 B1 | 8/2002 | Gustavson et al. | 711/105 |
| 6,445,624 B1 | 9/2002 | Janzen et al. | 365/191 |
| 6,449,159 B1 | 9/2002 | Haba | 361/707 |
| 6,449,727 B1 | 9/2002 | Toda | 713/401 |
| 6,456,544 B1 | 9/2002 | Zumkehr | 365/193 |
| 6,470,405 B2 | 10/2002 | Hampel | 710/100 |
| 6,477,592 B1 | 11/2002 | Chen et al. | 710/52 |
| 6,493,789 B2 | 12/2002 | Ware | 711/105 |
| 6,496,897 B2 | 12/2002 | Ware | 711/105 |
| 6,502,161 B1 | 12/2002 | Perego | 711/5 |
| 6,504,790 B1 | 1/2003 | Wolford | 365/233 |
| 6,510,503 B2 | 1/2003 | Gillingham et al. | 711/167 |
| 6,516,365 B2 | 2/2003 | Horowitz | 710/104 |
| 6,526,469 B1 | 2/2003 | Drehmel et al. | 710/306 |
| 6,539,454 B2 | 3/2003 | Mes | 711/105 |
| 6,545,875 B1 | 4/2003 | Perino | 361/760 |
| 6,553,472 B2 | 4/2003 | Yang et al. | 711/167 |
| 6,584,037 B2 | 6/2003 | Farmwald | 365/233 |
| 6,590,781 B2 | 7/2003 | Kollipara | 361/760 |
| 6,591,353 B1 | 7/2003 | Ware | 711/167 |
| 6,611,905 B1 | 8/2003 | Grundon et al. | 711/167 |
| 6,618,736 B1 | 9/2003 | Menage | 707/204 |
| 6,629,222 B1 | 9/2003 | Jeddeloh | 711/167 |
| 6,640,292 B1 | 10/2003 | Barth | 711/168 |
| 6,643,752 B1 | 11/2003 | Donnelly | 711/167 |
| 6,643,787 B1 | 11/2003 | Zerbe | 713/400 |
| 6,646,953 B1 | 11/2003 | Stark | 365/233 |
| 6,654,897 B1 | 11/2003 | Dreps et al. | 713/401 |
| 6,657,871 B2 | 12/2003 | Perino | 361/760 |
| 6,675,272 B2 * | 1/2004 | Ware et al. | 711/167 |
| 6,680,866 B2 | 1/2004 | Kajimoto | 365/189.01 |
| 6,681,288 B2 | 1/2004 | Ware | 711/105 |
| 6,684,263 B2 | 1/2004 | Horowitz | 710/8 |
| 6,697,918 B2 | 2/2004 | Rowlands | 711/133 |
| 6,724,666 B2 | 4/2004 | Janzen et al. | 365/191 |
| 6,748,465 B2 | 6/2004 | Howard et al. | 710/36 |
| 6,760,857 B1 | 7/2004 | Lau | 713/500 |
| 6,765,800 B2 | 7/2004 | Haba | 361/760 |
| 6,788,594 B2 | 9/2004 | Ware | 365/194 |
| 6,804,764 B2 | 10/2004 | LaBerge et al. | 711/170 |
| 6,807,614 B2 | 10/2004 | Chung | 711/167 |
| 6,833,984 B1 | 12/2004 | Haba | 361/58 |
| 6,839,266 B1 | 1/2005 | Ware | 365/69 |
| 6,853,557 B1 | 2/2005 | Haba | 361/760 |
| 6,868,474 B2 | 3/2005 | Barth | 711/104 |
| 6,873,939 B1 | 3/2005 | Zerbe | 702/189 |
| 6,898,085 B2 | 5/2005 | Haba | 361/760 |
| 6,912,680 B1 | 6/2005 | Keeth | 714/736 |
| 6,928,571 B1 | 8/2005 | Bonella et al. | 713/401 |
| 6,950,956 B2 | 9/2005 | Zerbe | 713/400 |
| 6,970,988 B1 | 11/2005 | Chung | 711/168 |
| 7,057,948 B2 | 6/2006 | Shimizu et al. | 365/200 |
| 7,076,745 B2 | 7/2006 | Togo | 716/1 |
| 7,095,661 B2 | 8/2006 | Osaka et al. | 365/194 |
| 7,100,066 B2 | 8/2006 | Jeong | 713/500 |
| 7,177,998 B2 | 2/2007 | Ware | 711/167 |
| 7,197,611 B2 | 3/2007 | Barth | 711/154 |
| 7,200,055 B2 | 4/2007 | Ware | 365/194 |
| 7,209,397 B2 * | 4/2007 | Ware et al. | 365/194 |
| 7,210,016 B2 | 4/2007 | Ware | 711/167 |
| 7,224,595 B2 | 5/2007 | Dreps et al. | 365/63 |
| 7,225,292 B2 | 5/2007 | Ware | 711/105 |
| 7,225,311 B2 * | 5/2007 | Ware et al. | 711/167 |
| 7,251,162 B2 | 7/2007 | Kawajiri et al. | 365/185.18 |
| 7,287,109 B2 | 10/2007 | Barth | 710/100 |
| 7,287,119 B2 | 10/2007 | Barth | 711/105 |
| 7,480,193 B2 | 1/2009 | Ware | 365/194 |
| 7,484,064 B2 | 1/2009 | Ware | 711/167 |
| 7,519,877 B2 | 4/2009 | Janzen | 714/718 |
| 7,542,322 B2 | 6/2009 | McCall et al. | 365/52 |
| 7,548,601 B2 | 6/2009 | Sidiropoulos | 375/371 |
| 7,610,524 B2 | 10/2009 | Janzen | 714/718 |
| 7,724,590 B2 | 5/2010 | Ware | 365/194 |
| 7,733,685 B2 | 6/2010 | Scheuerlein et al. | 365/148 |
| 7,774,535 B2 * | 8/2010 | Nakamura | 711/5 |
| 2001/0026487 A1 | 10/2001 | Koga | 365/202 |
| 2001/0047450 A1 | 11/2001 | Gillingham et al. | 711/105 |
| 2002/0174311 A1 | 11/2002 | Ware | 711/167 |
| 2003/0076702 A1 | 4/2003 | Kyung et al. | 365/51 |
| 2004/0003194 A1 | 1/2004 | Bodas et al. | 711/167 |
| 2004/0054845 A1 | 3/2004 | Ware | 711/100 |
| 2004/0120197 A1 | 6/2004 | Kondo et al. | 365/202 |
| 2004/0170072 A1 | 9/2004 | Ware | 365/200 |
| 2005/0169097 A1 | 8/2005 | Ware | 365/233 |
| 2006/0007761 A1 | 1/2006 | Ware | 365/194 |
| 2006/0039174 A1 | 2/2006 | Ware | 365/63 |
| 2006/0056244 A1 | 3/2006 | Ware | 365/194 |
| 2006/0069895 A1 | 3/2006 | Ware | 711/167 |
| 2006/0077731 A1 | 4/2006 | Ware | 365/194 |
| 2006/0129776 A1 | 6/2006 | Ware | 711/167 |
| 2007/0247935 A1 | 10/2007 | Ware | 365/194 |
| 2007/0255919 A1 | 11/2007 | Tsern | 711/167 |
| 2009/0063887 A1 | 3/2009 | Ware | 713/401 |
| 2009/0138646 A1 | 5/2009 | Ware et al. | 710/308 |

FOREIGN PATENT DOCUMENTS

| | | |
|---|---|---|
| EP | 0709786 A1 | 5/1996 |
| EP | 0735492 | 10/1996 |
| EP | 0831402 | 3/1998 |
| EP | 0849685 | 6/1998 |
| EP | 0855653 | 7/1998 |
| EP | 0884732 A2 | 12/1998 |
| EP | 1653374 | 7/2006 |
| EP | 1291778 | 6/2007 |
| EP | 1653374 | 1/2010 |
| JP | 07-074606 | 3/1995 |
| JP | 08-191661 | 7/1996 |
| JP | 08-202653 | 8/1996 |
| JP | 2008-227394 A | 9/1996 |
| JP | 09-161472 | 6/1997 |
| JP | 10-022458 | 1/1998 |
| JP | 10-124210 | 5/1998 |
| JP | 10-340222 | 12/1998 |
| JP | 11-07335 | 1/1999 |
| JP | 11-016352 | 1/1999 |
| JP | 11-085345 | 3/1999 |
| JP | 11-167515 | 6/1999 |
| JP | 11-284126 A | 10/1999 |
| JP | 11-328004 | 11/1999 |
| JP | 2000-035831 A2 | 2/2000 |
| JP | 2000-174505 | 6/2000 |
| JP | 2000-243893 | 9/2000 |
| JP | 2000-284873 | 10/2000 |
| JP | 2000-348490 A | 12/2000 |
| JP | 2001-027918 | 1/2001 |
| JP | 2001-044325 | 2/2001 |
| WO | WO 91-16680 | 10/1991 |
| WO | WO 98/15897 | 4/1998 |
| WO | WO99/41667 A1 | 8/1999 |
| WO | WO 99/46687 | 9/1999 |

| | | |
|---|---|---|
| WO | WO 99/48260 | 9/1999 |
| WO | WO99/50852 A1 | 10/1999 |
| WO | WO 00/54164 A1 | 9/2000 |

OTHER PUBLICATIONS

Ware, Frederick, U.S. Appl. No. 11/754,995, filed May 29, 2007, re Notice of Allowance and Fee(s) due dated Jun. 24, 2011. 19 pages.
EP Preparation of the Oral Proceedings dated Oct. 31, 2011 before the Opposition Division on Jan. 18, 2012 re EP Patent No. 1653374. 2 pages.
Ware, Frederick, U.S. Appl. No. 11/754,995, filed May 29, 2007, Supplemental Notice of Allowability mailed Apr. 19, 2012. 5 pages.
Ware, Frederick, U.S. Appl. No. 11/754,995, filed May 29, 2007, Comments on Statement of Reasons for Allowance dated May 17, 2012. 1 page.
JP Office Action mailed Jun. 15, 2012 for JP Application No. 2009-162534, including English-language translation. 5 pages.
Grounds of Appeal dated Jun. 27, 2012 in EP Application No. 05022021.9, Includes Auxiliary Requests I-VII (Clear and Highlighted copies) as well as a Feature Analysis of Claim 1 (main request). 84 pages.
Ware et al., U.S. Appl. No. 11/767,983, filed Jun. 25, 2007, re Notice of Allowance and Fee(s) Due dated Jul. 10, 2012. 25 pages.
Poulton, John, "Signaling in High Performance Memory Systems", IEEE Solid State Circuits Conference, slides 1-59 (Feb. 1999). 30 pages.
IBM, Micron Technology and Reliance Computer Corporation, "DDR SDRAM Registered DIMM," Design Specification, Revision 0.6, Nov. 1999. 62 pages.
Nakase, Yasunobu et al., "Source-Synchronization and Timing Vernier Techniques for 1.2 GB/s SLDRAM Interface," IEEE Journal of Solid-State Circuits, vol. 34, No. 4, Apr. 1999, pp. 494-501. 8 pages.
Wong et al., "Inserting Active Delay Elements to Achieve Wave Pipelining," IEEE 1989, p. 270-273. 4 pages.
Paris et al., "WP 24.3: A 800 MB/s 72 Mb SLDRAM with Digitally-Calibrated DLL," ISSCC, 0-7803-5129-0/99, Slide Supplement, IEEE, 1999. 10 pages.
"Draft Standard for a High-Speed Memory Interface (SyncLink)," Draft 0.99 IEEE P1596.7-199X, pp. 1-56 (1996), Microprocessor and Microcomputer Standards Subcommittee of the IEEE Computer Society. 66 pages.
Gillingham et al., "SLDRAM: High Performance Open-Standard Memory," IEEE Micro, Nov./Dec. 1997, p. 29-39, vol. 17, No. 6, Institute of Electrical and Electronics Engineers, Inc., Los Alamitos, California. 11 pages.
SLDRAM Inc., "SLD4M18DR400 4 MEG×18 SLDRAM: 400 Mb/s/pin SLDRAM 4 M×18 SLDRAM Pipelined, Eight Bank, 2.5 V Operation," Jul. 9, 1998, pp. 1-69, SLDRAM, Inc. San Jose, California. 69 pages.
Gillingham, Peter, "SLDRAM Architectural and Functional Overview," SLDRAM Consortium, Aug. 29, 1997, pp. 1-14. 14 pages.
Yoo, Changsik, "DRAM Design 3," Samsung Electronics, High Speed DRAM Interface, Dec. 2001. 35 pages.
Rambus Inc., "8/9-Mbit (1M×8/9) & 16/18Mbit (2M×8/9) RDRAM—Preliminary Information," Rambus Inc. Data Sheet, Mar. 1, 1996. 30 pages.
JEDEC, "Double Data Rate (DDR) SDRAM Specification," JEDEC Standard JESD79, Jun. 2000, JEDEC Solid State Technology Association. 76 pages.
IEEE Standard for Scalable Coherent Interface (SCI), "Microprocessor and Microcomputer Standards Subcommittee of the IEEE Computer Society," IEEE Std 1596-1992, Aug. 2, 1993. 270 pages.
Seibert, Mike, "Competitive DDR Memory Sub-Systems," Micron Technology, Inc., DRAM Memory Enabling, Platform Conference, Jul. 18-19, 2000. 67 pages.
Rambus Inc., "Direct Rambus Short Channel Layout Guide," Version 0.8, Mar. 2000. 34 pages.
Samsung Electronics Inc., "KMM377S1620CT2 SDRAM Module Datasheet," Rev. 1 (Nov. 1998), Preliminary, pp. 1-12. 12 pages.
Rambus Inc., "Rambus RIMM Module (with 64/72Mb RDRAMs)" Data Sheet, Preliminary Information, Document DL0078, Version 0.90, Mar. 1999, pp. 1-11. 11 pages.

Rambus Inc., "Rambus SO-RIMM Module (with 128/144Mb RDRAMs)," Advance Information, Document DL0076, Version 0.7, Feb. 2000, p. 1-12. 12 pages.
Rambus Inc., "Direct RAC Data Sheet," Advanced Information, Last Modified Aug. 7, 1998, pp. 1-46. 46 pages.
Gabara et al., "Digitally Adjustable Resistors in CMOS for High-Performance Applications," IEEE Journal of Solid-State Circuits, vol. 27, No. 8, Aug. 1992. 10 pages.
Kim, Y.R., "Memory Product Planning and Application," Samsung Electronics, DDR, Today and Tomorrow, Platform Conference, Jul. 18-19, 2000. 26 pages.
Wang et al., "A 500-Mb/s quadruple data rate SDRAM interface using a skew cancellation technique," Apr. 2001, IEEE Journal of Solid-State Circuits, pp. 648-657, vol. 36, No. 4. 10 pages.
Prince, Betty, "Semiconductor Memories," Second Edition, John Wiley & Sons, 1991. 12 pages.
The Institute of Electrical and Electronics Engineers, "Standard for High-Bandwidth Memory Interface Based on Scalable Coherent Interface Signaling Technology (RamLink)," Mar. 19, 1996, IEEE STD 1596.4-1996, XP002315223, pp. 12, 43-45. 5 pages.
IBM, "184 Pin DIMM Design Updates/Ramifications for Unbuffered and Registered DDR DIMMs," JC-42.5, Dec. 1999, pp. 1-12. 13 pages.
Exhibit 26: Yang et al., "A Scalable 32Gb/s Parallel Data Transceiver with On-Chip Timing Calibration Circuits," IEEE International Solid State Circuits Conference, pp. 258-259, 2000. 2 pages.
IBM Corp., "Application Note: Direct Rambus Memory System Overview," Mar. 30, 1998, pp. 1-5. 6 pages.
Rambus, Inc., "Rambus RIMM Connector," Document DL 0069, Version 1.01, Jul. 1999. 14 pages.
International Search Report and Written Opinion in International Application No. PCT/US2005/032346, Apr. 18, 2006. 11 pages.
European Search Report and Written Opinion in European Patent Application 02009032.0-2212, dated Jul. 4, 2005. 9 pages.
European Search Report and Written Opinion in EP Application No. 05022021.9, dated Jun. 1, 2006. 6 pages.
Crisp, Richard, "Direct Rambus Technology: The New Main Memory Standard," IEEE Micro, Nov./Dec. 1997, pp. 18-28. 11 pages.
Exhibit D, Tab 1—Hyundai, "HY5DV651622," Rev.0.9, published Jan. 2000 ("Hynix-1"), re Request for Inter Partes Reexamination of U.S. Patent No. 6,426,916. 10 pages.
Rambus, Inc., "Direct RDRAM 256/288-Mbit (1M×16/18×16d)," Preliminary Information, Document DL0105, Version 1.1, Aug. 2000. 72 pages.
International Preliminary Report on Patentability and Written Opinion in International Application No. PCT/US2005/032346, dated Mar. 29, 2007. 10 pages.
International Preliminary Report and Written Opinion in International Application No. PCT/US/2005/032770, dated Apr. 12, 2007. 6 pages.
International Search Report and Written Opinion in International Application No. PCT/US2005/042722, dated May 10, 2006. 15 pages.
Allowed Claims, U.S. Appl. No. 10/385,908, filed on Mar. 11, 2003, re Notice of Allowance dated Aug. 14, 2007. 3 pages.
Yeung et al., "A 2.4 Gb/s/pin Simultaneous Bidirectional Parallel Link with Per-Pin Skew Compensation," IEEE Journal of Solid-State Circuits, vol. 35, No. 11, pp. 1619-1627, Nov. 2000. 10 pages.
Notice of Opposition with mail date of Apr. 8, 2008, re European Patent No. 1291778 with EP Application No. 02009032.0. 24 pages.
International Search Report and Written Opinion in International Application No. PCT/US/2005/032770, dated Jan. 26, 2006. 12 pages.
Complaint Under Section 337 of the Tariff Act of 1930, as Amended, In the Matter of "Certain Semiconductor Chips Having Synchronous Dynamic Random Access Memory Controller and Products Containing Same, Including Graphics Cards and Motherboards," in United States International Trade Commission, Washington, D.C. 20436, Investigation No. 337-TA-661, Nov. 6, 2008, Appendices and Exhibits omitted except as otherwise cited herein. 215 pages.

Exhibit 4—Infringement Claim Charts for U.S. Patent No. 7,177,998 in United States International Trade Commission, Washington, D.C., Investigation No. 337-TA, Nov. 6, 2008. 9 pages.
Exhibit 5—Infringement Claim Charts for U.S. Patent No. 7,210,016 in United States International Trade Commission, Washington, D.C., Investigation No. 337-TA, Nov. 6, 2008. 10 pages.
First Amended Complaint for Patent Infringement and Jury Demand, dated Jul. 10, 2008, *Rambus Inc.* v. *NVIDIA Corporation*, Untied States District Court Northern District of California, San Jose Division, case No. C0803343JCS. 18 pages.
NVIDIA's First Supplement to Its Objections and Responses to Rambus's First Set of Interrogatories (Nos. 1-37), re "Certain Semiconductor Chips Having Synchronous Dynamic Random Access Memory Controllers and Products Containing Same," Investigation No. 337-TA-661, Jan. 29, 2009. 34 pages.
Kim et al., "A 500MB/s/Pin Quadruple Data Rate SDRAM Interface using a Skew Cancellation Technique," Feb. 9, 2000, 2000 IEEE International Solid-State Circuits Conference, Digest of Technical Papers. 3 pages.
Respondents' Responsive Claim Construction Brief, United States International Trade Commission, Investigation No. 337-TA-661, "In the Matter of: Certain Semiconductor Chips Having Synchronous Dynamic Random Access Memory Controllers and Products Containing Same," dated Mar. 12, 2009. 84 pages.
Rambus Inc.'s Responsive Brief on Disputed Claim Terms, United States International Trade Commission, Investigation No. 337-TA-661, "In the Matter of: Certain Semiconductor Chips Having Synchronous Dynamic Random Access Memory Controllers and Products Containing Same," dated Mar. 16, 2009. 223 pages.
Exhibit P—File History of U.S. Patent No. 6,931,467 ("the '467 parent patent"), Apr. 3, 2009, In re Request for Inter Partes Reexamination of U.S. Patent No. 7,287,109. 709 pages.
Exhibit S—Rambus Inc.'s Opening Brief on Disputed Claim Terms dated Mar. 2, 2009, In the Matter of "Certain Semiconductor Chips Having Synchronous Dynamic Random Access Memory Controllers and Products Containing Same," United States International Trade Commission, Investigation No. 337-661, In re Request for Inter Partes Reexamination of U.S. Patent No. 7,287,109. 65 pages.
Ware, Frederick, "Ware Patents," 33 page Slide Presentation, re U.S. Patent Nos. 7,177,998 and 7,210,016, Mar. 2009. 33 pages.
NVIDIA Slide Presentation, "Respondents' Claim Construction Presentation for Ware Patents," ITC Investigation No. 337-TA-661, Mar. 2009. 31 pages.
Slide Presentation, "Rambus's Technical Tutorial: Investigation No. 337-TA-661," Mar. 24, 2009. 49 pages.
NVIDIA's slide presentation, "Markman Tutorial: International Trade Commission Investigation," No. 337-TA-661, 1993. 67 pages.
Commission Investigative Staff's Responsive Brief Regarding Disputed Claim Terms, Investigation No. 337-TA-661, dated Mar. 20, 2009. 204 pages.
Respondents' Opening Claim Construction Brief, United States International Trade Commission, Investigation No. 337-TA-661, "In the Matter of Certain Semiconductor Chips Having Synchronous Dynamic Random Access Memory Controllers and Products Containing Same," Mar. 2, 2009. 100 pages.
Non-Final Office Action with mail date May 8, 2009 in Ex-Parte Reexamination of U.S. Patent No. 7,177,998. 13 pages.
Non-Final Office Action with mail date May 8, 2009 for Ex-Parte Reexamination of U.S. Patent No. 7,210,016. 13 pages.
Request for Ex Parte Reexamination filed by NVIDIA for U.S. Patent No. 7,210,016 on Dec. 8, 2008. 38 pages.
Request for Inter Partes Reexamination of U.S. Patent No. 7,210,016 dated Mar. 24, 2009. 60 pages.
Request for Ex Parte Reexamination filed by NVIDIA for U.S. Patent No. 7,177,998 on Dec. 8, 2008. 37 pages.
Request for Inter Partes Reexamination for U.S. Patent No. 7,177,998 filed on Mar. 24, 2009. 76 pages.
PAT-B—File wrapper for the 7,210,016 patent re Ex Parte Reexamination with filing date Nov. 15, 2005. 451 pages.
Exhibit CC-A—US Patent No. 6,292,903 Claim Charts dated Mar. 2009. 17 pages.
Pat-C—Certificate of Correction dated Jun. 12, 2007 for U.S. Patent No. 7,210,016 in Ex Parte Reexamination. 2 pages.

Complaint filed by Patent Owner in "Certain Semiconductor Chips Having Synchronous Dynamic Random Access Memory Controllers and Products Containing Same," Investigation No. 337-TA-661 (U.S. ITC) filed Nov. 6, 2008. 220 pages.
Exhibit OTH-B—the complaint filed by Patent Owner in *Rambus, Inc.* v. *Nvidia Corporation*, 3:08-cv-03343-Sl (N.D. Cal.) filed Jul. 10, 2008. 18 pages.
Exhibit OTH-C—Listing of Litigation related to the '016 Patent dated Dec. 4, 2008. 7 pages.
Infringement Claim Charts for U.S. Patent No. 7,210,016 filed by Patent Owner in ITC complaint, Inv. No. 337-TA-661 (U.S. ITC) filed Nov. 6, 2008. 11 pages.
Office Action dated Jan. 16, 2009, Order Granting/Denying Request for Ex Parte Reexamination in U.S. Patent No. 7,210,016. 12 pages.
Notification of Prior or Concurrent Proceedings dated Apr. 23, 2009 in Ex Parte Reexamination for U.S. Patent No. 7,210,016. 5 pages.
U.S. Office Communication with mail date of May 8, 2009, re Ex Parte Reexamination for U.S. Patent No. 7,210,016 with Control No. 90/009,357 filed on Dec. 8, 2008. 13 pages.
Exhibit J—Claim Chart for claims 1-5 and 7-24 of the '016 patent based on Coteus with additional reference to Jeddeloh and Takekuma, dated Mar. 24, 2009, in Inter Partes Reexamination of U.S. Patent No. 7,210,016. 20 pages.
Exhibit K—Claim Charts for 7-23 of the '016 patent based on Sato with additional reference to Jeddeloh and Takekuma, dated Mar. 24, 2009, in Inter Partes Reexamination of U.S. Patent No. 7,210,016. 15 pages.
Exhibit L—Claim Charts for 1-4 and 6-24 of the '016 patent based on Sato and Vogley, with additional reference to Jeddeloh, Takekuma, Dillon, and Hyundai, dated Mar. 24, 2009, in Inter Partes Reexamination of U.S. Patent No. 7,210,016. 20 pages.
Exhibit M—File History of the '016 patent, dated Mar. 24, 2009, in Inter Partes Reexamination of U.S. Patent No. 7,210,016. 452 pages.
Exhibit N—the complaint filed by Patent Owner in "Certain Semiconductor Chips Having Synchronous Dynamic Random Access Memory Controllers and Products containing Same, Including Graphics Cards and Motherboards," dated Nov. 6, 2008, in Request for Inter Partes Reexamination of U.S. Patent No. 7,210,016. 216 pages.
Exhibit O—the first amended complaint filed by Patent Owner in *Rambus, Inc.* v. *NVIDIA Corporation*, 3:08-cv-03343-Sl (N. D. Cal.), dated Jul. 10, 2008, in Request for Inter Parte Reexamination of U.S. Patent No. 7,210,016. 18 pages.
Exhibit P—Rambus Inc.'s Opening brief on Disputed Claim Terms, In the Matter of "Certain Semiconductor Chips Having Synchronous Dynamic Random Access Memory Controllers and Products Containing Same," United States International Trade commission, Investigation No. 337-661, dated Mar. 2, 2009, in Request for Inter Partes Reexamination of U.S. Patent No. 7,210,016. 65 pages.
Exhibit OTH-C—Listing of Litigation dated Dec. 8, 2008 related to the U.S. 7,177,998 patent. 7 pages.
Exhibit OTH-D—Infringement Claim Charts for U.S. Patent No. 7,177,998 filed by Patent Owner in ITC complaint, dated Nov. 6, 2008. 10 pages.
Exhibit PAT-B—File Wrapper for U.S. 7,177,998 patent dated Jan. 18, 2006. 437 pages.
Office Action dated Jan. 16, 2009, Order Granted for Ex Parte Reexamination of U.S. Patent No. 7,177,998. 14 pages.
Notification of Prior or Concurrent Proceedings in Ex Parte Reexamination of U.S. Patent No. 7,177,998, with mail date of Apr. 23, 2009. 5 pages.
U.S. Office Communication with mail date of May 8, 2009 in Ex Parte Reexamination of U.S. Patent No. 7,177,998, re U.S. Appl. No. 90/009,358 filed Dec. 8, 2008. 13 pages.
Exhibit K—Claim Charts for claims 7-23 of the '998 patent based on Sato with additional reference to Jeddeloh and Takekuma, dated Mar. 24, 2009, in Request for Inter Partes Reexamination of U.S. Patent No. 7,177,998. 15 pages.
Exhibit L—Claim Charts for claims 1-5 and 7-24 of the '998 patent based on Coteus with additional reference to Jeddeloh and Takekuma, dated Mar. 2009, in Request for Inter Partes Reexamination of U.S. Patent No. 177,998. 21 pages.

Exhibit M—Claim Chart for claims 1-4 and 6-24 of the '998 patent based on Sato and Vogley, with additional reference to Jeddeloh, Takekuma, Dillon and Hyundai, dated Mar. 24, 2009, in Request for Inter Partes Reexamination of U.S. Patent No. 7,177,998. 23 pages.
Exhibit N—Claim Chart for claims 1-24 of the '998 patent based on Bonella and Sato, with additional reference to Jeddeloh and Takekuma, dated Mar. 24, 2009, in Request for Inter Partes Reexamination of U.S. Patent No. 7,177,998. 19 pages.
Exhibit Q—The first amended complaint filed by Patent Owner in *Rambus, Inc.* v. *NVIDIA Corporation*, 3:08-cv-03343-Sl (N.D. Cal.), dated Jul. 10, 2008, in Request for Inter Partes Reexamination of U.S. Patent No. 7,177,998. 18 pages.
Prince, Betty, "Semiconductor Memories: A Handbook of Design, Manufacture, and Application," Second Edition, John Wiley & Sons Ltd, 1983, pp. 273-230 and 281-290, Opposition of Micron from the EPO Mar. 2, 2009 Opposition of Hynix Mar. 19, 2009. 21 pages.
Rhoden, Desi, "DDR Memory," History Availability Future Forcast, Nov. 9, 1999, Advance Memory International, Inc. 14 pages.
Exhibit L—"8-MBIT (512K×16, 1024K×8) SmartVoltage Boot Block Flash Memory Family product preview" ("Intel Datasheet"), dated Sep. 1995, re Request for Inter Partes Reexamination for U.S. Patent No. 7,330,952. 79 pages.
Respondents' Identification of Prior Art Pursuant to Ground Rule 5, re "Certain Semiconductor Chips Having Synchronous Dynamic Random Access Memory Controllers and Products Containing Same," Jun. 12, 2009, USITC Investigation No. 337-TA-661. 26 pages.
Exhibit 10: Post Markman Hearing Joint Claim Construction Chart with Disputed Terms and Parties' Proposed Constructions, Mar. 31, 2009, Exhibits to the Initial Expert Report of Vivek Subramanian filed Jun. 12, 2009, in the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 14 pages.
Exhibit 52: Comparison of Asserted Claims of U.S. Patent No. 7,210,016 to Prior Art References U.S. Patent No. 6,292,903 ("Coteus") and U.S. Patent 6,226,757 ("the Intel-Ware Patent"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 25 pages.
Initial Expert Report of Vivek Subramanian, re "Certain Semiconductor Chips Having Synchronous Dynamic Random Access Memory Controllers and Products Containing Same," Jun. 12, 2009, USITC Investigation No. 337-TA-661. 64 pages.
Decision Rejecting the Opposition dated Jul. 20, 2009 for European Patent No. 1291778, Application No. 02009032.0. 12 pages.
Provision of the Minutes of oral proceedings in accordance with Rule 124(4) EPC dated Jul. 20, 2009. 6 pages.
Ware ReExams, "Rambus Overview // Ware Technical Review," Examiner Interview Slides dated Jul. 23, 2009. 56 pages.
Exhibit 41: Comparison of Asserted Claims of U.S. Patent No. 7,177,998 to Prior Art Reference U.S. Patent No. 6,292,903 ("Coteus"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 25 pages.
Exhibit 42: Comparison of Asserted Claims of U.S. Patent No. 7,210,016 to Prior Art Reference U.S. Patent No. 6,292,903 ("Coteus"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 26 pages.
Exhibit 43: Comparison of Asserted Claims of U.S. Patent No. 7,177,998 to Prior Art Reference U.S. Patent No. 6,292,903 ("Coteus") and the Hotrail Paper, Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 27 pages.
Rebuttal Expert Report of Steven A. Przbylski, Ph.D with Exhibits (redacted), dated Jun. 26, 2009, In the Matter of "Certain Semiconductor Chips Having Synchronous Dynamic Random Access Memory Controllers and Products Containing Same," Investigation No. 337-TA-661. 342 pages.
Direct Witness Statement of Dr. Vivek Subramanian, In the Matter of "Certain Semiconductor Chips Having Synchronous Dynamic Random Access Memory Controllers and Products Containing Same," Investigation No. 337-TA-661, Aug. 3, 2008. 109 Pages.
English Abstract for Japanese Publication No. 2000-035831A published Feb. 2, 2000. 1 page.
Extended European Search Report for European Application No. 05022021.9-2212 mailed Jun. 27, 2006. 6 pages.
Translation of Notice of Reasons for Rejection for Japanese Patent Application No. 2008-027488 mailed Mar. 21, 2008. 7 pages.
Search Report for European Application No. 02 009 032.0-2212 mailed Jul. 4, 2005. 3 pages.
Ware et al., "Method, System and Memory Controller Utilizing Adjustable Read Data Delay Settings," U.S. Control No. 90/009,358 filed Dec. 8, 2008 (Pending Ex Parte reexamination of U.S. Patent No. 7,177,998). 32 pages.
Ware et al., "Method, System and Memory Controller Utilizing Adjustable Write Data Delay Settings," U.S. Control No. 95/001,160 filed Mar. 24, 2009 (Pending Inter Partes reexamination of U.S. Patent No. 7,210,016). 60 pages.
Ware et al., "Method, System and Memory Controller Utilizing Adjustable Read Data Delay Settings," U.S. Control No. 95/0001,159 filed Mar. 24, 2009 (Pending Inter Partes reexamination of U.S. Patent No. 7,177,998). 76 pages.
Translation of Notice of Reasons for Rejection for Japanese Patent Application No. 2008-027488 mailed Jan. 9, 2009. 11 pages.
Translation of Notice of Reasons for Rejection for Japanese Patent Application No. 2008-027486 mailed Jan. 9, 2009. 9 pages.
Examination for European Application No. 02009031.2-2212 mailed Dec. 11, 2008. 4 pages.
Examination for European Application No. 02009031.2-2212 mailed Jul. 12, 2007. 3 pages.
Search Report for European Application 02009031.2-2212 mailed Nov. 11, 2006. 6 pages.
Partial European Search Report for European Application 02009031.2-2212 mailed Jun. 27, 2006. 4 pages.
Translation of Notice of Reasons for Rejection for Japanese Patent Application No. 2002-122494 mailed Nov. 15, 2007. 10 pages.
Translation of Final Notice of Reasons for Rejection for Japanese Patent Application No. 2002-122494 mailed Jun. 4, 2008. 4 pages.
Translation of Notice of Reasons for Rejection for Japanese Patent Application No. 2008-027486 mailed Mar. 18, 2008. 9 pages.
Examination Report for European Application No. 02 009 032.0-2212 mailed Feb. 15, 2006. 5 pages.
Examination Report for European Application No. 02 009 032.0-2212 mailed Oct. 16, 2006. 4 pages.
Translation of Notice of Reasons for Rejection for Japanese Patent Application No. 2002-122447 mailed Nov. 15, 2007. 8 pages.
Translation of Notice of Reasons for Rejection for Japanese Patent Application No. 2002-122447 mailed May 9, 2008. 4 pages.
Examination Report for European Application No. 05022021.9-2212 mailed Oct. 16, 2007. 2 pages.
Examination Report for European Application No. 05 799 571.4-2210 mailed Aug. 6, 2007. 2 pages.
Examination Report for European Application No. 05 799 571.4-2210 mailed Jul. 24, 2008. 4 pages.
Examination Report for European Application No. 05 797 483.4-1229 mailed Oct. 23, 2007. 8 pages.
Examination Report for European Application No. 05 797 483.4-1229 mailed Nov. 27, 2008. 4 pages.
Response mailed Jun. 2, 2009 to the Official Communication dated Jan. 20, 2009 for European Application No. 05022021.9-2212. 32 pages.

Response mailed Jun. 3, 2009 to the Official Communication dated Apr. 14, 2009 for European Application No. 05022021.9-2212. 11 pages.

Ware, Frederick, U.S. Appl. No. 10/043,340, filed Oct. 22, 2001, re U.S. Non-Final Rejection dated Feb. 7, 2008. 11 pages.

Exhibit 23—Certified English Translation of WO99/46687 published Sep. 16, 1999, dated Jun. 12, 2009, USITC, Investigation No. 337-TA-661. 55 pages.

Ware, Frederick, U.S. Application No. 11/335,029, filed Jan. 18, 2006, re Amendment in Response to Office Action mailed Sep. 5, 2006. 16 pages.

Exhibit 44: Comparison of Asserted Claims of U.S. Patent No. 7,210,016 to Prior Art References U.S. Patent No. 6,292,903 ("Coteus") and the Hotrail Paper, Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 26 pages.

Exhibit 45: Comparison of Asserted Claims of U.S. Patent No. 7,177,998 to Prior Art Reference WO99/46687 ("Sato"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 34 pages.

Exhibit 46: Comparison of Asserted Claims of U.S. Patent No. 7,210,016 to Prior Art Reference WO99/46687 ("Sato"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 24 pages.

Exhibit 47: Comparison of Asserted Claims of U.S. Patent No. 7,177,998 to Prior Art References WO99/46687 ("Sato") and U.S. Patent No. 6,292,903 ("Coteus") or 5,646,904 U.S. Patent ("Ohno"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 42 pages.

Exhibit 48: Comparison of Asserted Claims of U.S. Patent No. 7,210,016 to Prior Art References WO99/46687 ("Sato") and U.S. Patent No. 6,292,903 ("Coteus") or 5,646,904 U.S. Patent ("Ohno"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 38 pages.

Exhibit 49: Comparison of Asserted Claims of U.S. Patent No. 7,177,998 to Prior Art Reference U.S. Patent No. 6,266,757 ("the Intel-Ware Patent"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 22 pages.

Exhibit 50: Comparison of Asserted Claims of U.S. Patent No. 7,210,016 to Prior Art Reference U.S. Patent No. 6,226,757 ("the Intel-Ware Patent"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 28 pages.

Exhibit 51: Comparison of Asserted Claims of U.S. Patent No. 7,177,998 to Prior Art Reference U.S. Patent No. 6,292,903 ("Coteus") and U.S. Patent No. 6,226,757 ("the Intel-Ware Patent"), Exhibits to the Initial Expert Report of Vivek Subramanian filed Jun. 12, 2009, In the Matter of "Certain Semiconductor Chips Having Synchronous Dynamic Random Access Memory Controllers and Products Containing Same," U.S. International Trade Commission, Investigation No. 337-TA-661 filed Nov. 6, 2008. 26 pages.

Patent Owners Reply mailed Aug. 10, 2009 to Office Action in Ex Parte Reexamination with Control No. 90/009,358, re U.S. Patent No. 7,177,998. 287 pages.

Patent Owners Reply mailed Aug. 10, 2009 to Office Action in Ex Parte Reexamination with Control No. 90/009,357, re U.S. Patent No. 7,210,016. 287 pages.

Decision Rejecting the Opposition (Art. 101 (2) EPC) dated Jul. 20, 2009. 12 pages.

Minutes of the Oral Proceedings before the Opposition Division dated Jul. 20, 2009. 6 pages.

Ware et al., "Method, System and Memory Controller Utilizing Adjustable Write Data Delay Settings," U.S. Control No. 90/009,357 filed Dec. 8, 2008 (pending Ex Parte reexamination of U.S. Patent No. 7,210,016). 34 pages.

Ware, Frederick, U.S. Appl. No. 12/360,780, filed Jan. 27, 2009, re Office Action with mail date of Jun. 30, 2009. 18 pages.

Nvidia ITC Rebuttal Witness Statement of Steven A. Przybylski, Ph.D., In the Matter of "Certain Semiconductor Chips Having Synchronous Dynamic Random Access Memory Controllers and Products Containing Same," Investigation No. 337-TA-661, redacted Aug. 28, 2009. 270 pages.

U.S. Office Action with mail date Jul. 23, 2009, re Ex Parte Reexamination for U.S. Patent No. 7,177,988, re Interview Summary for Control No. 90/009,358 filed on Dec. 8, 2008. 58 pages.

U.S. Office Action with mail date Jul. 23, 2009, re Ex Parte Reexamination for U.S. Patent No. 7,210,016, re Interview Summary for Control No. 90/009,357 filed on Dec. 8, 2008. 60 pages.

Complainant's Opposition to Respondents' motion for summary Determination that U.S. Patent Nos. 7,210,016 and 7,177,998 are Invalid, dated Jul. 10, 2009. 35 pages.

Complainant's Reply to commission Investigative Staff's Response in Support of Respondents' Motion for Summary Determination that U.S. Patent Nos. 7,210,016 and 7,177,998 are Invalid dated Jul. 30, 2009. 21 pages.

Commission Investigative Staff's combined Response in Support of (1) Respondents' Motion for Summary Determination that U.S. Patent Nos. 7,210,016 and 7,177,998 are Invalid; and (2) Complainant Rambus Inc.'s Motion for Summary Determination of Infringement of the Asserted claims of U.S. Patent No. 7,210,016 dated Jul. 10, 2009. 45 pages.

Complainant's Reply to Respondents' and Commission Investigative staff's responses to Complainant's Motion for summary Determination of Infringement of the Asserted Claims of U.S. Patent No. 7,210,016 dated Jul. 28, 2009. 12 pages.

Commission Investigative Staffs' Response to Complaint's Motion for Leave to File a Reply to Commission Investigative Staffs' Response in Support of Respondents Motion for Summary Determination that U.S. Patents 7,210,016 and 7,177,998 are invalid, dated Aug. 6, 2009, In the Matter of "Certain Semiconductor Chips Having Synchronous Dynamic Random Access Memory Controllers and Products Containing Same," Investigation No. 337-TA-661. 16 pages.

Prince, Betty, "High Performance Memories: New Architecture DRAMs and SRAMs—evolution and function," John Wiley & Sons, New York, 1996. 297 pages.

Prince, Betty, "High Performance Memories: New Architecture DRAMs and SRAMs—evolution and function," John Wiley & Sons, New York, Aug. 1999. 350 pages.

Brief Communication mailed Jun. 2, 2009 for European Patent No. 1 291 778 with EP Application No. 02009032.0. 6 pages.

Response to Official Communication mailed Jun. 10, 2009 for European Patent No. 1 291 778 with EP Application No. 02009032.0. 1 page.

Response to Official Communication mailed Jun. 19, 2009 for European Application No. 02009031.2. 19 pages.

Result of Consultation mailed Jun. 22, 2009 for European Application No. 05022021.9. 2 pages.

Communication about intention to grant a European Patent mailed Jul. 13, 2009 for European Application No. 05022021.9. 130 pages.

Provision of the minutes in accordance with Rule 124(4) EPC mailed Jul. 20, 2009 for European Patent No. 1 291 778 with EP Application No. 02009032.0. 6 pages.

Ware, Frederick, U.S. Appl. No. 11/754,995, filed May 29, 2007, re Non-Final U.S. Office Action mailed Sep. 22, 2009. 29 pages.
Notice of Allowance and Issue Fee(s) Due with mail date of Oct. 15, 2009, re U.S. Appl. No. 11/767,983, filed on Jun. 25, 2007. 14 pages.
Patentee's Pre-Hearing Statement (redacted), dated Sep. 11, 2009, USITC, Investigation No. 337-TA-661. 344 pages.
Respondent's Pre-Hearing Brief (redacted), dated Sep. 11, 2009, USITC, Investigation No. 337-TA-661. 485 pages.
Commission Investigation Staff's Pre-hearing Statement and Brief (Public Version), dated Oct. 15, 2009, USITC Investigation No. 337-TA-661. 222 pages.
U.S. Office Action re Supplemental Notice of Allowability dated Oct. 27, 2009, re Application U.S. Appl. No. 11/767,983, filed on Jun. 25, 2007. 10 pages.
JP Office Action re Decision of Rejection with mail date of Oct. 19, 2009, re JP Application No. 2008-027488 filed on Apr. 24, 2002. 6 pages.
JP Non-Final Office Action with mail date of Dec. 8, 2009 re JP Application No. 2000-516350. 11 pages.
Matsumoto, Craig, "HotRail cools on chip sets, switches to I/O," EE Times Europe, May 2, 2000, downloaded from http://www.eetimes.eu/showArticle.jhtmtjsassionid=WQ5K54PBMUXSVQE1GHPC on Nov. 26, 2009, in Non-Final Office Action for JP Application No. 2002-122494. 4 pages.
JAZiO Incorporated, "JAZiO Supplemental Information," Platform 2000, in Non-Final Office Action dated Dec. 8, 2009, for JP Application No. 2002-122494. 11 pages.
JP Office Action with mail date of Oct. 14, 2009, re Decision of Rejection for JP Application No. 2008-027488 filed on Apr. 24, 2002. 6 pages.
Commission Investigative Staff's Post-Hearing Reply Brief re 33-TA-661, All CBI Redacted, dated Nov. 30, 2009, re U.S. Patent Nos. 6,292,903 and 6,226,757. 65 pages.
Complainant Rambus Inc.'s Initial Post-Hearing Brief, re Investigation No. 33-TA-661, All CBI Redacted, dated Nov. 5, 2009. 138 pages.
Nvidia ITC Trial Transcript, Investigation No. 337-TA-661, vol. 6 (Przybylski), Oct. 20, 2009. 55 pages.
Nvidia ITC Trial Transcript, Investigation No. 337-TA-661, vol. 1 (Przybylski), Oct. 13, 2009. 25 pages.
Nvidia ITC Trial Transcript, Investigation No. 337-TA-661, Oct. 14, 2009. 35 pages.
Nvidia ITC Trial Transcript, Investigation No. 337-TA-661, vol. 3 (Reed, Treichler & Subramanian), Oct. 15, 2009. 25 pages.
Nvidia ITC Trial Transcript, Investigation No. 337-TA-661, vol. 4 (Subramanian & Barth), Oct. 16, 2009. 57 pages.
Nvidia ITC Trial Transcript, Investigation No. 337-TA-661, vol. 5 (Stark, Moniz, Montana & Przybylski), Oct. 19, 2009. 15 pages.
Commission Investigative Staff's Post-Hearing Brief dated Nov. 5, 2009, re U.S. Patent Nos. 6,591,353, 6,470,405 and 7,287,109 (Barth I Family). 129 pages.
Complainant's Post-Hearing Rebuttal Brief dated Nov. 20, 2009, re Farmwald '755 and '037, '757. 71 pages.
Respondents' Reply Post-Hearing Brief dated Nov. 20, 2009, re Barth I Patents and Farmwald '755. 71 pages.
Respondents' Final Post-Hearing Brief dated Nov. 5, 2009, re Ware patents and Barth I Patents. 131 pages.
Opponent's Statement of grounds of Appeal filed by Micron dated Nov. 30, 2009 for EP Patent No. 1,297,778. 84 pages.
EP Office Action mailed Dec. 17, 2009 for EP Application No. 02009031.2. 2 pages.
Ware, Frederick A., U.S. Appl. No. 11/767,983, filed Jun. 25, 2007 re Notice of Allowance and Fee(s) Due mailed Jan. 29, 2010. 14 pages.
Ware, Frederick A., U.S. Appl. No. 11/280,560, filed Nov. 15, 2005 re Notice of Allowance and Fee(s) Due mailed Feb. 1, 2010. 19 pages.
Ware, Frederick, U.S. Appl. No. 11/754,995, filed May 29, 2007, re Response dated Feb. 4, 2010 to the Office Action of Sep. 22, 2009. 27 pages.
Request for Appeal in JP Application No. 2008-027488 against the Decision of Rejection and an Amendment with the JPO on Feb. 15, 2010, Appeal No. 2010-03252. 5 pages.
Response dated Apr. 6, 2010 to the Official Communication dated Dec. 3, 2009 re EP Application No. 02 009 032.0-221, includes 3 claim sets (clear copy and one version with highlighted amendments) relating to Auxiliary Requests I, II and III. 76 pages.
EP Extended Search Report dated Apr. 15, 2010 re EP Application No. 10150033.8-2212. 8 pages.
JP Voluntary Amendment and Request for Examination dated Mar. 17, 2010 re JP Application No. 2010-030473. 7 pages.
EP Response dated Mar. 16, 2010 re EP Application No. 02009031.2-2212 to first interview with the Examiner, includes 6 sets of new claims both highlighted and clear copies. 62 pages.
Ware, Frederick, U.S. Appl. No. 11/754,995, filed May 29, 2007, Notice of Allowance and Fee(s) Due with mail date of Apr. 20, 2010. 14 pages.
Ware, Frederick A., U.S. Appl. No. 11/767,983, filed Jun. 25, 2007 re Request for Continued Examination mailed Apr. 26, 2010. 6 pages.
Ware, Frederick A., U.S. Appl. No. 11/280,560, filed Nov. 15, 2005 re Request for Continued Examination mailed Apr. 16, 2010. 6 pages.
Argument and Amendment dated May 10, 2010 in Response to the Office Action re JP Patent Application No. 2002-122494. 12 pages.
Redacted Initial Determination on Violation of Section 337 and Recommended Determination on Remedy and Bond, dated Jan. 22, 2010, In the Matter of "Certain Semiconductor Chips Having Synchronous Dynamic Random Access Memory Controllers and Products Containing Same," USITC Investigation No. 337-TA-661, pp. i-v, 1-14, 44-88, 119-120, and 132. 67 pages.
Public Version of the Initial Determination on Violation of Section 337 and Recommended Determination on Remedy and Bond dated Jan. 22, 2010, pp. 93-132. 97 pages.
Response dated May 24, 2010 to the Final Office Action dated Mar. 24, 2010 re U.S. Appl. No. 12/360,780. 16 pages.
Office Action with mail date of May 13, 2010 re U.S. Appl. No. 12/111,816. 20 pages.
Office Action with mail date of Mar. 30, 2010, re Control No. 95/001,160 to Third Party Requester Inter Partes Reexamination for U.S. Patent No. 7,210,016. 67 pages.
Office Action with mail date of Mar. 30, 2010, re Control No. 90/009,357 to Ex Parte Reexamination Communication for U.S. Patent No. 7,210,016. 67 pages.
Office Action with mail date of Mar. 30, 2010, for Control No. 95/001,159 re Third Party Requester Inter Partes Reexamination for U.S. Patent No. 7,177,998. 71 pages.
Office Action with mail date of Mar. 30, 2010, for Control No. 90/009,358 re Ex Parte Reexamination for U.S. Patent No. 7,177,998. 71 pages.
Respondents' Response to Complainant Rambus Inc.'s Petition for Review of Initial Determination, dated Feb. 23, 2010, re portions of the briefing in Nvidia ITC action relating to the parties' petitions for review of the ID, Investigation No. 337-TA-661 Before the Honorable Theodore R. Essex. 37 pages.
Complainant's Response to Respondents' Petition for Review, dated Feb. 24, 2010, re portions of the briefing in the Nvidia ITC actions relating to the parties' petitions for review of the ID, Investigation No. 337-TA-661 Before the Honorable Theodore R. Essex. 57 pages.
Office of Unfair Import Investigations' Combined Response to Respondents' and Complainants' petitions for Review of the Final Initial Determination, dated Feb. 24, 2010, re portions of the briefing in the Nvidia ITC action relating to the parties' petitions for review of the ID, Investigation No. 337-TA-661 Before the Commission. 63 pages.
Respondents' Petition for Review of Initial Determination on Violation of Section 337 and Recommended determination on Remedy and Bond, dated Feb. 12, 2010, re portions of the briefing in the Nvidia ITC action relating to the parties' petitions for review of the ID, Investigation No. 337-TA-661 Before the Honorable Theodore R. Essex. 55 pages.
Complainant's Petition for Review, dated Feb. 12, 2010, re portions of the briefing in the Nvidia ITC action relating to the parties' petitions for review of the ID, Investigation No. 337-TA-661 Before the Honorable Theodore R. Essex. 53 pages.
Office Action with mail date of Jun. 1, 2010 re U.S. Appl. No. 12/360,780, re Advisory Action Before the Filing of an Appeal Brief. 4 pages.
Patent Owner's Response dated Jun. 1, 2010 to First Office Action of Mar. 30, 2010 re Control Nos. 95/001,159 and 90/009,358, in Inter Partes Reexamination for U.S. Patent No. 7,177,988, includes the Declaration of Robert J. Murphy. 119 pages.
EP Office Action with mail date of Jun. 15, 2010 re EP Application No. 02009031.2, re Result of Consultation. 3 pages.
EP Office Action with mail date of Jun. 16, 2010 re EP Application No. 02009031.2, re Result of Consultation. 4 pages.
Notice of Reasons for Rejection mailed Dec. 8, 2009 for Japanese Patent Application No. 2002-122494. 11 pages.
Opponent's Statement of Grounds of Appeal mailed Nov. 30, 2009 in European Patent No. 1,291,778. 30 pages.
Extended European Search Report and Written Opinion for European Application No. 10150033.8-2212 mailed Apr. 15, 2010. 8 pages.
JAZiO Incorporated, "JAZiO Supplemental Information," Jan. 10, 2001, 1-20 slides. 20 pages.
Final Rejection, mailed Mar. 24, 2010, for U.S. Appl. No. 12/360,780, filed Jan. 27, 2009. 13 pages.
Final Office Action with mail date of Mar. 24, 2010 re U.S. Appl. No. 12/360,780. 23 pages.
Patent Owner's Response dated Jun. 1, 2010 to First Office Action of Mar. 30, 2010 re Control Nos. 95/001,160 and 90/009,357, includes Declaration of Robert J. Murphy. 112 pages.
EP Response dated Jun. 21, 2010 re EP Application No. 02009031.2, includes new claims 1 thru 16 (highlighted and clear copy of the amendments). 11 pages.
Response dated Jun. 17, 2010 to Office Action dated Mar. 18, 2010 re U.S. Appl. No. 11/145,429. 8 pages.
EP Response dated Jun. 17, 2010 to Examiner's Interview re EP Application No. 02009031.2, includes New claims 1-16 (highlighted amendment). 7 pages.
Request for Continued Examination dated Jul. 15, 2010, re U.S. Appl. No. 12/360,780. 10 pages.
Request for Continued Examination dated Jul. 15, 2010, re U.S. Appl. No. 11/754,995. 7 pages.
Request for Appeal re JP Application No. 2008-027488 against the Decision of Rejection and an Amendment with the JPO on Feb. 15, 2010, Appeal No. 2010-03252. 5 pages.
EP Response dated Mar. 16, 2010 re EP Patent Application No. 02009031.2-2212 to first interview with the Examiner, includes 6 sets of new claims both highlighted and clear copies. 62 pages.
Voluntary Amendment and Request for Examination dated Mar. 17, 2010 re JP Patent Application No. 2010-030473. 7 pages.
Ware, Frederick, U.S. Appl. No. 11/754,995, filed on May 29, 2007, re Notice of Allowance and Fee(s) Due with mail date of Aug. 6, 2010. 10 pages.
EP Response to the Official Communication of Jun. 8, 2010, dated Jul. 6, 2010, in EP Application No. 10150033.8-2212 (Includes New Description of pp. 5 and 86, and both a highlighted copy and a clear copy of the New Claims). 18 pages.
Comments by Third Party Requester Pursuant to 37 C.F.R. 1.947, dated Jul. 1, 2010, In re Inter Partes Reexamination of U.S. Patent No. 7,210,016 with Control Nos. 95/001,160 and 90/009,357. 26 pages.
Exhibit A—Declaration of Michael C. Parris Under 37 C.F.R. 1.132 ("Parris Decl."), dated Jun. 30, 2010, In re Inter Partes Reexamination of U.S. Patent No. 7,177,998 with Control Nos. 95/001,159 and 90/009,358, also in re Inter Partes Reexamination of U.S. Patent No. 7,210,016 with Control Nos. 95/001,160 and 90/009,357. 8 pages.
Exhibit B—JEDEC Standard No. 21-C, pp. 3.11-1 through 3.20-1, re Comments by Third Party Requester dated Jul. 1, 2010, in re Inter Partes Reexamination of U.S. Patent No. 7,210,016 with Control Nos. 95/001,160 and 90/009,357. 186 pages.
Exhibit C—EIA/JEDEC Stub Series Terminated Logic for 3.3 Volts (SSTL_#), EIA/JESD8-8, Aug. 1996, re Comments by Third Party Requester dated Jul. 1, 2010, in re Inter Partes Reexamination of U.S. Patent No. 7,210,016 with Control Nos. 95/001,160 and 90/009,357. 17 pages.
Exhibit D—Rambus XDR(TM) Technology Summary, 2005, re Comments by Third Party Requester dated Jul. 1, 2010, in re Inter Partes Reexamination of U.S. Patent No. 7,210,016 with Control Nos. 95/001,160 and 90/009,357. 5 pages.
Comments by Third Party Requester Pursuant to 37 C.F.R. 1.947, dated Jul. 1, 2010 in re Inter Partes Reexamination of U.S. Patent No. 7,177,998 with Control Nos. 95/001,159 and 90/009,358. 26 pages.

Response to Non-Final Office Action of May 13, 2010, dated Aug. 13, 2010, In re U.S. Appl. No. 12/111,816. 11 pages.
Notification of Decision in Concurrent Proceedings Pursuant to 37 C.F.R. 1.985, dated Aug. 16, 2010, In re reexamination of U.S. Patent No. 7,210,016 with Control Nos. 95/001,160 and 90/009,357. 1 page.
Notification of Decision in Concurrent Proceedings Pursuant to 37 C.F.R. 1.985, dated Aug. 16, 2010, In re reexamination of U.S. Patent No. 7,177,998 with Control Nos. 95/001,159 and 90/009,358. 1 page.
Exhibit A—Commission Opinion, dated Aug. 10, 2010, In the Matter of "Certain Semiconductor Chips Having Synchronous Dynamic Random Access Memory Controllers and Products Containing Same," Investigation No. 337-TA-661, re Notification of Decision in Concurrent Proceedings Pursuant to 37 C.F.R. 1.985, dated Aug. 16, 2010, In re reexamination of U.S. Patent No. 6,470,405 with Control No. 95/001,178. 21 pages.
Response to Office Action dated Jul. 16, 2010, mail date Sep. 16, 2010, re U.S. Appl. No. 12/360,780. 18 pages.
EP Communication of Notice of Opposition dated Oct. 15, 2010 re EP Application No. 05022021.9-2212, EP Patent No. 1653374, filed by Hynix. 147 pages.
Office Action with mail date of Sep. 30, 2010, re Third Party Requester Inter Partes Reexamination of U.S. Patent No. 7,177,998 with Control No. 95/001,159. 7 pages.
Office Action, Decision Dissolving Merger of Reexamination Proceedings, with mail date of Sep. 30, 2010, In Inter Partes Reexamination of U.S. Patent No. 7,177,998 with Control No. 95/001,159 and in re Ex Parte Reexamination of U.S. Patent No. 7,177,998 with Control No. 90/009,358. 12 pages.
Office Action, Sua Sponte Decision Modifying Order for Inter Partes Reexamination: Withdrawal of a Substantial New Question of Patentability, with mail date of Sep. 30, 2010, In re Inter Partes Reexamination of U.S. Patent No. 7,210,016 with Control No. 95/001,160. 7 pages.
Office Action, Decision Dissolving Merger of Reexamination Proceedings, with mail date of Sep. 30, 2010, In re Inter Partes Reexamination of U.S. Patent No. 7,210,016 with Control No. 95/001,160, and in re Ex Parte Reexamination of U.S. Patent No. 7,210,016 with Control No. 90/009,357. 12 pages.
Request for Continued Examination dated Nov. 4, 2010, re U.S. Appl. No. 11/754,995. 5 pages.
U2—Feature analysis of claim 1 of EP 1 653 374 B1, Re EP Communication of Notice of Opposition dated Oct. 15, 2010 in Application No. 05022021.9-2212. 3 pages.
U5—Applications for EP 1653374 A2 and B1, re EP Official Communication of Notice of Opposition dated Oct. 15, 2010 in Application No. 05022021.9-2212. 97 pages.
U6—Summons to attend oral proceedings pursuant to Rule 115(1) EPC, dated Jan. 20, 2009, re EP Office Communication of Notification of Opposition dated Oct. 15, 2010 in EP Application No. 05022021.9-2212. 4 pages.
Dokument D2—Ikeda et al., "High-Speed DRAM Architecture Development," May 1999, IEEE Journal of Solid-State Circuits, vol. 34, No. 5, re EP Office Communication of Notice of Opposition in Application No. 05022021.9-2212. 8 pages.
JEDEC, "JEDEC Standard No. 21-C," Release 9, Configurations for Solid State Memories, Aug. 1999, JEDEC Solid State Technology Association, re EP Office Communication of Notice of Opposition dated Oct. 15, 2010 in EP Application No. 05022021.9-2212. 330 pages.
Ware, Frederick, U.S. Appl. No. 12/111,816, filed Apr. 29, 2008, re Notice of Allowance and Fee(s) Due with mail date Oct. 22, 2010. 23 pages.
EP Office Action with mail date of Nov. 12, 2010, re Notice of Opposition for EP Application No. 05022021.9. 1 page.
Non-Confidential Brief for Appellant Rambus Inc. in the Federal Circuit in Investigation No. 337-TA-661 dated Dec. 13, 2010, No. 2010-1483. 5 pages.
EP Office Action with mail date of Dec. 8, 2010 re Extended EP Search Report for EP Application No. 10179117.6. 7 pages.
EP Communication dated Dec. 6, 2010 re the extended EP search Report for EP Application No. 10179110.1. 7 pages.
EP Communication dated Dec. 6, 2010 re the extended EP search Report for EP Application No. 10178677.0. 7 pages.

Ware, Frederick, U.S. Appl. No. 12/360,780, filed Jan. 27, 2009, re Response dated Dec. 16, 2010 to the Office Action dated Sep. 16, 2010. 16 pages.
Ware, Frederick, U.S. Appl. No. 12/111,816, filed Apr. 29, 2008, re Request for Continued Examination dated Jan. 21, 2011. 8 pages.
CN Response submitted on Mar. 21, 2011 to the Second Office Action of Jan. 7, 2011 re CN Application No. 200680041998.3. 26 pages.
Ware, Frederick, U.S. Appl. No. 11/767,983, filed Jun. 25, 2007, Notice of Allowance and Fee(s) Due with mail date of Feb. 24, 2011. 41 pages.
Redacted NVIDIA's Supplemental Objections and Responses to Rambus' First, Second, Third, Fourth, Fifth and Sixth Sets of Interrogatories Nos. 12-21, 23, 24, 28, 31-34, 39, 55, 58-60, 77-89, 95, 97, 98, 120, 156, dated Jun. 26, 2009, In the Matter of "Certain Semiconductor Chips Having Synchronous Dynamic Random Access Memory Controllers and Products Containing Same,"USITC Investigation No. 337-TA-661. 80 pages.
Redacted Vivek Subramanian Supplemental Expert Report on Invalidity in View of the Markman Order and Dr. Przybylski's Expert Report dated Jun. 26, 2009, In the Matter of "Certain Semiconductor Chips Having Synchronous Dynamic Random Access Memory Controllers and Products Containing Same," USITC Investigation No. 337-TA-661. 36 pages.
Vivek Subramanian Supplemental Expert Report of Non-Infringement of the Ware Patents in View of Dr. Przybylski's Rebuttal Report dated Jul. 8, 2009, In the Matter of "Certain Semiconductor Chips Having Synchronous Dynamic Random Access Memory Controllers and Products Containing Same," USITC Investigation No. 337-TA-661. 17 pages.
Redacted Supplemental Expert Report of Dr. Przybylski, dated Jul. 10, 2009, In the Matter of "Certain Semiconductor Chips Having Synchronous Dynamic Random Access Memory Controllers and Products Containing Same," USITC Investigation No. 337-TA-661. 15 pages.
Redacted Deposition Transcripts of Steven A Przybylski, Ph.D., dated Jul. 13, 2009-Jul. 15, 2009, In the Matter of "Certain Semiconductor Chips Having Synchronous Dynamic Random Access Memory Controllers and Products Containing Same," USITC Investigation No. 337-TA-661. 145 pages.
Redacted Vivek Subramanian Deposition Transcripts, dated Jul. 15, 2009-Jul. 17, 2009, In the Matter of "Certain Semiconductor Chips Having Synchronous Dynamic Random Access Memory Controllers and Products Containing Same," USITC Investigation No. 337-TA-661. 599 pages.
Redacted Rebuttal Witness Statement of Steven A Przybylski, Ph.D, dated Aug. 28, 2009, In the Matter of "Certain Semiconductor Chips Having Synchronous Dynamic Random Access Memory Controllers and Products Containing Same," USITC Investigation No. 37-TA-661. 270 pages.
Redacted Rebuttal Witness Statement of Vivek Subramanian, dated Aug. 28, 2009, In the Matter of "Certain Semiconductor Chips Having Synchronous Dynamic Random Access Memory Controllers and Products Containing Same," USITC Investigation No. 337-TA-661. 55 pages.
Ware, Frederick, U.S. Appl. No. 12/360,780, filed Jan. 27, 2009, Office Action dated Sep. 16, 2010. 23 pages.
English Translation of EP Opposition Brief, dated Oct. 5, 2010, re European Patent Application No. 05 022 021.9, EP Patent No. 1 653 374, filed by Hynix Semiconductor Deutschland GmbH, Raunheim Germany. 70 pages.
English language Abstract of Japanese Patent Publication No. 07-074606 A, Published Mar. 17, 1995. 1 page.
English language Abstract of Japanese Patent Publication No. 08-202653 A, Aug. 9, 1996. 1 page.
English language Abstract of Japanese Patent Publication No. 11-007335 A, Published Jan. 12, 1999. 2 pages.
English language Abstract of Japanese Patent Publication No. 11-085345 A, Published Mar. 30, 1999. 1 page.
English language Abstract of Japanese Patent Publication No. 2008-191661, Published Aug. 21, 2008. 1 page.

Ware, Frederick, U.S. Appl. No. 12/360,780, filed Jan. 27, 2009, Notice of Allowance and Fee(s) Due with mail date of Mar. 4, 2011. 16 pages.
Ware, Frederick, U.S. Appl. No. 11/754,995, filed May 29, 2007, Notice of Allowance and Fee(s) Due with mail date of Mar. 4, 2011. 35 pages.
EP Submission dated Mar. 22, 2011 to Hynix Opposition on Mar. 22, 2010 for EP Application No. 05022021.9. 21 pages.
Ware, Frederick A., U.S. Appl. No. 11/280,560, filed Nov. 15, 2005 re Request for Continued Examination mailed May 2, 2011. 12 pages.
Confidential Answering Brief of Intervenors Nvidia Corporation et al., Non-Confidential No. 2010-1483, re Nvidia's opposition brief in the Federal Circuit Appeal of the Nvidia ITC Investigation dated May 9, 2011. 200 pages.
Ware, Frederick, U.S. Appl. No. 11/767,983, filed Jun. 25, 2007, re Request for Continued Examination dated May 19, 2011. 7 pages.
Ware, Frederick, U.S. Appl. No. 12/360,780, filed Jan. 27, 2009, re Request for Continued Examination dated Jun. 2, 2011. 7 pages.
Ware, Frederick, U.S. Appl. No. 12/111,816, filed Apr. 29, 2008, re Request for Continued Examination dated Jun. 1, 2011. 6 pages.
Ware, Frederick, U.S. Appl. No. 11/754,995, filed May 29, 2007, re Request for Continued Examination dated Jun. 2, 2011. 7 pages.
EP Summons to Attend Oral Proceedings Pursuant to Rule 115(1) EPC in connection with European Patent No. 1653374 (European Patent Application No. 05022021.9), dated Jun. 10, 2011. 13 pages.
Ware, Frederick, U.S. Appl. No. 12/111,816, filed Apr. 29, 2008, re Notice of Allowance and Fee(s) Due dated Jun. 17, 2011. 26 pages.
Ware, Frederick, U.S. Appl. No. 12/111,816, filed Apr. 29, 2008, re Office Action dated Jun. 30, 2011. 4 pages.
EP Response dated Jul. 12, 2011 to the Official Communication dated Dec. 6, 2010 re EP Application No. 10179110.1. 16 pages.
EP Response dated Jul. 12, 2011 to the Official Communication dated Dec. 8, 2010 re EP Application No. 10179117.6. 14 pages.
EP Response dated Jul. 12, 2011 to the Official Communication dated Dec. 6, 2010 re EP Application No. 10178677.0. 15 pages.
Ware, Frederick, U.S. Appl. No. 11/754,995, filed May 29, 2007, re Office Action dated Jul. 26, 2011 re Supplemental Notice of Allowability. 6 pages.
Comments by Third Party Requester NVIDIA, dated Aug. 19, 2011, re U.S. Appl. No. 95/001,160 in the Inter Partes Reexamination of U.S. Patent No. 7,210,016 includes Exhibits. 250 pages.
Exhibit C-A—Declaration of Harvey Stiegler Under 37 C.F.R. 1.132 ("Decl."), dated Aug. 19, 2011, in Comments by Third Party Requester NVIDIA for U.S. Appl. No. 95/001,160 in the Inter Partes Reexamination of U.S. Patent No. 7,210,016. 9 pages.
Comments by Third Party Requester NVIDIA, dated Aug. 19, 2011, re U.S. Appl. No. 95/001,159 in the Inter Partes Reexamination of U.S. Patent No. 7,177,998 includes Exhibits. 249 pages.
Ware, Frederick, U.S. Appl. No. 11/754,995, filed May 29, 2007, re Request for Continued Examination dated Sep. 8, 2011. 6 pages.
Ware, Frederick, U.S. Appl. No. 12/111,816, filed Apr. 29, 2008, re Request for Continued Examination dated Sep. 8, 2011. 6 pages.
Ware, Frederick, U.S. Appl. No. 11/280,450, filed Nov. 15, 2005, re Notice of Allowance and Fee(s) Due with mail date of Oct. 5, 2011. 28 pages.
Revised Non-Final Office Action dated Oct. 3, 2011, re Reexamination Control No. 95/001,160 for Patent No. 7,210,016 in Third party Requester Inter Partes Reexamination. 33 pages.
Revised Non-Final Office Action dated Oct. 3, 2011, re Reexamination Control No. 95/001,159 for Third Party Requester Inter Partes Reexamination of Patent No. 7,177,998. 38 pages.
Ware, Frederick, U.S. Appl. No. 11/767,983, filed Jun. 25, 2007, re Notice of Allowance and Fee(s) Due mailed Dec. 2, 2011. 22 pages.
Ware, Frederick, U.S. Appl. No. 12/111,816, filed Apr. 29, 2008, re Notice of Allowance and Fee(s) Due mailed Dec. 14, 2011. 26 pages.
Exhibit C-B—JEDEC Standard No. 21-C, pp. 3.11-1 through 3.20-1, re Inter Partes Reexamination Control No. 95/001,159 filed Mar. 24, 2009, re Comments by Third Party Requester NVIDIA, dated Aug. 19, 2011. 186 pages.
Exhibit C-C—EIA/JEDEC Stub Series Terminated Logic for 3.3 Volts (SSTL_#), EIA/JESD8-8, Aug. 1996, re Inter Partes Reexamination Control No. 95/001,159 filed Mar. 24, 2009, re Comments by Third Party Requester NVIDIA, dated Aug. 19, 2011. 17 pages.

Exhibit C-D—Rambus XDR Technology Summary, 2005, re Inter Partes Reexamination Control No. 95/001,159 filed Mar. 24, 2009, re Comments by Third Party Requester NVIDIA, dated Aug. 19, 2011. 5 pages.
JP Office Action dated Dec. 2, 2011 re JP Application No. 2009-162534. 7 pages.
Ware, Frederick, EP Application No. 05022021.9 filed Oct. 10, 2005, re Response to Official Communication dated Jun. 10, 2011 (Summons to Attend Oral Proceedings) includes Auxiliary Requests I-VIII (Clear and Highlighted copies), "DDR SDRAM Signaling Design Notes," "Hardware and Layout Design Considerations for DDR Memory Interfaces," and "DDR SDRAM Registered DIMM, Design Specification," dated Dec. 19, 2011. 196 pages.
Ware, Frederick, U.S. Appl. No. 11/280,560, filed Nov. 15, 2005, re Request for Continued Examination, dated Dec. 23, 2011. 7 pages.
Patent Owner's Response to Office Action of Jun. 21, 2011, dated Jul. 21, 2011, re Inter Partes Reexamination Control No. 95/001,160 filed Mar. 24, 2009. 49 pages.
Exhibit 1—Deposition of Robert J. Murphy, re Inter Partes Reexamination Control No. 95/001,160 filed Mar. 24, 2009, re Patent Owner's Response to Office Action of Jun. 21, 2011, dated Jul. 21, 2011. 6 pages.
Exhibit 2—JEDEC Standard No. 21-C, p. 4.5.7-1 through 4.5.7-24, Release 8r11, re Inter Partes Reexamination Control No. 95/001,160 filed Mar. 24, 2009, re Patent Owner's Response to Office Action of Jun. 21, 2011, dated Jul. 21, 2011. 25 pages.
Exhibit 3—JEDEC Standard No. 21-C, Release 10, p. 4.5.11-1 through 4.5.11-23, re Inter Partes Reexamination Control No. 95/001,160 filed Mar. 24, 2009, re Patent Owner's Response to Office Action of Jun. 21, 2011, dated Jul. 21, 2011. 24 pages.
Exhibit 4—PC SDRAM Unbuffered DIMM Specification, Revision 1.0, Feb. 1998, Intel Corporation, re Inter Partes Reexamination Control No. 95/001,160 filed Mar. 24, 2009, re Patent Owner's Response to Office Action of Jun. 21, 2011, dated Jul. 21, 2011. 48 pages.
Exhibit 5—DDR SDRAM Registered DIMM Design Specification, Revision 0.6, Nov. 1999, re Inter Partes Reexamination Control No. 95/001,160 filed Mar. 24, 2009, re Patent Owner's Response to Office Action of Jun. 21, 2011, dated Jul. 21, 2011. 63 pages.
Exhibit 6—Solanski, Vasant, "Design Guide Lines for Registered DDR DIMM Module Using PI74SSTV16857 Register and PI6CV857 PLL Clock Driver," Application Note 37, Jun. 11, 2001, Pericom, re Inter Partes Reexamination Control No. 95/001,160 filed Mar. 24, 2009, re Patent Owner's Response to Office Action of Jun. 21, 2011, dated Jul. 21, 2011. 7 pages.
Exhibit 7—PC1600 and PC2100 DDR SDRAM Unbuffered DIMM Design Specification, Revision 1.1, Jun. 29, 2001, re Inter Partes Reexamination Control No. 95/001,160 filed Mar. 24, 2009, re Patent Owner's Response to Office Action of Jun. 21, 2011, dated Jul. 21, 2011. 43 pages.
Exhibit 8—JEDEC Standard, "DDR3 SDRAM Standard," JESD79-3D, Sep. 2009, re Inter Partes Reexamination Control No. 95/001,160 filed Mar. 24, 2009, re Patent Owner's Response to Office Action of Jun. 21, 2011, dated Jul. 21, 2011. 220 pages.
Exhibit 9—Micron Technology, Inc., "DDR3 Advantages," Slides, 2009, re Inter Partes Reexamination Control No. 95/001,160 filed Mar. 24, 2009, re Patent Owner's Response to Office Action of Jun. 21, 2011, dated Jul. 21, 2011. 16 pages.
Exhibit 10—Altera, "Utilizing Leveling Techniques in DDR3 SDRAM Memory Interfaces," White Paper, version 1.0, Nov. 2007, re Inter Partes Reexamination Control No. 95/001,160 filed Mar. 24, 2009, re Patent Owner's Response to Office Action of Jun. 21, 2011, dated Jul. 21, 2011. 8 pages.
Exhibit 11—Rambus Inc., "Press Release: XDR DRAM Surpasses 100 Million Units Shipped," 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 12—Rambus Inc., "XDR Innovations," re Inter Partes Reexamination Control No. 95/001,160 filed Mar. 24, 2009, re Patent Owner's Response to Office Action of Jun. 21, 2011, dated Jul. 21, 2011. 2 pages.
Exhibit 13—Rambus Inc., "FlexPhase Timing Adjustments," re Inter Partes Reexamination Control No. 95/001,160 filed Mar. 24, 2009, re Patent Owner's Response to Office Action of Jun. 21, 2011, dated Jul. 21, 2011. 2 pages.
Exhibit 14—Rambus Inc., "Press Release: Rambus Technology Provides Unprecedented Bandwidth to Sony Computer Entertainment's PlayStation 3," obtained from website on May 23, 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 15—Rambus Inc., "Press Release: Toshiba Licenses Rambus XDR Memory Architecture for HDTV Chipset," 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 16—Rambus Inc., "Press Release: Rambus Signs New Technology License Agreement with IBM," obtained from website on May 23, 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 17—Rambus Inc., "Press Release: Toshiba Licenses Rambus XDR Memory and PCI Express Interface Solutions," obtained from website on May 23, 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 18—Rambus Inc., "Press Release: Rambus Signs Technology License Agreements with Sony, Sony Computer Entertainment and Toshiba," obtained from website on May 23, 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 19—Rambus Inc., "Press Release: Rambus DDR2 and XDR Memory Interfaces Selected by Matsushita," obtained from website on May 23, 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 20—Rambus Inc., "Press Release: Teradici Selects Rambus XDR Memory Interface," obtained from website on May 23, 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 21—Rambus Inc., "Press Release: Rambus XDR Memory Architecture Named 2008 DesignVision Winner," 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 22—Rambus Inc., "Press Release: Rambus Fellow Named Inventor of the Year," 2010, re Inter Partes Reexamination Control No. 95/001,160 filed Mar. 24, 2009, re Patent Owner's Response to Office Action of Jun. 21, 2011, dated Jul. 21, 2011. 2 pages.
Exhibit 23—List of Exhibits, re Inter Partes Reexamination Control No. 95/001,160 filed Mar. 24, 2009, re Patent Owner's Response to Office Action of Jun. 21, 2011, dated Jul. 21, 2011. 2 pages.
Declaration of Robert J. Murphy Under 37 C.F.R. 1.132 dated Jul. 20, 2011, re Inter Partes Reexamination Control No. 95/001,160 filed Mar. 24, 2009. 69 pages.
Patent Owner's Response to Office Action of Jun. 21, 2011, dated Jul. 21, 2011, re Inter Partes Reexamination No. 95/001,159 filed Mar. 24, 2009. 53 pages.
Declaration of Robert J. Murphy Under 37 C.F.R. 1.132 dated Jul. 20, 2011, re Inter Partes Reexamination Control No. 95/001,159 filed Mar. 24, 2009. 74 pages.
Hynix Submission dated Dec. 19, 2011 in EP Application No. 05022021.9. 45 pages.
EP Provision of the minutes of the oral proceedings dated Mar. 12, 2012 re EP Application No. 05022021.9. 10 pages.
EP Interlocutory decision in Opposition Proceedings dated Mar. 12, 2012 re EP Application No. 05022021.9. 18 pages.
JP Response dated Mar. 30, 2012 re JP Application No. 2009-162534. 7 pages.
Ware, Frederick, U.S. Appl. No. 11/754,995, filed May 29, 2007, Notice of Allowance and Fee(s) Due mailed Apr. 6, 2012. 18 pages.

Hynix Statement of Grounds for Appeal dated Jul. 13, 2012 in EP Application No. 05022021.9, Includes Annex U7, Annex U8, Annex U9, Annex U10, Annex U11, Annex U12, Document D7b1, and US 6,137,734. 282 pages.

Official Communication dated Jul. 24, 2012 in EP Application No. 05022021.9. 1 page.

Official Communication dated Jul. 27, 2012 in EP Application No. 05022021.9, Includes New pp. 48 & 57. 3 pages.

JP Response re Argument and Amendment dated Sep. 14, 2012 for JP Application No. 2009-162534. 11 pages.

* cited by examiner

MEMORY CONTROLLER

CROSS-REFERENCE TO RELATED APPLICATIONS

This application is a continuation of U.S. patent application Ser. No. 12/111,816 filed Apr. 29, 2008, which is a continuation of U.S. patent Ser. No. 11/280,560 filed Nov. 15, 2005, which is a continuation of U.S. patent application Ser. No. 11/094,137 filed Mar. 31, 2005 (now U.S. Pat. No. 7,209, 397), which is a continuation of U.S. patent application Ser. No. 10/732,533 filed Dec. 11, 2003 (now U.S. Pat. No. 7,225, 311), which is a continuation of U.S. patent application Ser. No. 09/841,911 filed Apr. 24, 2001 (now U.S. Pat. No. 6,675, 272), all of which are hereby incorporated by reference in their entirety.

TECHNICAL FIELD

The invention relates generally to information storage and retrieval and, more specifically, to coordinating memory components.

BACKGROUND

As computers and data processing equipment have grown in capability, users have developed applications that place increasing demands on the equipment. Thus, there is a continually increasing need to process more information in a given amount of time. One way to process more information in a given amount of time is to process each element of information in a shorter amount of time. As that amount of time is shortened, it approaches the physical speed limits that govern the communication of electronic signals. While it would be ideal to be able to move electronic representations of information with no delay, such delay is unavoidable. In fact, not only is the delay unavoidable, but, since the amount of delay is a function of distance, the delay varies according to the relative locations of the devices in communication.

Since there are limits to the capabilities of a single electronic device, it is often desirable to combine many devices, such as memory components, to function together to increase the overall capacity of a system. However, since the devices cannot all exist at the same point in space simultaneously, consideration must be given to operation of the system with the devices located diversely over some area.

Traditionally, the timing of the devices' operation was not accelerated to the point where the variation of the location of the devices was problematic to their operation. However, as performance demands have increased, traditional timing paradigms have imposed barriers to progress.

One example of an existing memory system uses DDR (double data rate) memory components. The memory system includes a memory controller and a memory module. A propagation delay occurs along an address bus between the memory controller and the memory module. Another propagation delay occurs along the data bus between the memory controller and the memory module.

The distribution of the control signals and a control clock signal in the memory module is subject to strict constraints. Typically, the control wires are routed so there is an equal length to each memory component. A "star" or "binary tree" topology is typically used, where each spoke of the star or each branch of the binary tree is of equal length. The intent is to eliminate any variation of the timing of the control signals and the control clock signal between different memory components of a memory module, but the balancing of the length of the wires to each memory component compromises system performance (some paths are longer than they need to be). Moreover, the need to route wires to provide equal lengths limits the number of memory components and complicates their connections.

In such DDR systems, a data strobe signal is used to control timing of both data read and data write operations. The data strobe signal is not a periodic timing signal, but is instead only asserted when data is being transferred. The timing signal for the control signals is a periodic clock. The data strobe signal for the write data is aligned to the clock for the control signals. The strobe for the read data is delayed by delay relative to the control clock equal to the propagation delay along the address bus plus the propagation delay along the data bus. A pause in signaling must be provided when a read transfer is followed by a write transfer to prevent interference along various signal lines used. Such a pause reduces system performance. Such a system is constrained in several ways. First, because the control wires have a star topology or a binary tree routing, reflections occur at the stubs (at the ends of the spokes or branches). The reflections increase the settling time of the signals and limit the transfer bandwidth of the control wires. Consequently, the time interval during which a piece of information is driven on a control wire will be longer than the time it takes a signal wavefront to propagate from one end of the control wire to the other. Additionally, as more modules are added to the system, more wire stubs are added to each conductor of the data bus, thereby adding reflections from the stubs. This increases the settling time of the signals and further limits the transfer bandwidth of the data bus.

Also, because there is a constraint on the relationship between the propagation delays along the address bus and the data bus in this system, it is hard to increase the operating frequency without violating a timing parameter of the memory component. If a clock signal is independent of another clock signal, those clock signals and components to which they relate are considered to be in different clock domains. Within a memory component, the write data receiver is operating in a different clock domain from the rest of the logic of the memory component, and the domain crossing circuitry will only accommodate a limited amount of skew between these two domains. Increasing the signaling rate of data will reduce this skew parameter (when measured in time units) and increase the chance that a routing mismatch between data and control wires on the board will create a timing violation.

Also, most DDR systems have strict limits on how large the address bus and data bus propagation delays may be (in time units). These are limits imposed by the memory controller and the logic that is typically included for crossing from the controller's read data receiver clock domain into the clock domain used by the rest of the controller. There is also usually a limit (expressed in clock cycles) on how large the sum of these propagation delays can be. If the motherboard layout makes this sum too large (when measured in time units), the signal rate of the system may have to be lowered, thereby decreasing performance.

In another example of an existing memory system, the control wires and data bus are connected to a memory controller and are routed together past memory components on each memory module. One clock is used to control the timing of write data and control signals, while another clock is used to control the timing of read data. The two clocks are aligned at the memory controller. Unlike the previous prior art example, these two timing signals are carried on separate wires.

In such an alternate system, several sets of control wires and a data bus may be used to intercouple the memory controller to one or more of the memory components. The need for separate sets of control wires introduces additional cost and complexity, which is undesirable. Also, if a large capacity memory system is needed, the number of memory components on each data bus will be relatively large. This will tend to limit the maximum signal rate on the data bus, thereby limiting performance.

Thus, a technique is needed to coordinate memory operations among diversely-located memory components.

DETAILED DESCRIPTION

Figure 1:
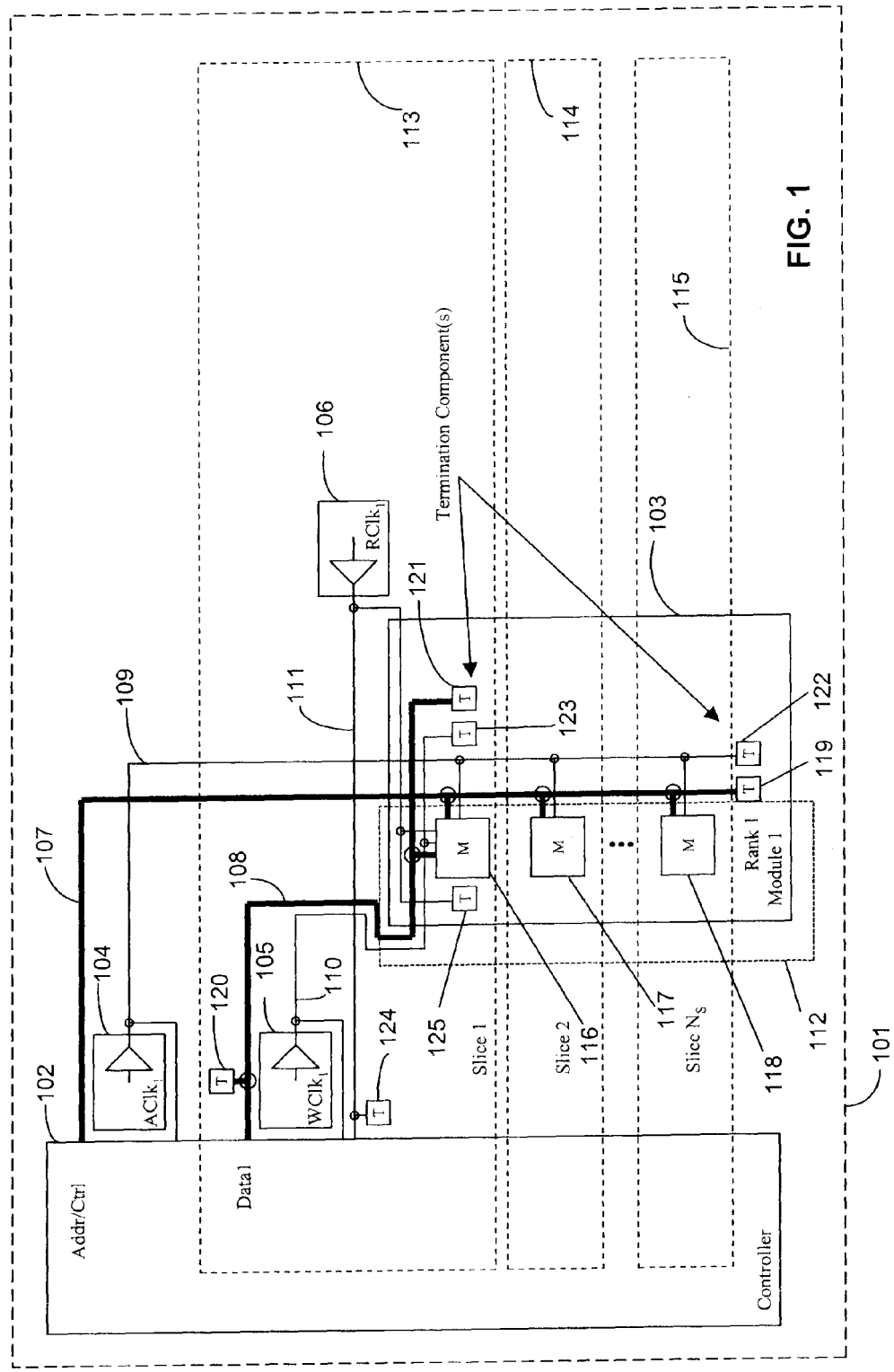
FIG. 1 is a block diagram illustrating a memory system having a single rank of memory components with which an embodiment of the invention may be implemented.

A method and apparatus for coordinating memory operations among diversely-located memory components is described. In accordance with an embodiment of the invention, wave-pipelining is implemented for an address bus coupled to a plurality of memory components. The plurality of memory components are configured according to coordinates relating to the address bus propagation delay and the data bus propagation delay. A timing signal associated with address and/or control signals which duplicates the propagation delay of these signals is used to coordinate memory operations. The address bus propagation delay, or common address bus propagation delay, refers to the delay for a signal to travel along an address bus between the memory controller component and a memory component. The data bus propagation delay refers to the delay for a signal to travel along a data bus between the memory controller component and a memory component.

According to one embodiment of the invention, a memory system includes multiple memory modules providing multiple ranks and multiple slices of memory components. Such a system can be understood with reference to FIG. 27. The memory system of FIG. 27 includes memory module 2703 and memory module 2730. Memory module 2703 includes a rank that includes memory components 2716-2618 and another rank that includes memory components 2744-2746.

The memory system is organized into slices across the memory controller component and the memory modules. The memory system of FIG. 27 includes a slice 2713 that includes a portion of memory controller 2702, a portion of memory module 2703 including memory components 2716 and 2744, and a portion of memory module 2730 including memory components 2731 and 2734. The memory system of FIG. 27 includes another slice 2714 that includes another portion of memory controller 2702, another portion of memory module 2703 including memory components 2717 and 2745, and another portion of memory module 2730 including memory components 2732 and 2735. The memory system of FIG. 27 further includes yet another slice 2715 that includes yet another portion of memory controller 2702, yet another portion of memory module 2703 including memory components 2718 and 2746, and yet another portion of memory module 2730 including memory components 2733 and 2736.

The use of multiple slices and ranks, which may be implemented using multiple modules, allows efficient interconnection of a memory controller and several memory components while avoiding degradation of performance that can occur when a data bus or address bus has a large number of connections to it. With a separate data bus provided for each slice, the number of connections to each data bus can be kept to a reasonable number. The separate data buses can carry different signals independently of each other. A slice can include one or more memory components per module. For example, a slice can include one memory component of each rank. Note that the term slice may be used to refer to the portion of a slice excluding the memory controller. In this manner, the memory controller can be viewed as being coupled to the slices. The use of multiple modules allows memory components to be organized according to their path lengths to a memory controller. Even slight differences in such path lengths can be managed according to the organization of the memory components into ranks. The organization of memory components according to ranks and modules allows address and control signals to be distributed efficiently, for example through the sharing of an address bus within a rank or module.

In one embodiment, a slice can be understood to include several elements coupled to a data bus. As one example, these elements can include a portion of a memory controller component, one or more memory components on one module, and, optionally, one or more memory components on another module. In one embodiment, a rank can be understood to include several memory components coupled by a common address bus. The common address bus may optionally be coupled to multiple ranks on the module or to multiple modules. The common address bus can connect a memory controller component to each of the slices of a rank in succession, thereby allowing the common address bus to be routed from a first slice of the rank to a second slice of the rank and from the second slice of the rank to a third slice of the rank. Such a configuration can simplify the routing of the common address bus.

For discussion purposes, a simplified form of a memory system is first discussed in order to illustrate certain concepts, whereas a more complex memory system that includes a plurality of modules and ranks is discussed later in the specification.

FIG. 1 is a block diagram illustrating a memory system having a single rank of memory components with which an embodiment of the invention may be implemented. Memory system 101 comprises memory controller component 102 and memory module 103. Address clock 104 provides an address clock signal that serves as a timing signal associated with the address and control signals that propagate along address bus 107. Address clock 104 provides its address clock signal along address clock conductor 109, which is coupled to memory controller component 102 and to memory module 103. The address and control signals are sometimes referred to as simply the address signals or the address bus. However, since control signals may routed according to a topology common to address signals, these terms, when used, should be understood to include address signals and/or control signals.

Write clock 105 provides a write clock signal that serves as a timing signal associated with the data signals that propagate along data bus 108 during write operations. Write clock 105 provides its write clock signal along write clock conductor 110, which is coupled to memory controller component 102 and memory module 103. Read clock 106 provides a read clock signal that serves as a timing signal associated with the data signals that propagate along data bus 108 during read operations. Read clock 106 provides its read clock signal along read clock conductor 111, which is coupled to memory controller component 102 and memory module 103.

Termination component 120 is coupled to data bus 108 near memory controller component 102. As one example, termination component 120 may be incorporated into memory controller component 102. Termination component 121 is coupled to data bus 108 near memory module 103. Termination component 121 is preferably incorporated into memory module 103. Termination component 123 is coupled to write clock conductor 110 near memory component 116 of memory module 103. Termination component 123 is preferably incorporated into memory module 103. Termination component 124 is coupled to read clock conductor 111 near memory controller component 102. As an example, termination component 124 may be incorporated into memory controller component 102. Termination component 125 is coupled to read clock conductor 111 near memory component 116 of memory module 103. Termination component 125 is preferably incorporated into memory module 103. The termination components may utilize active devices (e.g., transistors or other semiconductor devices) or passive devices (e.g. resistors, capacitors, or inductors). The termination components may utilize an open connection. The termination components may be incorporated in one or more memory controller components or in one or more memory components, or they may be separate components on a module or on a main circuit board.

Memory module 103 includes a rank 112 of memory components 116, 117, and 118. The memory module 103 is organized so that each memory component corresponds to one slice. Memory component 116 corresponds to slice 113, memory component 117 corresponds to slice 114, and memory component 118 corresponds to slice 115. Although not shown in FIG. 1, the specific circuitry associated with the data bus, write clock and associated conductors, and read clock and associated conductors that are illustrated for slice 113 is replicated for each of the other slices 114 and 115. Thus, although such circuitry has not been illustrated in FIG. 1 for simplicity, it is understood that such dedicated circuitry on a slice-by-slice basis is preferably included in the memory system shown.

Within memory module 103, address bus 107 is coupled to each of memory components 116, 117, and 118. Address clock conductor 109 is coupled to each of memory components 116, 117, and 118. At the terminus of address bus 107 within memory module 103, termination component 119 is coupled to address bus 107. At the terminus of address clock conductor 109, termination component 122 is coupled to address clock conductor 109.

In the memory system of FIG. 1, each data signal conductor connects one controller data bus node to one memory device data bus node. However, it is possible for each control and address signal conductor to connect one controller address/control bus node to an address/control bus node on each memory component of the memory rank. This is possible for several reasons. First, the control and address signal conductors pass unidirectional signals (the signal wavefront propagates from the controller to the memory devices). It is easier to maintain good signal integrity on a unidirectional signal conductor than on a bidirectional signal conductor (like a data signal conductor). Second, the address and control signals contain the same information for all memory devices. The data signals will be different for all memory devices. Note that there might be some control signals (such as write enable signals) which are different for each memory device—these are treated as unidirectional data signals, and are considered to be part of the data bus for the purposes of this distinction. For example, in some instances, the data bus may include data lines corresponding to a large number of bits, whereas in some applications only a portion of the bits carried by the data bus may be written into the memory for a particular memory operation. For example, a 16-bit data bus may include two bytes of data where during a particular memory operation only one of the two bytes is to be written to a particular memory device. In such an example, additional control signals may be provided along a similar path as that taken by the data signals such that these control signals, which control whether or not the data on the data bit lines is written, traverse the system along a path with a delay generally matched to that of the data such that the control signals use in controlling the writing of the data is aptly timed. Third, routing the address and control signals to all the memory devices saves pins on the controller and memory module interface.

As a result, the control and address signals will be propagated on wires that will be longer than the wires used to propagate the data signals. This enables the data signals to use a higher signaling rate than the control and address signals in some cases.

To avoid impairment of the performance of the memory system, the address and control signals may be wave-pipelined in accordance with an embodiment of the invention. The memory system is configured to meet several conditions conducive to wave-pipelining. First, two or more memory components are organized as a rank. Second, some or all address and control signals are common to all memory components of the rank. Third, the common address and control signals propagate with low distortion (e.g. controlled impedance). Fourth, the common address and control signals propagate with low intersymbol-interference (e.g. single or double termination).

Wave-pipelining occurs when Tbit<Twire, where the timing parameter Twire is defined to be the time delay for a wavefront produced at the controller to propagate to the termination component at the end of the wire carrying the signal, and the timing parameter Tbit is defined to be the time interval between successive pieces (bits) of information on the wire. Such pieces of information may represent individual bits or multiple bits encoded for simultaneous transmission. Wave-pipelined signals on wires are incident-wave sampled by receivers attached to the wire. This means that sampling will generally take place before the wavefront has reflected from the end of the transmission line (e.g., the wire).

It is possible to extend the applicability of the invention from a single rank to multiple ranks of memory components in several ways. First, multiple ranks of memory components may be implemented on a memory module. Second, multiple memory modules may be implemented in a memory system. Third, data signal conductors may be dedicated, shared, or "chained" to each module. Chaining involves allowing a bus to pass through one module, connecting with the appropriate circuits on that module, whereas when it exits that particular module it may then enter another module or reach termination. Examples of such chaining of conductors are provided and described in additional detail in FIGS. 29, 32, and 35 below. Fourth, common control and address signal conductors may be dedicated, shared, or chained to each module. Fifth, data signal conductors may be terminated transmission lines or terminated stubs on each module. For this discussion, transmission lines are understood to represent signal lines that have sufficient lengths such that reflections and other transmission line characteristics must be considered and accounted for in order to assure proper signal transmission over the transmission lines. In contrast, terminated stubs are understood to be of such limited length that the parasitic reflections and other transmission line characteristics associated with such stubs can generally be ignored. Sixth, common control and address signal conductors may be terminated transmission lines or terminated stubs on each module. Permitting the shared address and control signals to be wave-pipelined allows their signaling rate to be increased, thereby increasing the performance of the memory system.

Figure 2:
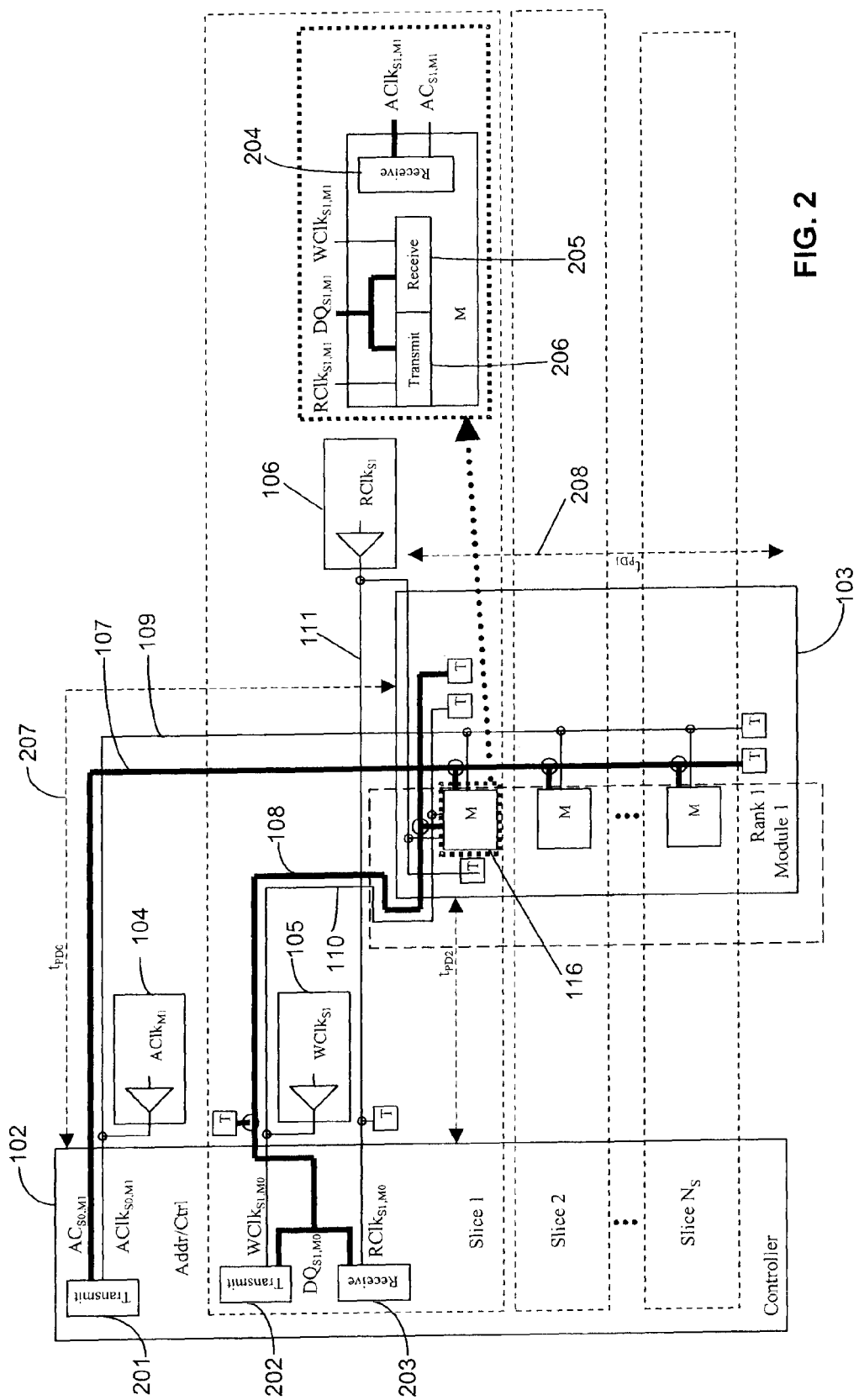
FIG. 2 is a block diagram illustrating clocking details for one slice of a rank of memory components of a memory system such as that illustrated in FIG. 1 in accordance with an embodiment of the invention.

FIG. 2 is a block diagram illustrating clocking details for one slice of a rank of memory components of a memory system such as that illustrated in FIG. 1 in accordance with an embodiment of the invention. The memory controller component 102 includes address transmit block 201, which is coupled to address bus 107 and address clock conductor 109. The memory controller component 102 also includes, on a per-slice basis, data transmit block 202 and data receive block 203, which are coupled to data bus 108. Data transmit block 202 is coupled to write clock conductor 110, and data receive block 203 is coupled to read clock conductor 111.

Within each memory component, such as memory component 116, an address receive block 204, a data receive block 205, and a data transmit block 206 are provided. The address receive block 204 is coupled to address bus 107 and address clock conductor 109. The data receive block 205 is coupled to data bus 108 and write clock conductor 110. The data transmit block 206 is coupled to data bus 108 and read clock conductor 111.

A propagation delay 207, denoted $t_{PD0}$, exists along address bus 107 between memory controller component 102 and memory module 103. A propagation delay 208, denoted $t_{PD1}$, exists along address bus 107 within memory module 103.

The basic topology represented in FIG. 2 has several attributes. It includes a memory controller. It includes a single memory module. It includes a single rank of memory components. It includes a sliced data bus (DQ), with each slice of wires connecting the controller to a memory component. It includes a common address and control bus (Addr/Ctrl or AC) connecting the controller to all the memory components. Source synchronous clock signals flow with data, control, and address signals. Control and address signals are unidirectional and flow from controller to memory components. Data signals are bi-directional and may flow from controller to memory components (write operation) or may flow from memory components to controller (read operation). There may be some control signals with the same topology as data signals, but which flow only from controller to memory components. Such signals may be used for masking write data in write operations, for example. These may be treated as unidirectional data signals for the purpose of this discussion. The data, address, control, and clock wires propagate with low distortion (e.g., along controlled impedance conductors). The data, address, control, and clock wires propagate with low inter-symbol interference (e.g., there is a single termination on unidirectional signals and double termination on bi-directional signals). These attributes are listed to maintain clarity. It should be understood that the invention is not constrained to be practiced with these attributes and may be practiced so as to include other system topologies.

In FIG. 2, there is a two dimensional coordinate system based on the slice number of the data buses and the memory components (S={0, 1, . . . $N_S$}) and the module number (M={0, 1}). Here a slice number of "0" and a module number of '0' refer to the controller. This coordinate system allows signals to be named at different positions on a wire. This coordinate system will also allow expansion to topologies with more than one memory rank or memory module.

FIG. 2 also shows the three clock sources (address clock 104, which generates the AClk signal, write clock 105, which generates the WClk signal, and read clock 106, which generates the RClk signal) which generate the clocking reference signals for the three types of information transfer. These clock sources each drive a clock wire that is parallel to the signal bus with which it is associated. Preferably, the positioning of the clock sources within the system is such that the physical position on the clock line at which the clock source drives the corresponding clocking signal is proximal to the related driving point for the bus line such that the propagation of the clock for a particular bus generally tracks the propagation of the related information on the associated bus. For example, the positioning of the address clock (AClk clock 104) is preferably close to the physical position where the address signals are driven onto the address bus 107. In such a configuration, the address clock will experience similar delays as it propagates throughout the circuit as those delays experienced by the address signals propagating along a bus that follows generally the same route as the address clock signal line.

The clock signal for each bus is related to the maximum bit rate on the signals of the associated bus. This relationship is typically an integer or integer ratio. For example, the maximum data rate may be twice the frequency of the data clock signals. It is also possible that one or two of the clock sources may be "virtual" clock sources; the three clock sources will be in an integral-fraction-ratio (N/M) relationship with respect to one another, and any of them may be synthesized from either of the other two using phase-locked-loop (PLL) techniques to set the frequency and phase. Virtual clock sources represent a means by which the number of actual clock sources within the circuit can be minimized. For example, a WClk clock might be derived from an address clock (AClk) that is received by a memory device such that the memory device is not required to actually receive a WClk clock from an external source. Thus, although the memory device does not actually receive a unique, individually-generated WClk clock, the WClk clock generated from the AClk clock is functionally equivalent. The phase of a synthesized clock signal will be adjusted so it is the same as if it were generated by a clock source in the positions shown.

Any of the clock signals shown may alternatively be a non-periodic signal (a strobe control signal, for example) which is asserted only when information is present on the associated bus. As was described above with respect to clock sources, the non-periodic signal sources are preferably positioned, in a physical sense, proximal to the appropriate buses to which they correspond such that propagation delays associated with the non-periodic signals generally match those propagation delays of the signals on the buses to which they correspond.

Figure 3:
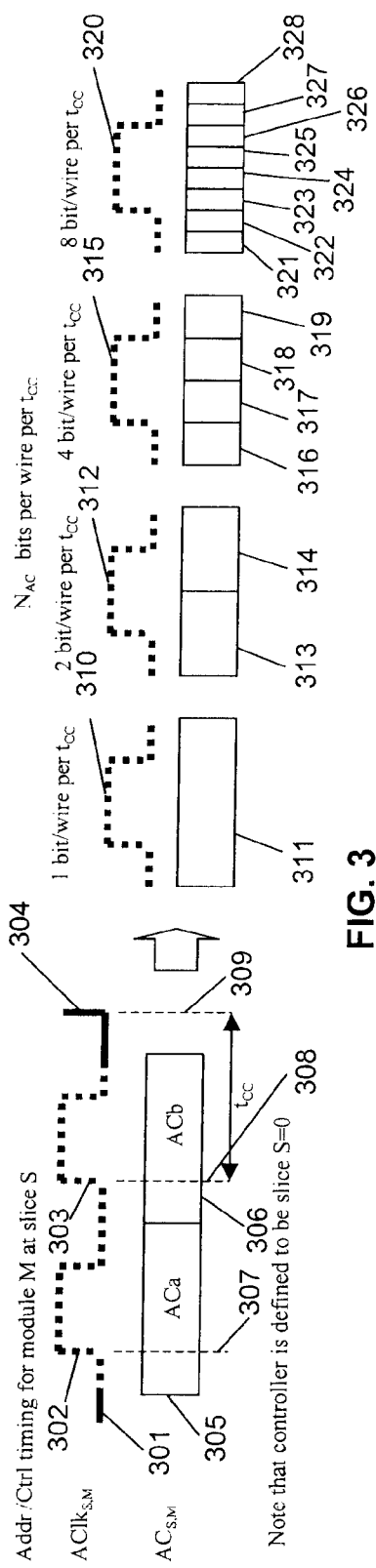
FIG. 3 is a timing diagram illustrating address and control timing notations used in timing diagrams of other Figures.

FIG. 3 is a timing diagram illustrating address and control timing notations used in timing diagrams of other Figures. In FIG. 3, a rising edge 302 of the AClk signal 301 occurs at a time 307 during transmission of address information ACa 305. A rising edge 303 of the AClk signal occurs at a time 308 during transmission of address information ACb 306. Time 308 occurs at a time $t_{CC}$ before the time 309 of the next rising edge 304 of AClk signal 301. The time tCC represents a cycle time of a clock circuit of a memory controller component. Dashed lines in the timing diagrams are used to depict temporal portions of a signal coincident with address information or datum information. For example, the AClk signal 301 includes a temporal portion corresponding to the presence of address information ACa 305 and another temporal portion corresponding to the presence of address information ACb 306. Address information can be transmitted over an address bus as an address signal.

If one bit per wire occurs per $t_{CC}$, address bit 311 is transmitted during cycle 310. If two bits per wire occur per $t_{CC}$, address bits 313 and 314 are transmitted during cycle 312. If four bits per wire occur per $t_{CC}$, address bits 316, 317, 318, and 319 are transmitted during cycle 315. If eight bits per wire occur per $t_{CC}$, address bits 321, 322, 323, 324, 325, 326, 327, and 328 are transmitted during cycle 320. Note that the drive and sample points for each bit window may be delayed or advanced by an offset (up to one bit time, which is $t_{CC}/N_{AC}$), depending upon the driver and sampler circuit techniques used. The parameters $N_{AC}$ and $N_{DQ}$ represent the number of bits per $t_{CC}$ for the address/control and data wires, respectively. In one embodiment, a fixed offset is used. An offset between the drive/sample points and the bit windows should be consistent between the driving component and the sampling component. It is preferable that in a particular system, any offset associated with the drive point for a bus is consistent throughout the entire system. Similarly, any understood sampling offset with respect to the bus should also be consistent. For example, if data is expected to be driven at a point generally corresponding to a rising edge of a related clock signal for one data bus line, that understood offset (or lack thereof) is preferably consistently used for all data lines. Note that the offset associated with driving data onto the bus may be completely different than that associated with sampling data carried by the bus. Thus, continuing with the example above, the sample point for data driven generally coincident with a rising edge may be 180 degrees out of phase with respect to the rising edge such that the valid window of the data is better targeted by the sample point.

Figure 4:
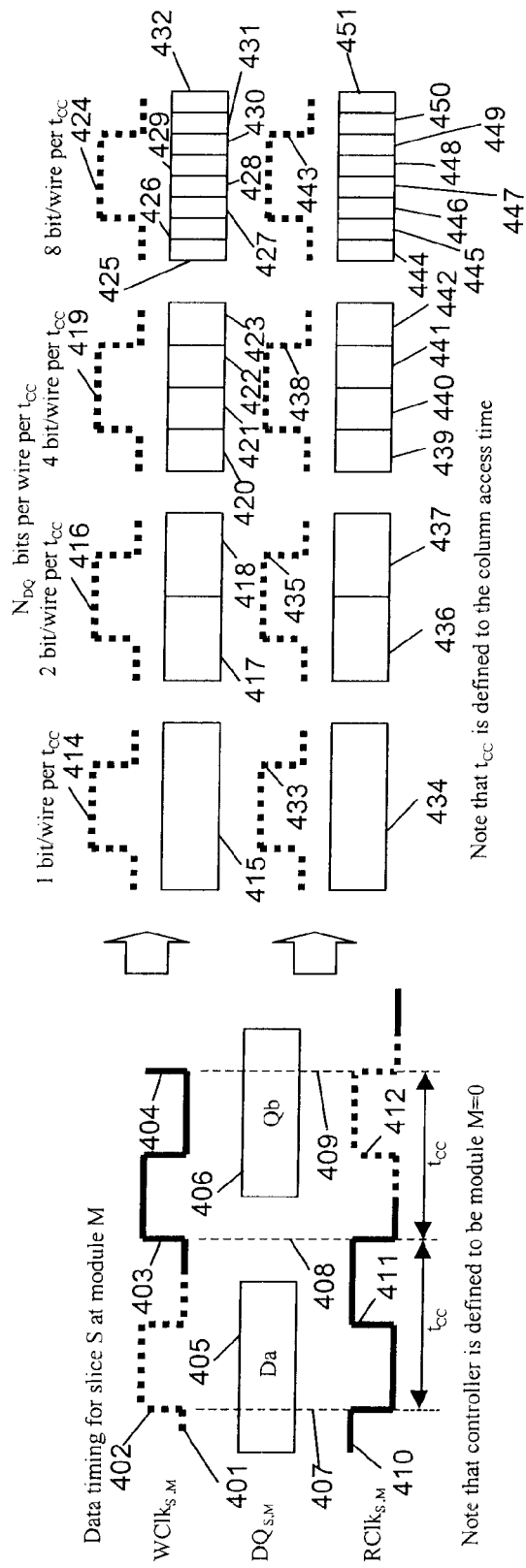
FIG. 4 is a timing diagram illustrating data timing notations used in timing diagrams of other Figures.

FIG. 4 is a timing diagram illustrating data timing notations used in timing diagrams of other Figures. In FIG. 4, a rising edge 402 of the WClk signal 401 occurs at a time 407 during transmission of write datum information Da 405. A rising edge 403 of the WClk signal 401 occurs at a time 408. A rising edge 404 of the WClk signal 401 occurs at a time 409 during transmission of read datum information Qb 406. Time 407 is separated from time 408 by a time $t_{CC}$, and time 408 is separated from time 409 by a time $t_{CC}$. The time $t_{CC}$ represents the duration of a clock cycle. RClk signal 410 includes rising edge 411 and rising edge 412. These rising edges may be used as references to clock cycles of RClk signal 410. For example, transmission of write datum information Da 405 occurs during a clock cycle of RClk signal 410 that includes rising edge 411, and transmission of read datum information Qb 406 occurs during a clock cycle of RClk signal 410 that includes rising edge 412. As is apparent to one of ordinary skill in the art, the clock cycle time associated with the address clock may differ from the clock cycle time associated with the read and/or write clocks.

Write datum information is an element of information being written and can be transmitted over a data bus as a write data signal. Read datum information is an element of information being read and can be transmitted over a data bus as a read data signal. As can be seen, the notation Dx is used to represent write datum information x, while the notation Qy is used to represent read datum information y. Signals, whether address signals, write data signals, read data signals, or other signals can be applied to conductor or bus for a period of time referred to as an element time interval. Such an element time interval can be associated with an event occurring on a conductor or bus that carries a timing signal, where such an event may be referred to as a timing signal event. Examples of such a timing signal include a clock signal, a timing signal derived from another signal or element of information, and any other signal from which timing may be derived. In a memory access operation, the time from when an address signal begins to be applied to an address bus to when a data signal corresponding to that address signal begins to be applied to a data bus can be referred to as an access time interval. If one bit per wire occurs per $t_{CC}$, datum bit 415 is transmitted during cycle 414. If two bits per wire occur per $t_{CC}$, data bits 417 and 418 are transmitted during cycle 416. If four bits per wire occur per $t_{CC}$, data bits 420, 421, 422, and 423 are transmitted during cycle 419. If eight bits per wire occur per $t_{CC}$, data bits 425, 426, 427, 428, 429, 430, 431, and 432 are transmitted during cycle 424. Note that the drive and sample points for each bit window may be delayed or advanced by an offset (up to one bit time, which is $t_{CC}/N_{DQ}$), depending upon the driver and sampler circuit techniques used. In one embodiment, a fixed offset is used. An offset between the drive/sample points and the bit windows should be consistent between the driving component and the sampling component. For example, if the data window is assumed to be positioned such that data will be sampled on the rising edge of the appropriate clock signal at the controller, a similar convention should be used at the memory device such that valid data is assumed to be present at the rising edge of the corresponding clock at that position within the circuit as well.

If one bit per wire occurs per $t_{CC}$, datum bit 434 is transmitted during cycle 433. If two bits per wire occur per $t_{CC}$, data bits 436 and 437 are transmitted during cycle 435. If four bits per wire occur per $t_{CC}$, data bits 439, 440, 441, and 442 are transmitted during cycle 438. If eight bits per wire occur per $t_{CC}$, data bits 444, 445, 446, 447, 448, 449, 450, and 451 are transmitted during cycle 443. Note that the drive and sample points for each bit window may be delayed or advanced by an offset (up to one bit time, which is $t_{CC}/N_{DQ}$), depending upon the driver and sampler circuit techniques used. In one embodiment, a fixed offset is used. An offset between the drive/sample points and the bit windows should be consistent between the driving component and the sampling component. As stated above, it is preferable that in a particular system, any offset associated with the drive point or sampling point for a bus is consistent throughout the entire system.

The column cycle time of the memory component represents the time interval required to perform successive column access operations (reads or writes). In the example shown, the AClk, RClk, and WClk clock signals are shown with a cycle time equal to the column cycle time. As is apparent to one of ordinary skill in the art, the cycle time of the clock signals used in the system may be different from the column cycle time in other embodiments.

Alternatively, any of the clocks could have a cycle time that is different than the column cycle time. The appropriate-speed clock for transmitting or receiving signals on a bus can always be synthesized from the clock that is distributed with the bus as long as there is an integer or integral-fraction-ratio between the distributed clock and the synthesized clock. As mentioned earlier, any of the required clocks can be synthesized from any of the distributed clocks from the other buses.

This discussion will assume a single bit is sampled or driven on each wire during each $t_{CC}$ interval in order to keep the timing diagrams as simple as possible. However, the number of bits that are transmitted on each signal wire during each $t_{CC}$ interval can be varied. The parameters $N_{AC}$ and $N_{DQ}$ represent the number of bits per $t_{CC}$ for the address/control and data wires, respectively. The distributed or synthesized clock is multiplied up to create the appropriate clock edges for driving and sampling the multiple bits per $t_{CC}$. Note that the drive and sample points for each bit window may be delayed or advanced by an offset (up to one bit time, which is $t_{CC}/N_{AC}$ or $t_{CC}/N_{DQ}$), depending upon the driver and sampler circuit techniques used. In one embodiment, a fixed offset is used. An offset between the drive/sample points and the bit windows should be consistent between the driving component and the sampling component. Once again, as stated above, it is preferable that in a particular system, any offset associated with the drive point or sampling point for a bus is consistent throughout the entire system.

Figure 5:
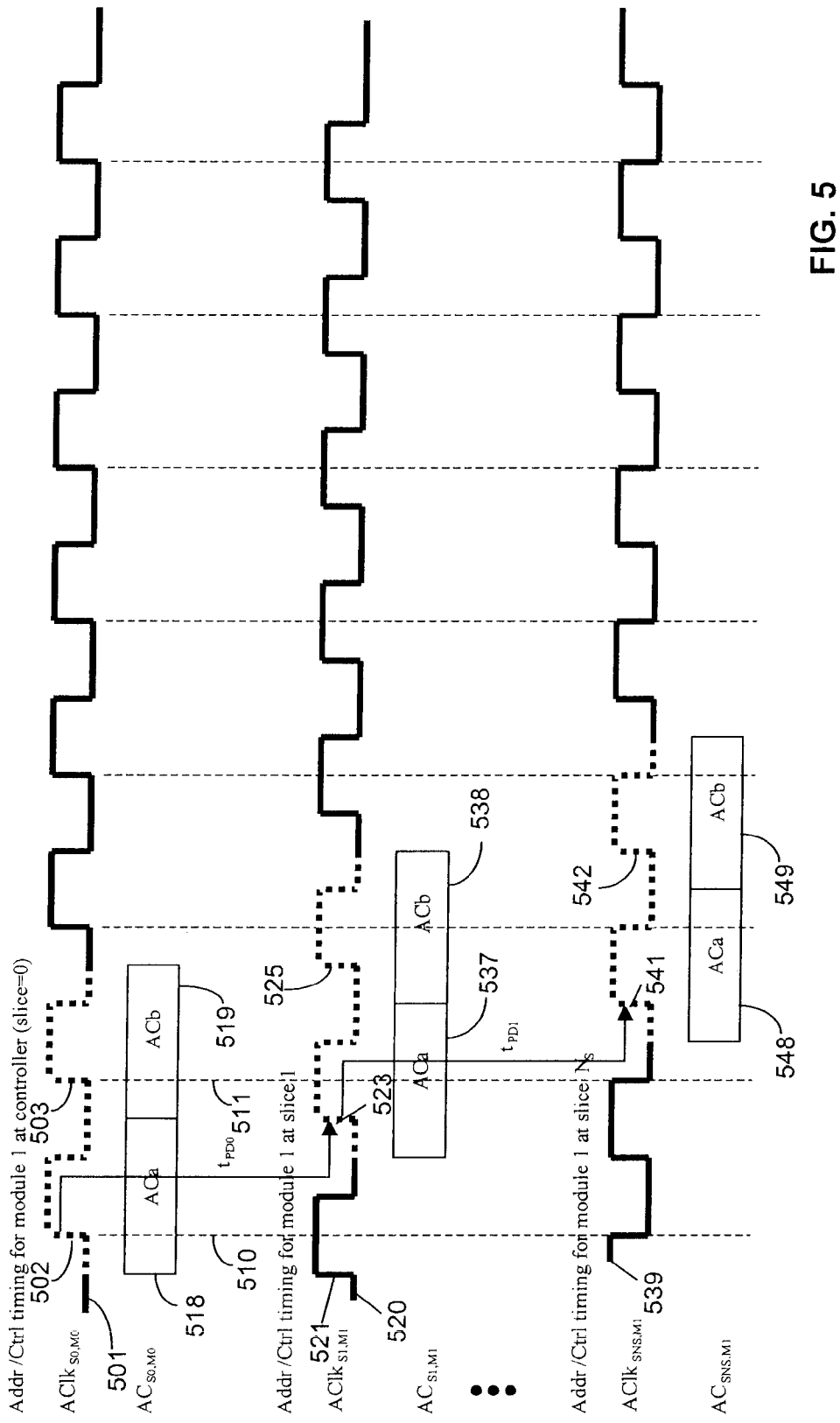
FIG. 5 is a timing diagram illustrating timing of signals communicated over the address and control bus (Addr/Ctrl or $AC_{S,M}$) in accordance with an embodiment of the invention.

FIG. 5 is a timing diagram illustrating timing of signals communicated over the address and control bus (Addr/Ctrl or $AC_{S,M}$) in accordance with an embodiment of the invention. This bus is accompanied by a clock signal $AClk_{S,M}$ which sees essentially the same wire path as the bus. The subscripts (S,M) indicate the bus or clock signal at a particular module M or a particular slice S. The controller is defined to be slice zero.

The waveform for AClk clock signal 501 depicts the timing of the AClk clock signal at the memory controller component. A rising edge 502 of AClk clock signal 501 occurs at time 510 and is associated with the transmission of address information ACa 518. A rising edge 503 of AClk clock signal 501 occurs at time 511 and is associated with the transmission of address information ACb 519.

The waveform for AClk clock signal 520 depicts the timing of the AClk clock signal at a memory component located at slice one. The AClk signal 520 is delayed a delay of by $t_{PD0}$ from signal 501. For example, the rising edge 523 of signal 520 is delayed by a delay of $t_{PD0}$ from edge 502 of signal 501. The address information ACa 537 is associated with the rising edge 523 of signal 520. The address information ACb 538 is associated with the rising edge 525 of signal 520.

The waveform for AClk clock signal 539 depicts the timing of the AClk clock signal at the memory component located at slice $N_S$. The AClk signal 539 is delayed by a delay of $t_{PD1}$ from signal 520. For example, the rising edge 541 of signal 539 is delayed by a delay of $t_{PD1}$ from edge 523 of signal 520. The address information ACa 548 is associated with the rising edge 541 of signal 539. The address information ACb 549 is associated with the rising edge 542 of signal 539.

The clock signal AClk is shown with a cycle time that corresponds to the column cycle time. As previously mentioned, it could also have a shorter cycle time as long as the frequency and phase are constrained to allow the controller and memory components to generate the necessary timing points for sampling and driving the information on the bus Likewise, the bus is shown with a single bit per wire transmitted per $t_{CC}$ interval. As previously mentioned, more than one bit could be transferred in each $t_{CC}$ interval since the controller and memory components are able to generate the necessary timing points for sampling and driving the information on the bus. Note that the actual drive point for the bus (the point at which data signals, address signals, and/or control signals are applied to the bus) may have an offset from what is shown (relative to the rising and falling edges of the clock)—this will depend upon the design of the transmit and receive circuits in the controller and memory components. In one embodiment, a fixed offset is used. An offset between the drive/sample points and the bit windows should be consistent between the driving component and the sampling component. As reiterated above, it is preferable that in a particular system, any offset associated with the drive point or sampling point for a bus is consistent throughout the entire system. It should be noted in FIG. 5 is that there is a delay $t_{PD0}$ in the clock $AClk_{S,M}$ and bus $AC_{S,M}$ as they propagate from the controller to the first slice. As indicated, AClk signal 520 is shifted in time and space from AClk signal 501. Also note that there is a second delay $t_{PD1}$ in the clock $AClk_{S,M}$ and bus $AC_{S,M}$ as they propagate from the first slice to the last slice $N_S$. There will be a delay of $t_{PD1}/(N_S-1)$ as the clock and bus travel between each slice. Note that this calculation assumes generally equal spacing between the slices, and, if such physical characteristics are not present in the system, the delay will not conform to this formula. Thus, as indicated, AClk signal 539 is shifted in time and space from AClk signal 520. As a result, the $N_S$ memory components will each be sampling the address and control bus at slightly different points in time.

Figure 6:
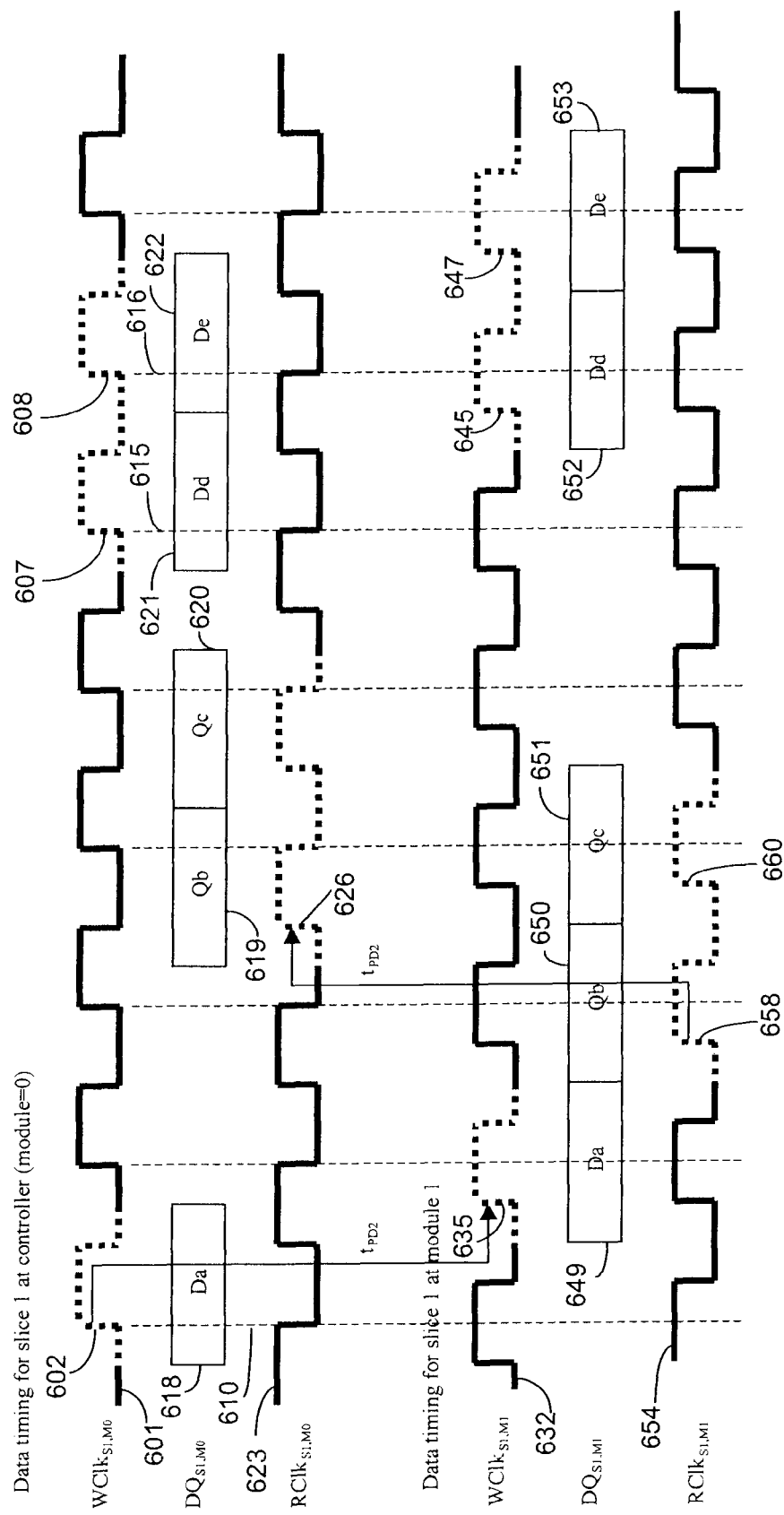
FIG. 6 is a timing diagram illustrating timing of signals communicated over the data bus ($DQ_{S,M}$) in accordance with an embodiment of the invention.

FIG. 6 is a timing diagram illustrating timing of signals communicated over the data bus ($DQ_{S,M}$) in accordance with an embodiment of the invention. This bus is accompanied by two clock signals $RClk_{S,M}$ and $WClk_{S,M}$ which see essentially the same wire path as the bus. The subscripts (S,M) indicate the bus or clock signal at a particular module M and a particular slice S. The controller is defined to be module zero. The two clocks travel in opposite directions. $WClk_{S,M}$ accompanies the write data which is transmitted by the controller and received by the memory components. $RClk_{S,M}$ accompanies the read data which is transmitted by the memory components and received by the controller. In the example described, read data (denoted by "Q") and write data (denoted by "D") do not simultaneously occupy the data bus. Note that in other embodiments, this may not be the case where additional circuitry is provided to allow for additive signaling such that multiple waveforms carried over the same conductor can be distinguished and resolved.

The waveform of WClk clock signal 601 depicts the timing of the WClk clock signal at the memory controller component. Rising edge 602 occurs at time 610 and is associated with write datum information Da 618, which is present at slice one of module zero. Rising edge 607 occurs at time 615, and is associated with write datum information Dd 621, which is present at slice one of module zero. Rising edge 608 occurs at time 616, and is associated with write datum De 622, which is present at slice one of module zero.

The waveform of RClk clock signal 623 depicts the timing of the RClk clock signal at the memory controller component (at module zero). Rising edge 626 is associated with read datum information Qb 619, which is present at the memory controller component (at slice one of module zero). Rising edge is associated with read datum information Qc 620, which is present at the memory controller component (at slice one of module zero).

The waveform of WClk clock signal 632 depicts the timing of the WClk clock signal at the memory component at slice one of module one. Rising edge 635 is associated with write datum information Da 649, which is present at slice one of module one. Rising edge 645 is associated with write datum information Dd 652, which is present at slice one of module one. Rising edge 647 is associated with write datum information De 653, which is present at slice one of module one.

The waveform of RClk clock signal 654 depicts the timing of the RClk clock signal at the memory component of slice one of module one. Rising edge 658 is associated with read datum information Qb 650, which is present at slice one of module one. Rising edge 660 is associated with read datum information Qd 651, which is present at slice one of module one.

The clock signals are shown with a cycle time that corresponds to $t_{CC}$. As previously mentioned, they could also have a shorter cycle time as long as the frequency and phase are constrained to allow the controller and memory components to generate the necessary timing points for sampling and driving the information on the bus. Likewise, the bus is shown with a single bit per wire. As previously mentioned, more than one bit could be transferred in each $t_{CC}$ interval since the controller and memory components are able to generate the necessary timing points for sampling and driving the information on the bus. Note that the actual drive point for the bus may have an offset from what is shown (relative to the rising and falling edges of the clock)—this will depend upon the design of the transmit and receive circuits in the controller and memory components. In one embodiment, a fixed offset is used. An offset between the drive/sample points and the bit windows should be consistent between the driving component and the sampling component.

It should be noted in FIG. 6 is that there is a delay $t_{PD2}$ in the clock $WClk_{S,M}$ and bus $DQ_{S,M}$ (with the write data) as they propagate from the controller to the slices of the first module. Thus, WClk clock signal 632 is shifted in time and space from WClk clock signal 601. Also note that there is an approximately equal delay $t_{PD2}$ in the clock $RClk_{S,M}$ and bus $DQ_{S,M}$ (with the read data) as they propagate from the slices of the first module to the controller. Thus, RClk clock signal 623 is shifted in time and space from RClk clock signal 654.

As a result, the controller and the memory components must have their transmit logic coordinated so that they do not attempt to drive write data and read data at the same time. The example in FIG. 6 shows a sequence in which there are write-read-read-write-write transfers. It can be seen that read-read and write-write transfers may be made in successive $t_{CC}$ intervals, since the data in both intervals is traveling in the same direction. However, gaps (bubbles) are inserted at the write-read and read-write transitions so that a driver only turns on when the data driven in the previous interval is no longer on the bus (it has been absorbed by the termination components at either end of the bus wires).

In FIG. 6, the read clock $RClk_{S,M}$ and the write clock $WClk_{S,M}$ are in phase at each memory component (however the relative phase of these clocks at each memory component will be different from the other memory components—this will be shown later when the overall system timing is discussed). Note that this choice of phase matching is one of several possible alternatives that could have been used. Some of the other alternatives will be described later.

As a result of matching the read and write clocks at each memory component (slice), the $t_{CC}$ intervals with read data Qb 650 will appear to immediately follow the $t_{CC}$ intervals with write data Da 649 at the memory components (bottom of FIG. 6), but there will be a gap of $2*t_{PD2}$ between the read data interval Qb 619 and write data interval Da 618 at the controller (top of FIG. 6). There will be a second gap of $(2*t_{CC}-2*t_{PD2})$ between the read data Qc 620 and the write data Dd 621 at the controller. There will be a gap of $(2*t_{CC})$ between the read data Qc 651 and the write data Dd 621. Note that the sum of the gaps at the memory components and the controller will be $2*t_{CC}$.

The overall system timing will be described next. The example system phase aligns the $AClk_{S,M}$, $RClk_{S,M}$, and $WClk_{S,M}$ clocks at each memory component (the slice number varies from one through $N_S$, and the module number is fixed at one). This has the benefit of allowing each memory component to operate in a single clock domain, avoiding any domain crossing issues. Because the address and control clock $AClk_{S,M}$ flows past each memory component, the clock domain of each memory slice will be offset slightly from the adjacent slices. The cost of this phasing decision is that the controller must adjust the read and write clocks for each slice to different phase values—this means there will be $1+(2*N_S)$ clock domains in the controller, and crossing between these domains efficiently becomes very important. Other phase constraints are possible and will be discussed later.

Figure 7:
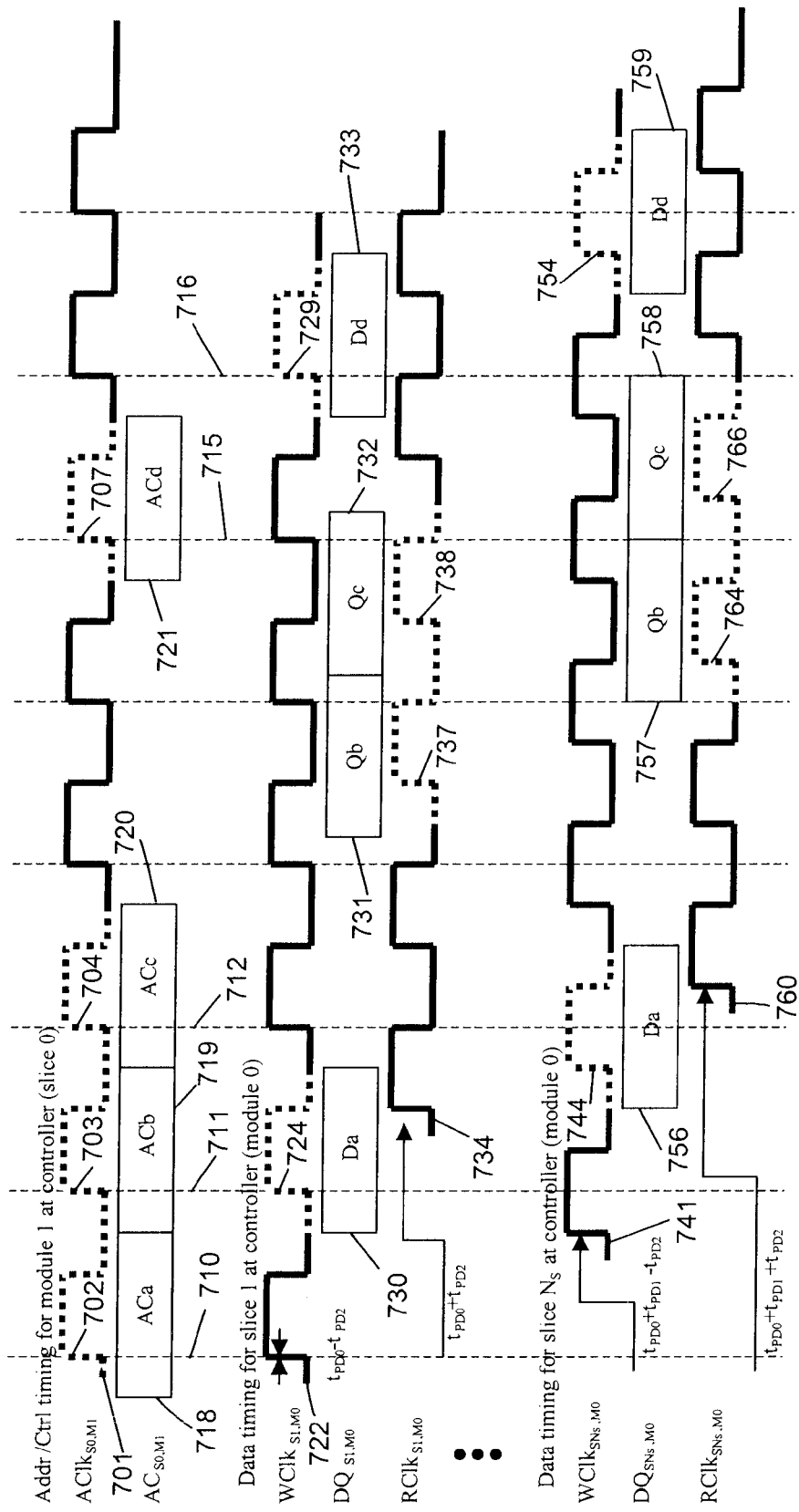
FIG. 7 is a timing diagram illustrating system timing at a memory controller component in accordance with an embodiment of the invention.

FIG. 7 is a timing diagram illustrating system timing at a memory controller component in accordance with an embodiment of the invention. As before, the controller sends a write-read-read-write sequence of operations on the control and address bus $AClk_{S0,M1}$. The Da write datum information is sent on the $WClk_{S1,M0}$ and $WClk_{SNs,M0}$ buses so that it will preferably arrive at the memory component of each slice one cycle after the address and control information ACa. This is done by making the phase of the $WClk_{S1,M0}$ clock generally equivalent to $(t_{PD0}-t_{PD2})$ relative to the phase of the $AClk_{S0,M1}$ clock (positive means later, negative means earlier). This will cause them to be in phase at the memory component of the first slice of the first module Likewise, the phase of the $WClk_{SNs,M0}$ clock is adjusted to be generally equivalent to $(t_{PD0}+t_{PD1}-t_{PD2})$ relative to the phase of the $AClk_{S0,M1}$ clock. Note that some tolerance is preferably built into the system such that the phase adjustment of the clock to approximate the propagation delays can vary slightly from the desired adjustment while still allowing for successful system operation.

In a similar fashion, the phase of the $RClk_{S1,M0}$ clock is adjusted to be generally equivalent to $(t_{PD0}+t_{PD2})$ relative to the phase of the $AClk_{S0,M1}$ clock. This will cause them to be in phase at the memory component of the last slice of the first module. Likewise, the phase of the $RClk_{SNs,M0}$ clock is adjusted according to the expression $(t_{PD0}+t_{PD1}+t_{PD2})$ relative to the phase of the $AClk_{S0,M1}$ clock to cause the $RClk_{SNs,M0}$ clock and the $AClk_{S0,M1}$ clock to be in phase at the memory component of the last slice of the first module.

The waveform of AClk clock signal 701 depicts the AClk clock signal at the memory controller component, which is denoted as being at slice zero. Rising edge 702 occurs at time 710 and is associated with address information ACa 718, which is present at slice zero. Rising edge 703 occurs at time 711 and is associated with address information ACb 719, which is present at slice zero. Rising edge 704 occurs at time 712 and is associated with address information ACc 720, which is present at slice zero. Rising edge 707 occurs at time 715 and is associated with address information ACd 721, which is present at slice zero.

The waveform of WClk clock signal 722 depicts the WClk clock signal for the memory component at slice one when that WClk clock signal is present at the memory controller component at module zero. Rising edge 724 occurs at time 711 and is associated with write datum information Da 730, which is present. Rising edge 729 occurs at time 716 and is associated with write datum information Dd 733, which is present.

The waveform of RClk clock signal 734 depicts the RClk clock signal for the memory component of slice one when that RClk clock signal is present at the memory controller component at module zero. Rising edge 737 is associated with read datum information Qb 731, which is present. Rising edge 738 is associated with read datum information Qc 732, which is present.

The waveform of WClk clock signal 741 depicts the WClk clock signal for the memory component at slice $N_S$ when that WClk clock signal is present at the memory controller component at module zero. Write datum information Da 756 is associated with edge 744 of signal 741. Write datum information Dd 759 is associated with edge 754 of signal 741.

The waveform of RClk clock signal 760 depicts the RClk clock signal for the memory component at slice $N_S$ when that RClk clock signal is present at the memory controller component at module zero. Read datum information Qb 757 is associated with edge 764 of signal 760. Read datum information Qc 758 is associated with edge 766 of signal 760.

Figure 8:
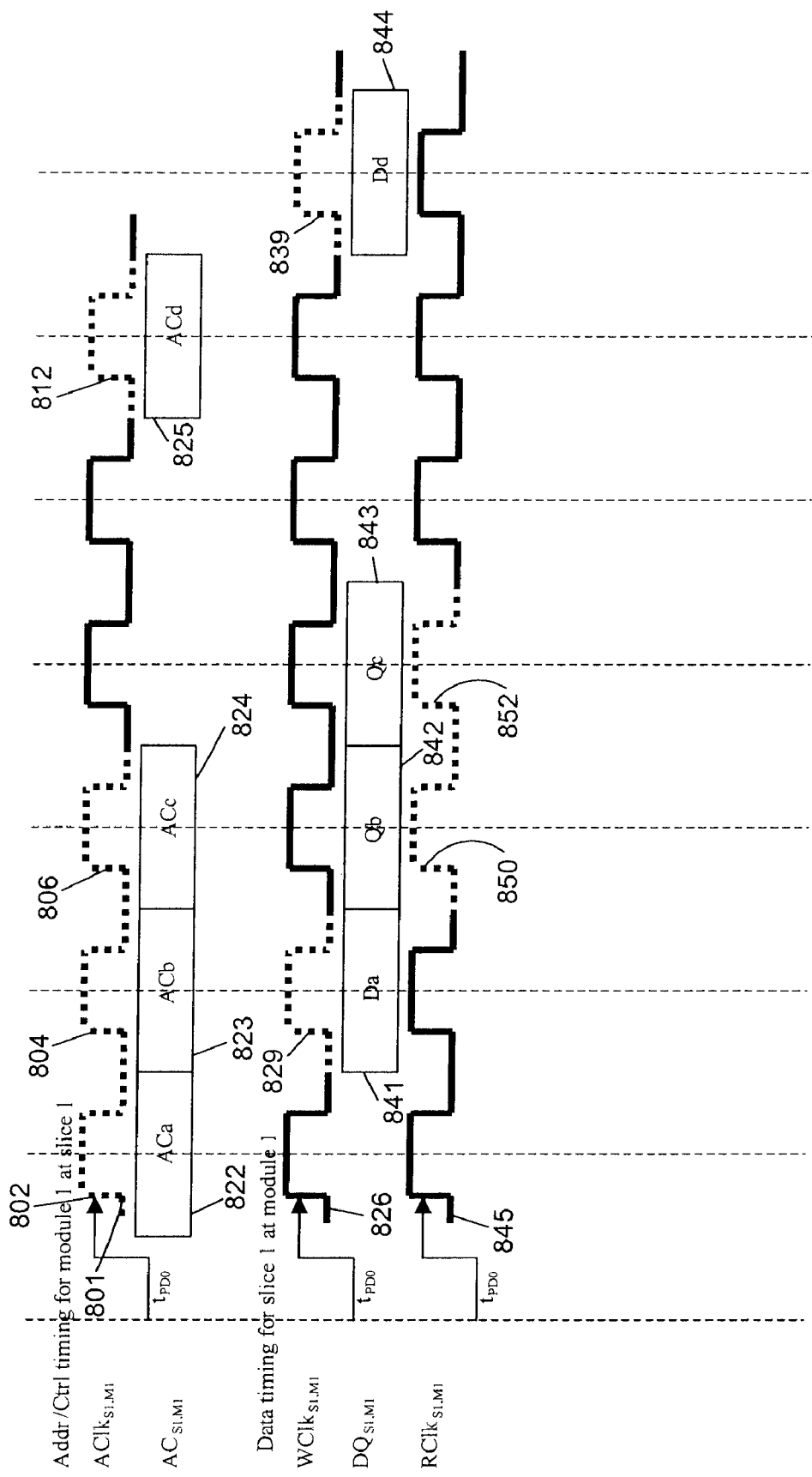
FIG. 8 is a timing diagram illustrating alignment of clocks $AClk_{S1,M1}$, $WClk_{S1,M1}$, and $RClk_{S1,M1}$ at the memory component in slice 1 of rank 1 in accordance with an embodiment of the invention.

FIG. 8 is a timing diagram illustrating alignment of clocks $AClk_{S1,M1}$, $WClk_{S1,M1}$, and $RClk_{S1,M1}$ at the memory component in slice 1 of rank 1 in accordance with an embodiment of the invention. All three clocks are delayed by $t_{PD0}$ relative to the $AClk_{S0,M1}$ clock produced at the controller.

The waveform of AClk clock signal 801 depicts the AClk clock signal for the memory component at slice one of module one. Address information ACa 822 is associated with edge 802 of signal 801. Address information ACb 823 is associated with edge 804 of signal 801. Address information ACc 824 is associated with edge 806 of signal 801. Address information ACd 825 associated with edge 812 of signal 801.

The waveform of WClk clock signal 826 depicts the WClk clock signal for the memory component at slice one of module one. Write datum information Da 841 is associated with edge 829 of signal 826. Write datum information Dd 844 is associated with edge 839 of signal 826.

The waveform of RClk clock signal 845 depicts the RClk clock signal for the memory component at slice one of module one. Read datum information Qb 842 is associated with edge 850 of signal 845. Read datum information Qc 843 is associated with edge 852 of signal 845.

Figure 9:
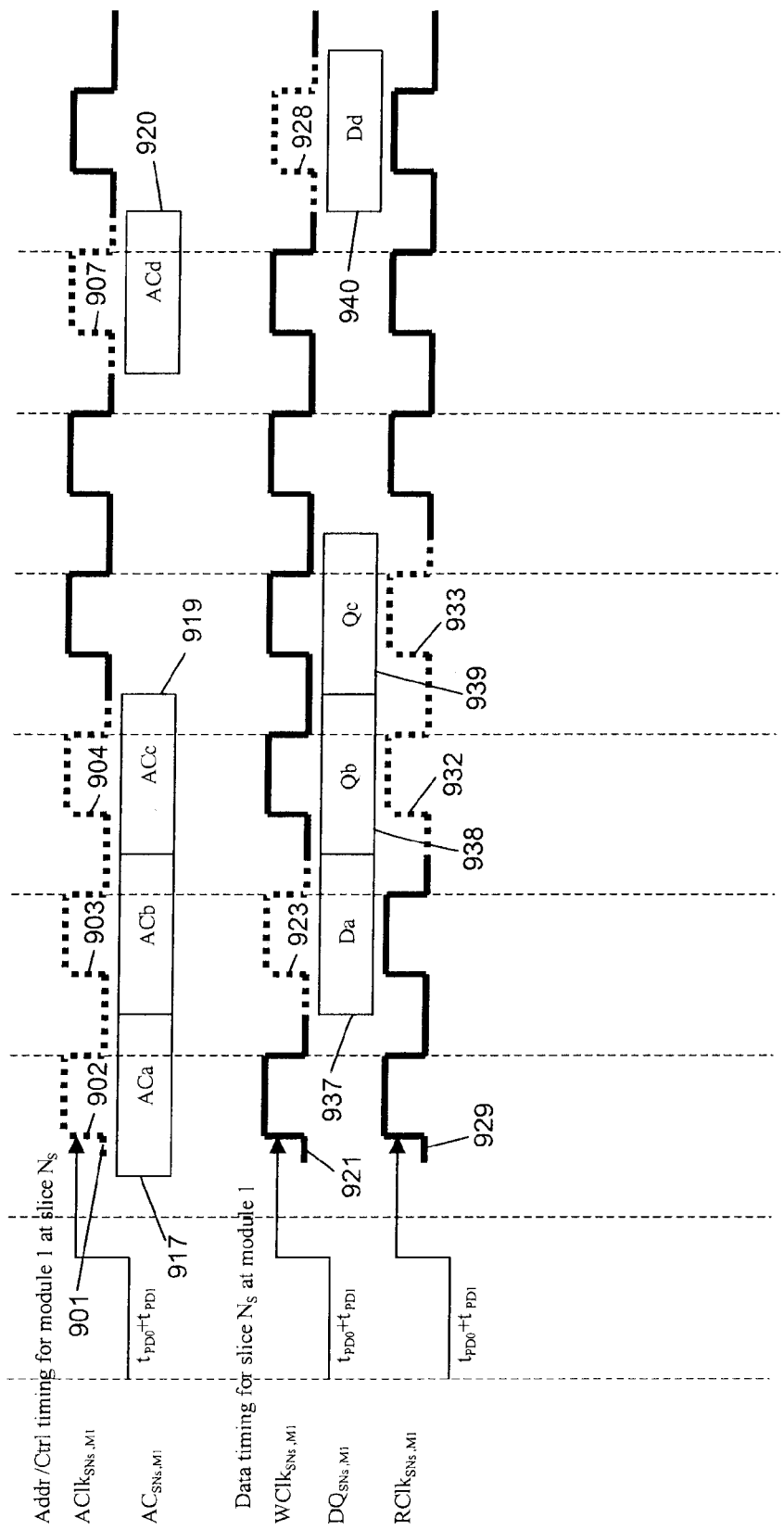
FIG. 9 is a timing diagram illustrating alignment of clocks $AClk_{SNs,M1}$, $WClk_{SNs,M1}$, and $RClk_{SNs,M1}$ at the memory component in slice $N_S$ of rank 1 in accordance with an embodiment of the invention.

FIG. 9 is a timing diagram illustrating alignment of clocks AClk$_{SNs,M1}$, WClk$_{SNs,M1}$, and RClk$_{SNs,M1}$ at the memory component in slice N$_S$ of rank one of module one in accordance with an embodiment of the invention. All three clocks are delayed by ($t_{PD0}$+$t_{PD1}$) relative to the AClk$_{S0,M1}$ clock produced at the controller.

The waveform of AClk clock signal 901 depicts the AClk clock signal for the memory component at slice N$_S$ at module one. Rising edge 902 of signal 901 is associated with address information ACa 917. Rising edge 903 of signal 901 is associated with address information ACb. Rising edge 904 of signal 901 is associated with address information ACc 919. Rising edge 907 of signal 901 is associated with address information ACd 920.

The waveform of WClk clock signal 921 depicts the WClk clock signal for the memory component at slice N$_S$ at module one. Rising edge 923 of signal 921 is associated with write datum information Da 937. Rising edge 928 of signal 921 is associated with write datum information Dd 940.

The waveform RClk clock signal 929 depicts the RClk clock signal for the memory component at slice N$_S$ at module one. Rising edge 932 of signal 929 is associated with read datum information Qb 938. Rising edge 933 of signal 929 is associated with read datum information Qc 939.

Note that in both FIGS. 8 and 9 there is a one $t_{CC}$ cycle delay between the address/control information (ACa 917 of FIG. 9, for example) and the read or write information that accompanies it (Da 937 of FIG. 9 in this example) when viewed at each memory component. This may be different for other technologies; i.e. there may be a longer access delay. In general, the access delay for the write operation at the memory component should be equal or approximately equal to the access delay for the read operation in order to maximize the utilization of the data bus.

FIGS. 10 through 18 illustrate the details of an exemplary system which uses address and data timing relationships which are nearly identical to what has been described in FIGS. 5 through 9. In particular, all three clocks are in-phase on each memory component. This example system has several differences relative to this earlier description, however. First, two bits per wire are applied per $t_{CC}$ interval on the AC bus (address/control bus, or simply address bus). Second, eight bits per wire are applied per $t_{CC}$ interval on the DQ bus. Third, a clock signal accompanies the AC bus, but the read and write clocks for the DQ bus are synthesized from the clock for the AC bus.

Figure 10:
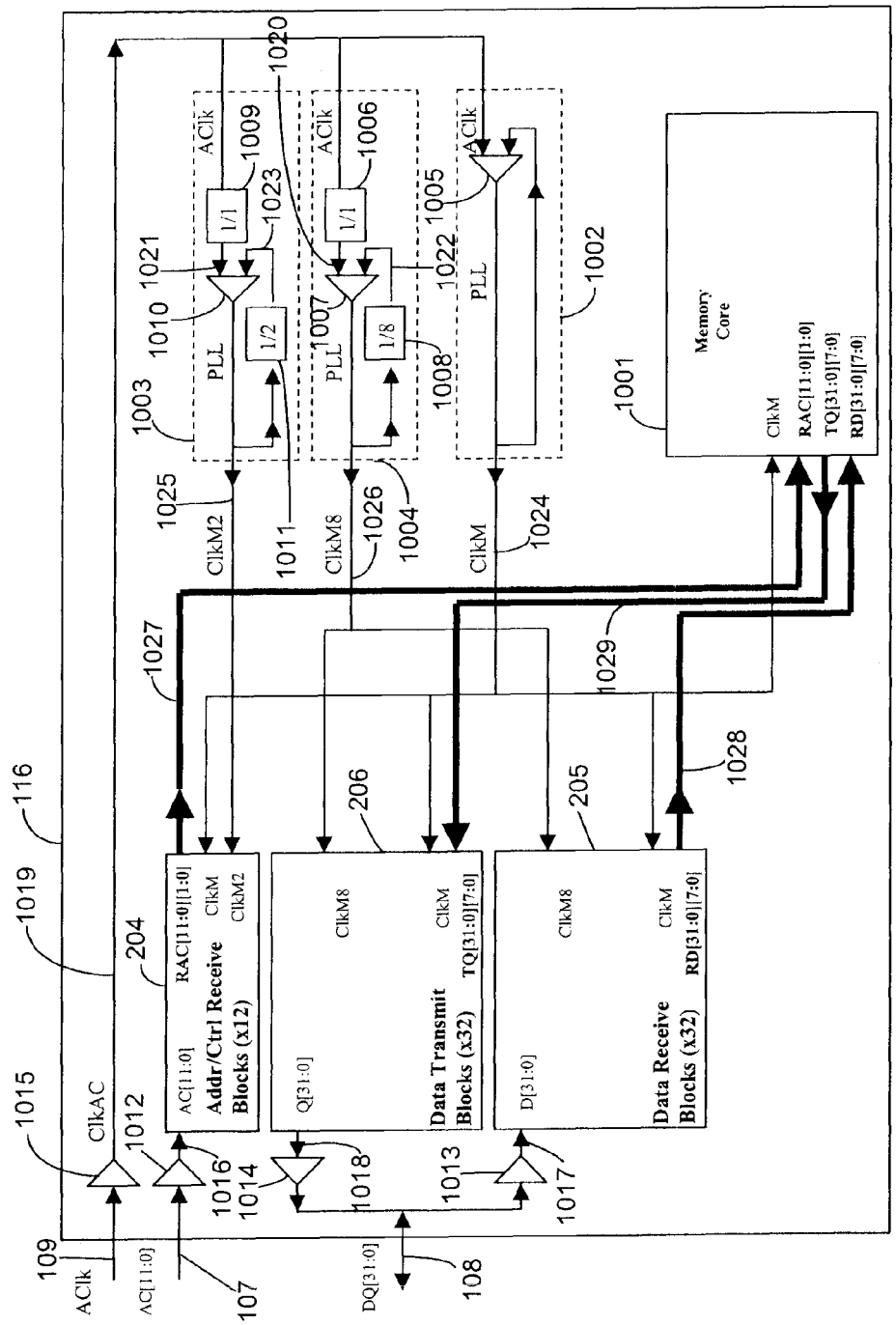
FIG. 10 is a block diagram illustrating further details for one slice of a rank of memory components of a memory system such as that illustrated in FIG. 1 in accordance with an embodiment of the invention.

FIG. 10 is a block diagram illustrating further details for one memory rank (one or more slices of memory components) of a memory system such as that illustrated in FIG. 1 in accordance with an embodiment of the invention. The internal blocks of the memory components making up this rank are connected to the external AC or DQ buses. The serialized data on these external buses is converted to or from parallel form on internal buses which connect to the memory core (the arrays of storage cells used to hold information for the system). Note that FIG. 10 shows all 32 bits of the DQ bus connecting to the memory rank—these 32 bits are divided up into multiple, equal-sized slices and each slice of the bus is routed to one memory component. Thus, slices are defined based on portions of the DQ bus routed to separate memory components. The example shown in FIG. 10 illustrates a memory component, or device, that supports the entire set of 32 data bits for a particular example system. In other embodiments, such a system may include two memory devices, where each memory device supports half of the 32 data bits. Thus, each of these memory devices would include the appropriate data transmit blocks, data receive blocks, and apportionment of memory core such that they can individually support the portion of the overall data bus for which they are responsible. Note that the number of data bits need not be 32, but may be varied.

The AClk signal is the clock which accompanies the AC bus. It is received and is used as a frequency and phase reference for all the clock signals generated by the memory component. The other clocks are ClkM2, ClkM8, and ClkM. These are, respectively, 2×, 8×, and 1× the frequency of AClk. The rising edges of all clocks are aligned (no phase offset). The frequency and phase adjustment is typically done with some type of phase-locked-loop (PLL) circuit, although other techniques are also possible. A variety of different suitable PLL circuits are well known in the art. The feedback loop includes the skew of the clock drivers needed to distribute the various clocks to the receive and transmit blocks as well as the memory core. The memory core is assumed to operate in the ClkM domain.

Memory component 116 comprises memory core 1001, PLL 1002, PLL 1003, and PLL 1004. AClk clock signal 109 is received by buffer 1015, which provides clock signal 1019 to PLLs 1002, 1003, and 1004. Various PLL designs are well known in the art, however some PLLs implemented in the example embodiments described herein require minor customization to allow for the specific functionality desired. Therefore, in some embodiments described herein, the particular operation of the various blocks within the PLL are described in additional detail. Thus, although some of the PLL constructs included in the example embodiments described herein are not described in extreme detail, it is apparent to one of ordinary skill in the art that the general objectives to be achieved by such PLLs are readily recognizable through a variety of circuits well known to those skilled in the art. PLL 1002 includes phase comparator and voltage controlled oscillator (VCO) 1005. PLL 1002 provides clock signal ClkM 1024 to memory core 1001, address/control receive block 204, data receive block 205, and data transmit block 206.

PLL 1003 comprises prescaler 1009, phase comparator and VCO 1010, and divider 1011. Prescaler 1009 may be implemented as a frequency divider (such as that used to implement divider 1011) and provides a compensating delay with no frequency division necessary. Prescaler 1009 provides a signal 1021 to phase comparator and VCO 1010. The phase comparator in VCO 1010 is represented as a triangle having two inputs and an output. The functionality of the phase comparator 1010 is preferably configured such that it produces an output signal that ensures that the phase of the feedback signal 1023, which is one of its inputs, is generally phase aligned with a reference signal 1021. This convention is preferably applicable to similar structures included in other PLLs described herein. Divider 1011 provides a feedback signal 1023 to phase comparator and VCO 1010. PLL 1003 provides clock signal ClkM2 1025 to address/control receive block 204.

PLL 1004 comprises prescaler 1006, phase comparator and VCO 1007, and divider 1008. Prescaler 1006 may be implemented as a frequency divider (such as that used to implement divider 1011) and provides a compensating delay with no frequency division necessary. Prescaler 1006 provides a signal 1020 to phase comparator and VCO 1007. Divider 1008 provides a feedback signal 1022 to phase comparator and VCO 1007. PLL 1004 provides clock signal ClkM8 1026 to data receive block 205 and data transmit block 206.

The address bus 107 is coupled via buffers 1012 to address/control receive block 204 via coupling 1016. The data outputs 1018 of data transmit block 206 are coupled to data bus 108 via buffers 1014. The data bus 108 is coupled to data inputs 1017 of data receive block 205 via buffers 1013.

Address/control receive block 204 provides address information to the memory core 1001 via internal address bus 1027. Data receive blocks 205 provides write data to memory core 1001 via internal write data bus 1028. Memory core 1001 provides read data to data transmit blocks 206 via internal read data bus 1029.

Figure 11:
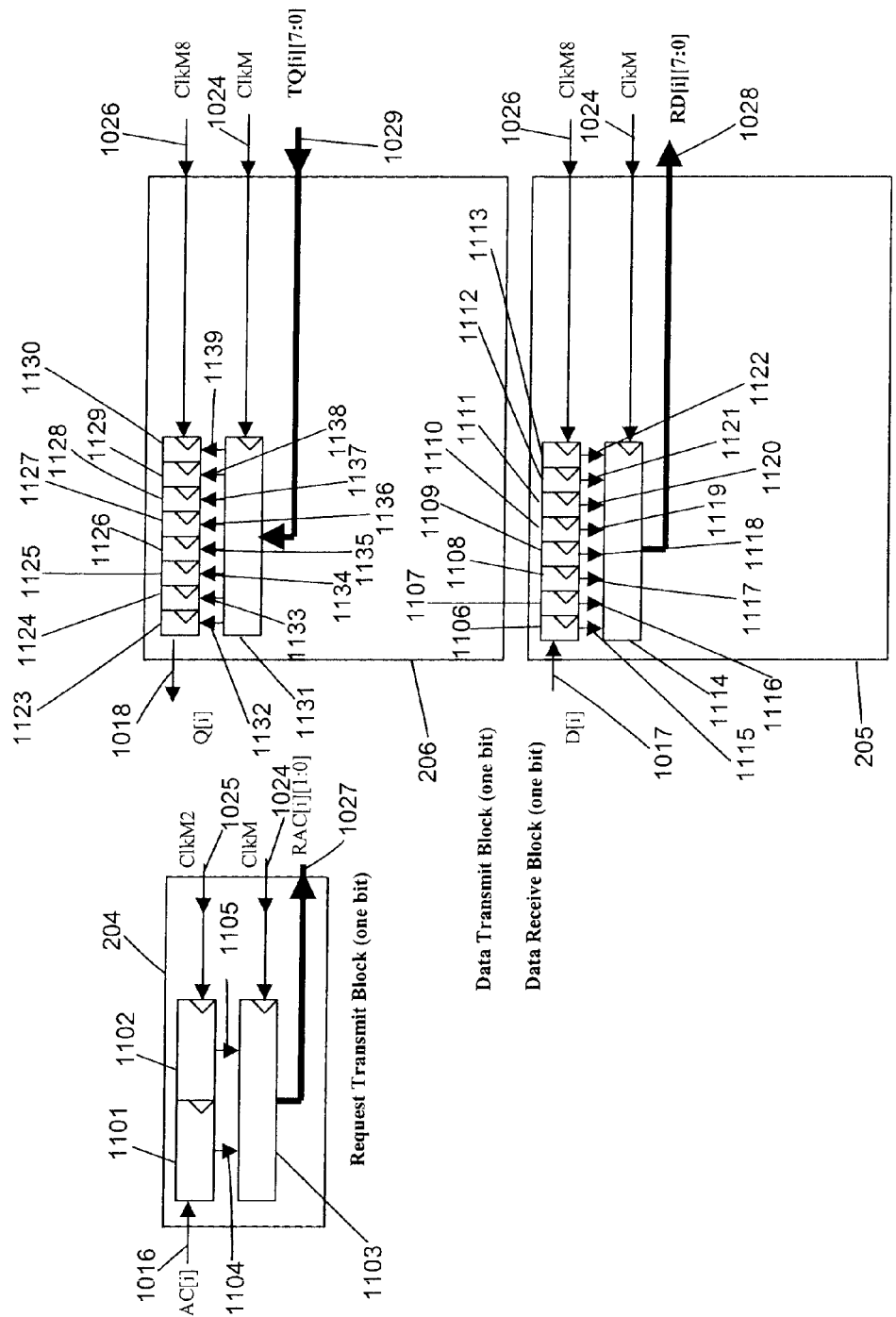
FIG. 11 is a block diagram illustrating the clocking elements of one slice of a rank of the memory components of a memory system such as that illustrated in FIG. 1 in accordance with an embodiment of the invention.

FIG. 11 is a block diagram illustrating logic used in the receive and transmit blocks of FIG. 10 in accordance with an embodiment of the invention. In this Figure, for clarity, the elements for only one bit of each bus are illustrated. It is understood that such elements may be replicated for each bit of the bus.

Address/control receive block 204 comprises registers 1101, 1102, and 1103. Address bus conductor 1016 is coupled to registers 1101 and 1102, which together form a shift register, and which are clocked by ClkM2 clock signal 1025 and coupled to register 1103 via couplings 1104 and 1105, respectively. Register 1103 is clocked by ClkM clock signal 1024 and provides address/control information to internal address bus 1027. The representation of registers 1101 and 1102 in FIG. 11 is preferably understood to imply that they form a shift register such that data entering register 1101 during one cycle is transferred into register 1102 during the subsequent cycle as new data enters register 1101. In the particular embodiment shown in FIG. 11, the movement of data is controlled by the clock signal ClkM2 1025. Thus, if clock ClkM2 1025 operates at twice the frequency of clock ClkM 1024, the receive block 204 generally operates as a serial-to-parallel shift register, where two consecutive serial bits are grouped together in a two-bit parallel format before being output onto signal lines RAC 1027. Thus, other similar representations in the figures where a number of registers are grouped together in a similar configuration preferably are understood to include the interconnections required to allow data to be serially shifted along the path formed by the registers. Examples include the registers 1123-1130 included in transmit block 206 and the registers 1106-1113 included in receive block 205. As a result, the serial information on the input 1016 is converted to parallel form on the output 1027.

Data receive block 205 comprises registers 1106, 1107, 1108, 1109, 1110, 1111, 1112, 1113, and 1114. Data input 1017 is coupled to registers 1106, 1107, 1108, 1109, 1110, 1111, 1112, and 1113, which are clocked by ClkM8 clock signal 1026 and coupled to register 1114 via couplings 1115, 1116, 1117, 1118, 1119, 1120, 1121, and 1122, respectively. Register 1114 is clocked by ClkM clock signal 1024 and provides write data to internal write data bus 1028. As a result, the serial information on the input 1017 is converted to parallel form on the output 1028.

Data transmit block 206 comprises registers 1123, 1124, 1125, 1126, 1127, 1128, 1129, 1130, and 1131. Read data from internal read data bus 1029 is provided to register 1131, which is clocked by ClkM clock 1024 and coupled to registers 1123, 1124, 1125, 1126, 1127, 1128, 1129, and 1130 via couplings 1132, 1133, 1134, 1135, 1136, 1137, 1138, and 1139. Registers 1123, 1124, 1125, 1126, 1127, 1128, 1129, and 1130 are clocked by ClkM8 clock 1026 and provide data output 1018. As a result, the parallel information on the input 1029 is converted to serial form on the output 1018.

Shown are the register elements needed to sample the address/control and write data, and to drive the read data. It is assumed in this example that two bits are transferred per address/control (AC[i]) wire in each $t_{CC}$ interval, and that eight bits are transferred per read data (Q[i]) wire or write data (D[i]) wire in each $t_{CC}$ interval. In addition to the primary clock ClkM (with a cycle time of $t_{CC}$), there are two other aligned clocks that are generated. There is ClkM2 (with a cycle time of $t_{CC}/2$) and ClkM8 (with a cycle time of $t_{CC}/8$). These higher frequency clocks shift information in to or out from the memory component. Once in each $t_{CC}$ interval the serial data is transferred to or from a parallel register clocked by ClkM.

Note that ClkM2 and ClkM8 clocks are frequency locked and phase locked to the ClkM clock. The exact phase alignment of the two higher frequency clocks will depend upon the circuit implementation of the driver and sampler logic. There may be small offsets to account for driver or sampler delay. There may also be small offsets to account for the exact position of the bit valid windows on the AC and DQ buses relative to the ClkM clock.

Note also that in the memory component, the ClkM2 or ClkM8 clocks could be replaced by two or eight clocks each with a cycle time of $t_{CC}$, but offset in phase in equal increments across the entire $t_{CC}$ interval. The serial register, which in transmit block 204 includes registers 1101-1102, in transmit block 206 includes registers 1123-1130, and in data receive block 205 includes registers 1106-1113, would be replaced by a block of two or eight registers, each register loaded with a different clock signal so that the bit windows on the AC and DQ buses are properly sampled or driven. For example, in the transmit block 204, two individual registers would be included, where one register is clocked by a first clock signal having a particular phase and the second register is clocked by a different clock signal having a different phase, where the phase relationship between these two clock signals is understood such that the equivalent serial-to-parallel conversion can be achieved as that described in detail above. Another possibility is to use level-sensitive storage elements (latches) instead of edge sensitive storage elements (registers) so that the rising and falling edges of a clock signal cause different storage elements to be loaded.

Regardless of how the serialization is implemented, there are multiple bit windows per $t_{CC}$ interval on each wire, and multiple clock edges per $t_{CC}$ interval are created in the memory component in order to properly drive and sample these bit windows.

Figure 12:
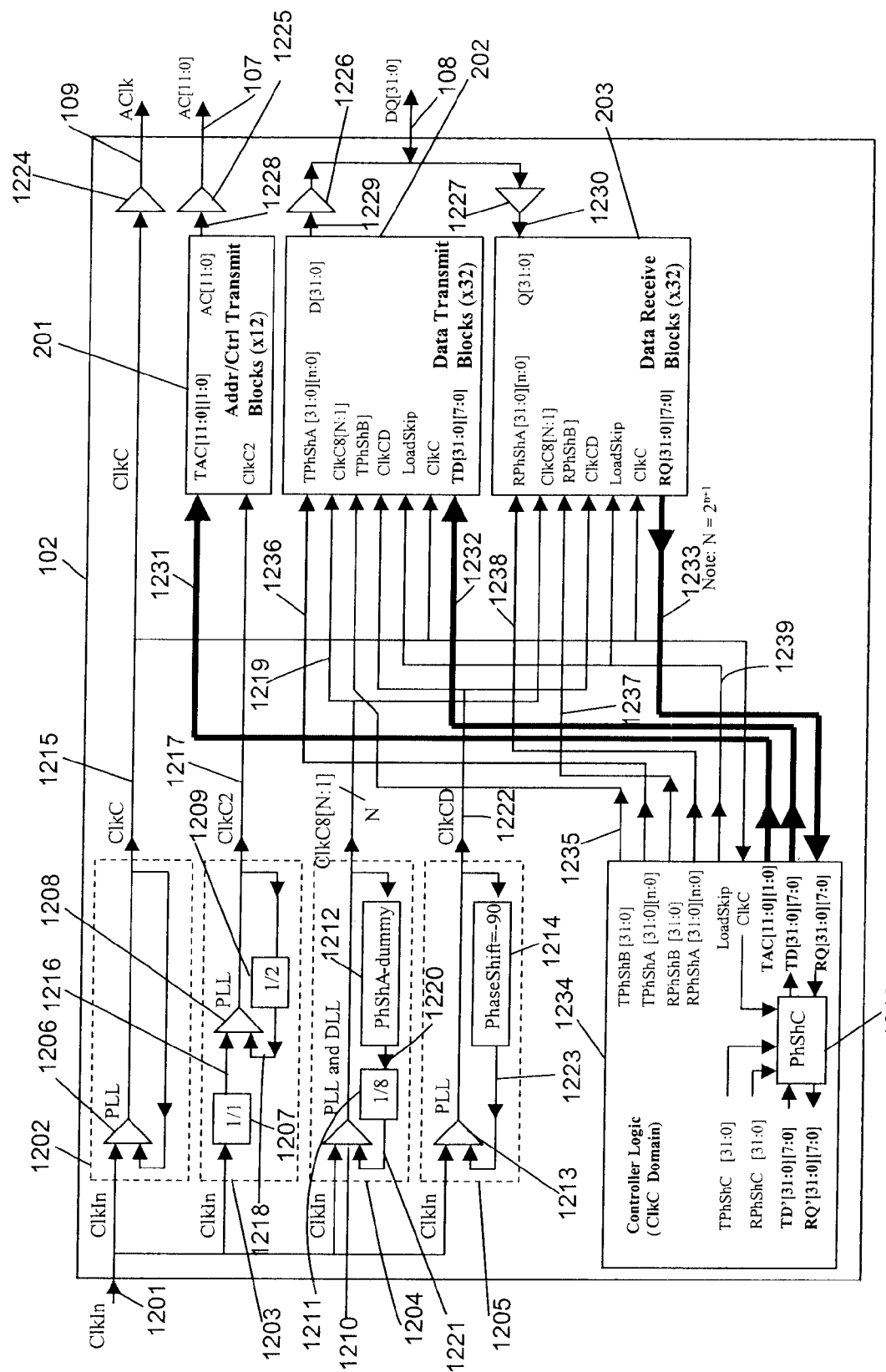
FIG. 12 is a block diagram illustrating details for the memory controller component of a memory system such as that illustrated in FIG. 1 in accordance with an embodiment of the invention.

FIG. 12 is a block diagram illustrating details for the memory controller component of a memory system such as that illustrated in FIG. 1 in accordance with an embodiment of the invention. The memory controller component 102 comprises PLLs 1202, 1203, 1204, and 1205, address/control transmit blocks 201, data transmit blocks 202, data receive blocks 203, and controller logic core 1234. PLL 1202 comprises phase comparator and VCO 1206. PLL 1202 receives ClkIn clock signal 1201 and provides ClkC clock signal 1215 to controller logic core 1234 and to buffer 1224, which outputs AClk clock signal 109.

PLL 1203 comprises prescaler 1207, phase comparator and VCO 1208, and divider 1209. Prescaler 1207 may be implemented as a frequency divider and provides a compensating delay with no frequency division necessary. Prescaler 1207 receives ClkIn clock signal 1201 and provides signal 1216 to phase comparator and VCO 1208. Divider 1209 provides feedback signal 1218 to phase comparator and VCO 1208, which provides ClkC2 clock output 1217 to address/control transmit blocks 201.

PLL 1204 comprises phase comparator and VCO 1210, dummy phase offset selector 1212, and divider 1211. Dummy phase offset selector 1212 inserts an amount of delay to mimic the delay inherent in a phase offset selector and provides signal 1220 to divider 1211, which provides feedback signal 1221 to phase comparator and VCO 1210. Phase comparator and VCO 1210 receives ClkIn clock input 1201 and provides ClkC8 clock output 1219 to data transmit blocks 202 and data receive blocks 203.

PLL 1205 comprises phase shifting circuit 1214 and phase comparator and VCO 1213. Phase shifting circuit 1214 provides feedback signal 1223 to phase comparator and VCO 1213. Phase comparator and VCO 1213 receives ClkIn clock signal 1201 and provides ClkCD clock signal 1222 to data transmit blocks 202 and data receive blocks 203.

Controller logic core 1234 provides TPhShB signals 1235 and TPhShA signals 1236 to data transmit blocks 202. Controller logic core 1234 provides RPhShB signals 1237 and RPhShA signals 1238 to data receive blocks 203. Controller logic core 1234 provides LoadSkip signal 1239 to data transmit blocks 202 and data receive blocks 203. Controller logic core 1234 comprises PhShC block 1240. Functionality of the controller logic 1234 is discussed in additional detail with respect to FIG. 17 below.

Controller logic core 1234 provides address/control information to address/control transmit blocks 201 via internal address bus 1231. Controller logic core 1234 provides write data to data transmit blocks 1232 via internal write data bus 1232. Controller logic core 1234 receives read data from data receive blocks 203 via internal read data bus 1233.

Address/control transmit blocks 201 are coupled via output 1228 to buffers 1225, which drive AC bus 107. Data transmit blocks 202 provide outputs 1229 to buffers 1226, which drive DQ bus 108. Buffers 1227 couple DQ bus 108 to inputs 1230 of data receive blocks 203.

Each of address/control transmit blocks 201 is connected to the AC bus, and each of blocks 202 and 203 is connected to the DQ bus. The serialized data on these external buses is converted to or from parallel from internal buses which connect to the rest of the controller logic. The rest of the controller is assumed to operate in the ClkC clock domain.

In the embodiment shown, the ClkIn signal is the master clock for the whole memory subsystem. It is received and used as a frequency and phase reference for all the clock signals used by the controller. The other clocks are ClkC2, ClkC8, ClkC, and ClkCD. These are, respectively, 2×, 8×, 1×, and 1× the frequency of ClkIn. ClkC will have no phase offset relative to ClkIn, and ClkCD will be delayed by 90 degrees. ClkC2 has every other rising edge aligned with a rising edge of ClkIn.

Every eighth ClkC8 rising edge is aligned with a rising edge of ClkIn except for an offset which compensates for the delay of a frequency divider and phase offset selector in the transmit and receive blocks. There are "N" additional ClkC8 signals (ClkC8[N:1]) which are phase-shifted relative to the ClkC8 signal. These other ClkC8 phases are used to synthesize the transmit and receive clock domains needed to communicate with the memory components.

The frequency and phase adjustment is typically done with some type of phase-locked-loop (PLL) circuit, although other techniques are also possible. The feedback loop of the PLL circuit includes the skew of the clock drivers needed to distribute the various clocks to the receive and transmit blocks as well as the rest of the controller logic.

Figure 13:
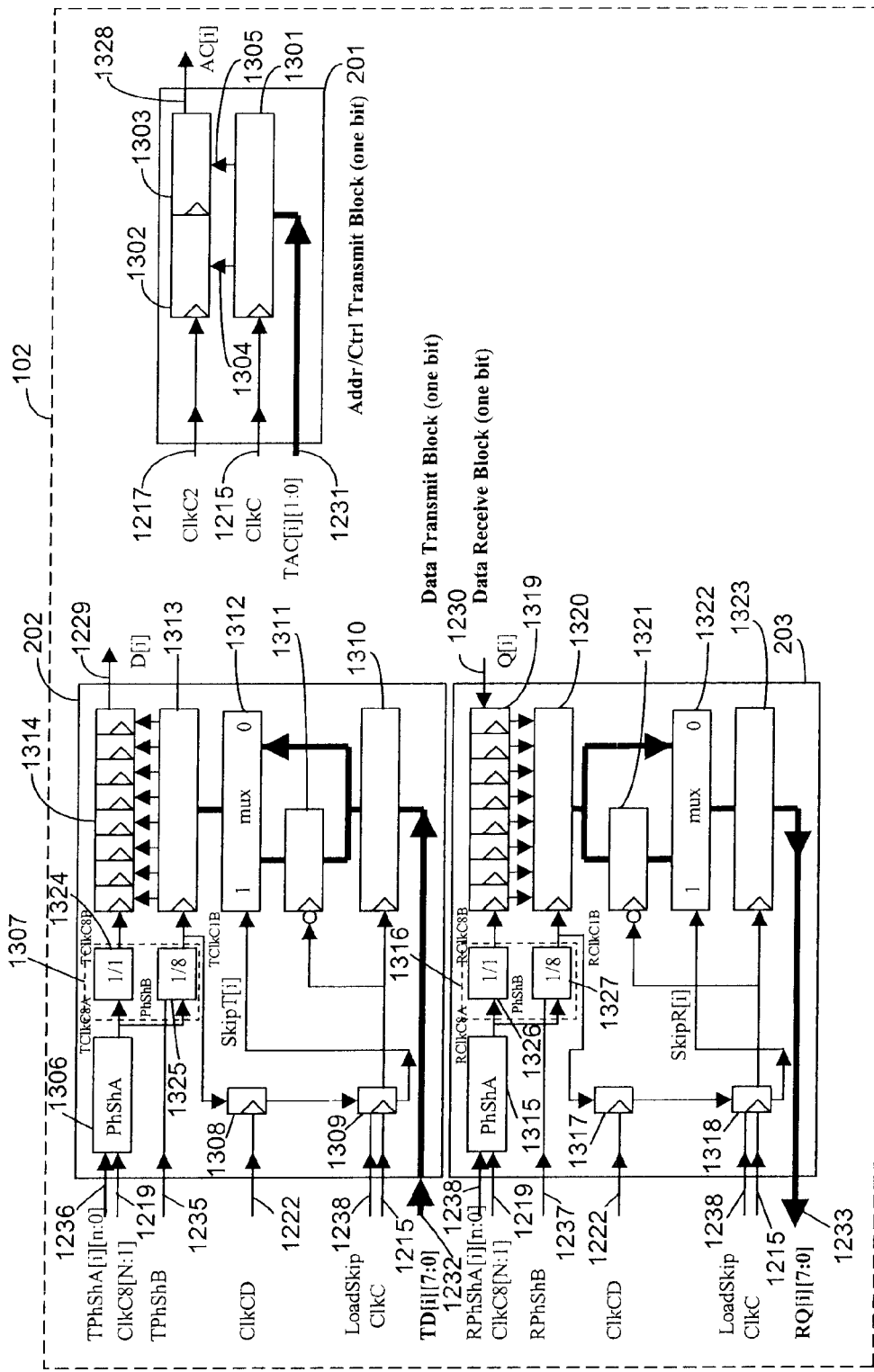
FIG. 13 is a block diagram illustrating the clocking elements of a memory controller component of a memory system such as that illustrated in FIG. 1 in accordance with an embodiment of the invention.

FIG. 13 is a block diagram illustrating the logic used in the receive and transmit blocks of FIG. 12 in accordance with an embodiment of the invention. Memory controller component 102 comprises address/control transmit blocks 201, data transmit blocks 202, and data receive blocks 203. For clarity, the elements for only one bit are illustrated. It is understood that such elements may be replicated for each bit of the buses.

Address/control transmit blocks 201 comprise register 1301 and registers 1302 and 1303. Internal address bus 1231 is coupled to register 1301, which is clocked by ClkC clock 1215 and provides outputs to registers 1302 and 1303 via couplings 1304 and 1305, respectively. Registers 1302 and 1303 are clocked by ClkC2 clock 1217 and provide output 1328 to the AC bus. As a result, the parallel information on the internal address bus 1231 is converted to serial form on the output 1228. Additional functional description of the address/control transmit blocks 201 is provided with respect to FIG. 13 below.

Generally, the data transmit blocks 202 and data receive blocks 203 shown in FIG. 13 serve the function of performing serial-to-parallel or parallel-to-serial conversion of data (the type of conversion depending upon the direction of the data flow). Such blocks are similar to those present within the memory devices, however in the case of the transmit and receive blocks included in the controller in this particular system, additional circuitry is required in order to obtain the appropriate clocking signals required to perform these serial-to-parallel and parallel-to-serial conversions. In the memory devices of this example, such clock adjustment circuitry is not required, as the clocks are understood to be phase aligned within the memory devices. However, within the controller such phase alignment cannot be guaranteed due to the assumption within the system that phase alignment within the memory devices will possibly cause phase mismatching in other portions of the system due to the physical positioning of the memory devices with respect to the controller. Thus, a memory device positioned a first distance from the controller will have a different set of characteristic delays with respect to signals communicated with the controller than a second memory device positioned at a second position. As such, individual clock adjustment circuitry would be required for such memory devices within the controller such that the controller is assured of properly capturing read data provided by each of the memory devices and to allow for the controller to properly drive write data intended to be received by each of the memory devices.

Within the transmit block 202, data for transmission is received over the TD bus 1232 in parallel format. This data is loaded into the register 1310 based on the clock ClkC signal 1215. Once loaded in the register 1310, the data is either directly passed through the multiplexer 1312 to the register 1313 or caused to be delayed by a half clock cycle by traversing the path through the multiplexer 1312 that includes the register 1311 which is clocked by the falling edge of the ClkC signal. Such circuitry enables the data on the TD bus, which is in the ClkC clock domain, to be successfully transferred into the clock domain needed for its transmission. This clock domain is the TClkC1B clock domain, which has the same frequency as the ClkC clock, but is not necessarily phase aligned to the ClkC clock signal. Similar circuitry is included within the receive block 203 such that data received in the RClkC1B clock domain can be successfully transferred onto the RQ bus that operates in the ClkC clock domain.

Data transmit blocks 202 comprise PhShA block 1306, clock divider circuit 1307, registers 1308, 1309, 1310, 1311, and 1313, multiplexer 1312, and shift register 1314. TPhShA signals 1236 and ClkC8 clock signals 1219 are provided to PhShA block 1306. Additional detail regarding the PhShA block 1306 are provided with respect to FIG. 15 below. Clock divider circuit 1307 comprises 1/1 divider circuit 1324 and 1/8 divider circuit 1325. TPhShB signals 1235 are provided to 1/8 divider circuit 1325. An output of PhShA block 1306 is provided to inputs of 1/1 divider circuit 1324 and 1/8 divider circuit 1325. An output of 1/1 divider circuit 1324 is provided to clock shift register 1314. An output of 1/8 divider circuit 1325 is provided to clock register 1313 and as an input to register 1308.

Register 1308 is clocked by ClkCD clock signal 1222 and provides an output to register 1309. Register 1309 is clocked by ClkC clock signal 1215 and receives LoadSkip signal 1238 to provide an output to multiplexer 1312 and an output to clock registers 1310 and 1311. Register 1310 receives write data from write data bus 1232 and provides an output to register 1311 and multiplexer 1312. Register 1311 provides an output to multiplexer 1312. Multiplexer 1312 provides an output to register 1313. Register 1313 provides parallel outputs to shift register 1314. Shift register 1314 provides output 1229. As a result, the parallel information on the input 1232 is converted to serial form on the output 1229.

Data receive blocks 203 comprise PhShA block 1315, clock dividing circuit 1316, registers 1317, 1318, 1320, 1321, and 1323, shift register 1319, and multiplexer 1322. Clock dividing circuit 1316 comprises 1/1 divider circuit 1326 and 1/8 divider circuit 1327. RPhShA signals 1238 and ClkC8 clock signal 1219 are provided to PhShA block 1315, which provides an output to 1/1 divider circuit 1326 and 1/8 divider circuit 1327. RPhShB signal 1237 is provided to an input of 1/8 divider circuit 1327. The 1/1 divider circuit 1326 provides an output used to clock shift register 1319. The 1/8 divider circuit 1327 provides an output used to clock register 1320 and used as an input to register 1317. Register 1317 is clocked by ClkCD clock signal 1222 and provides an output to register 1318. Register 1318 receives LoadSkip signal 1238 and is clocked by ClkC clock signal 1215, providing an output to multiplexer 1322 and an output used to clock registers 1321 and 1323.

Shift register 1319 receives input 1230 and provides parallel outputs to register 1320. Register 1320 provides an output to register 1321 and to multiplexer 1322. Register 1321 provides an output to multiplexer 1322. Multiplexer 1322 provides an output to register 1323. Register 1323 provides an output to internal read data bus 1233. As a result, the serial information on the input 1230 is converted to parallel form on the output 1233.

Shown are the register and gating elements needed to drive address/control and write data, and to sample the read data. It is assumed in this example that two bits are transferred per address/control (AC[i]) wire in each $t_{CC}$ interval, and that eight bits are transferred per read data (Q[i]) wire or write data (D[i]) wire in each $t_{CC}$ interval. In addition to the primary clock ClkC (with a cycle time of $t_{CC}$), there are two other aligned clocks that are generated. There is ClkC2 (with a cycle time of $t_{CC}/2$) and ClkC8 (with a cycle time of $t_{CC}/8$). These higher frequency clocks shift information in to or out from the controller. Once in every $t_{CC}$ interval the serial data is transferred to or from a parallel register clocked by ClkC.

Note that in the controller, the ClkC2 or ClkC8 clocks can be replaced by two or eight clocks each with a cycle time of $t_{CC}$, but offset in phase in equal increments across the entire $t_{CC}$ interval. In such embodiments, the serial register is replaced by blocks of two or eight registers, where each register is loaded with a different clock signal so that the bit windows on the AC and DQ buses are properly sampled or driven. Another possibility is to use level-sensitive storage elements (latches) instead of edge sensitive storage elements (registers) so that the rising and falling edges of a clock signal cause different storage elements to be loaded.

Regardless of how the serialization is implemented, there will be multiple bit windows per $t_{CC}$ interval on each wire, and many embodiments utilize multiple clock edges per $t_{CC}$ interval in the controller in order to properly drive and sample these bit windows.

FIG. 13 also shows how the controller deals with the fact that the read and write data that is received and transmitted for each slice is in a different clock domain. Since a slice may be as narrow as a single bit, there can be 32 read clock domains and 32 write clock domains simultaneously present in the controller (this example assumes a DQ bus width of 32 bits). Remember that in this example no clocks are transferred with the read and write data, and such clocks are preferably synthesized from a frequency source. The problem of multiple clock domains would still be present even if a clock was transferred with the read and write data. This is because the memory component is the point in the system where all local clocks are preferably in-phase. Other system clocking topologies are described later in this description.

The transmit block for address/control bus (AC) in FIG. 13 uses the ClkC2 and ClkC clocks to perform two-to-one serialization. The ClkC2 clock shifts the serial register 1302, 1304 onto the AC wires 1328. Note the exact phase alignment of the ClkC2 clock depends upon the circuit implementation of the driver logic; there may be a small offset to account for driver delay. There may also be small offsets to account for the exact position of the bit drive window on the AC bus relative to the ClkC clock. For example, if the output drivers have a known delay, the phase of the ClkC2 clock signal may be adjusted such that a portion of the output circuitry begins providing data to the output drivers slightly earlier than the time at which the data is to actually be driven onto an external signal line. The shifting of the phase of the ClkC2 clock signal can thus be used to account for the inherent delay in the output driver such that data is actually presented on the external data line at the desired time. Similarly, adjustments to the phase of the ClkC2 clock signal may also be used to ensure that the positioning of the valid data window for data driven based on the ClkC2 clock signal is optimally placed.

In a similar fashion, the transmit block for write data bus (D) in FIG. 13 uses a phase-delayed ClkC8 clock to perform eight-to-one serialization. The phase-delayed ClkC8 clock shifts the serial register 1314 onto the DQ wires. Note the exact alignment of the phase-delayed ClkC8 clock will depend upon the circuit implementation of the driver logic; there may be a small offset to account for driver delay. There may also be small offsets to account for the exact position of the bit drive window on the DQ bus.

The TphShA[i][n:0] control signals 1236 select the appropriate phase offset relative to the input reference vectors ClkC8[N:1]. A phase offset selector may be implemented using a simple multiplexer, a more elaborate phase interpolator, or other phase offset selection techniques. In one example of a phase interpolator, a first reference vector of less-than-desired phase offset and a second reference vector of greater-than-desired phase offset are selected. A weighting value is applied to combine a portion of the first reference vector with a portion of the second reference vector to yield the desired output phase offset of the TClkC8A clock. Thus, the desired output phase offset of the TClkC8A clock is effectively interpolated from the first and second reference vectors. In one example of a phase multiplexer, the TphShA[i][n:0] control signals 1236 are used to select one of the ClkC8[N:1] clock signals 1219 to pass through to the TClkC8A clock (note that $2^{n+1}$=N). The phase that is used is, in general, different for each transmit slice on the controller. The phase for each slice on the controller is preferably selected during a calibration process during initialization. This process is described in detail later in this description.

The TClkC8A clock passes through 1/8 1325 and 1/1 1324 frequency dividers before clocking the parallel 1313 and serial 1314 registers. Note that the ClkC8[N:1] signals that are distributed have a small phase offset to compensate for the delay of the phase offset selection block (PhShA) 1306 and the frequency divider blocks 1324 and 1325. This offset is generated by a phase-locked-loop circuit and will track out supply voltage and temperature variations.

Even with the transmit phase shift value set correctly (so that the bit windows on the D bus 1229 are driven properly), the phase of the TClkC1B clock used for the parallel register 1313 could be misaligned (there are eight possible combinations of phase). There are several ways of dealing with the problem. The scheme that is used in the embodiment illustrated provides an input TPhShB 1235, such that when this input is pulsed, the phase of the TClkC1B clock will shift by $\frac{1}{8}^{th}$ of a cycle (45 degrees). The initialization software adjusts the phase of this clock until the parallel register loads the serial register at the proper time. This initialization process is described in detail later in this description.

Alternatively, it is also possible to perform the phase adjustment in the ClkC domain when preparing the TD bus 1232 for loading into the transmit block 202. To do so, multiplexers and registers may be used to rotate the write data across ClkC cycle boundaries. A calibration process may be provided at initialization to accommodate the phase of the TClkC1B clock during which the transmit block 202 is powered up.

After the phase shift controls are properly adjusted, the write data can be transmitted onto the D bus from the parallel register 1313. However, the write data still needs to be transferred from the TD bus 1232 in the ClkC 1215 domain into the parallel register 1313 in the TClkC1B domain. This is accomplished with the skip multiplexer 1312. The multiplexer selects between registers that are clocked on the rising 1310 and falling 1311 edges of ClkC. The SkipT value determines which of the multiplexer paths is selected. The SkipT value is determined by sampling the TClkC1B clock by the ClkCD clock 1222. The resulting value is loaded into a register 1309 by the LoadSkip signal 1238 during the initialization routine. This circuitry is described in detail later in this description.

The receive block 203 for the read data Q is shown at the bottom of FIG. 13. The receive block has essentially the same elements as the transmit block that was just discussed, except that the flow of data is reversed. However, the clock domain crossing issues are fundamentally similar.

The RPhShA[i][n:0] control signals 1238 select one of the ClkC8[N:1] clock signals 1219 to pass through to the RClkC8 clock. The phase that is used is, in general, different for each receive slice on the controller. The phase is selected during a calibration process during initialization. This process is described in detail later in this description.

The RClkC8A clock passes through 1/8 1327 and 1/1 1326 frequency dividers before clocking the parallel 1320 and serial 1319 registers. Note that the ClkC8[N:1] signals 1219 that are distributed have a small phase offset to compensate for the delay of the phase offset selection block (PhShA) 1315 and the frequency divider blocks 1326 and 1327. This offset is generated by a phase-locked-loop circuit and will track out supply voltage and temperature variations.

Even with the receive phase shift value set correctly (so that the bit windows on the Q bus are sampled properly), the phase of the RClkC1B clock used for the parallel register 1320 could be mismatched (there are eight possible combinations of phase). There are several ways of dealing with the problem. The scheme that is used in the embodiment illustrated provides an input RPhShB 1237, such that when this input is pulsed, the phase of the RClkC1B clock will shift by $\frac{1}{8}^{th}$ of a cycle (45 degrees). The initialization software adjusts the phase of this clock until the parallel register 1320 loads the serial register 1319 at the proper time. This initialization process is described in detail later in this description.

A skip multiplexer similar to that described for the transmit circuit is used to move between the RClkC1B clock domain and the ClkC clock domain. After the phase shift controls are properly adjusted, the read data can be received from the Q bus 1230 and loaded into the parallel register 1320. However, the read data still needs to be transferred from the parallel register 1320 in the RClkC1B domain into the register 1323 in the ClkC 1215 domain. This is accomplished with the skip multiplexer 1322. The multiplexer can insert or not insert a register 1321 that is clocked on the negative edge of ClkC in between registers that are clocked on the rising edges of RClkC1B 1320 and ClkC 1323. The SkipR value determines which of the multiplexer paths is selected. The SkipR value is determined by sampling the RClkC1B clock by the ClkCD clock 1222. The resulting value is loaded into a register 1318 by the LoadSkip signal 1238 during the initialization routine. This circuitry is described in detail later in this description.

Figure 14:
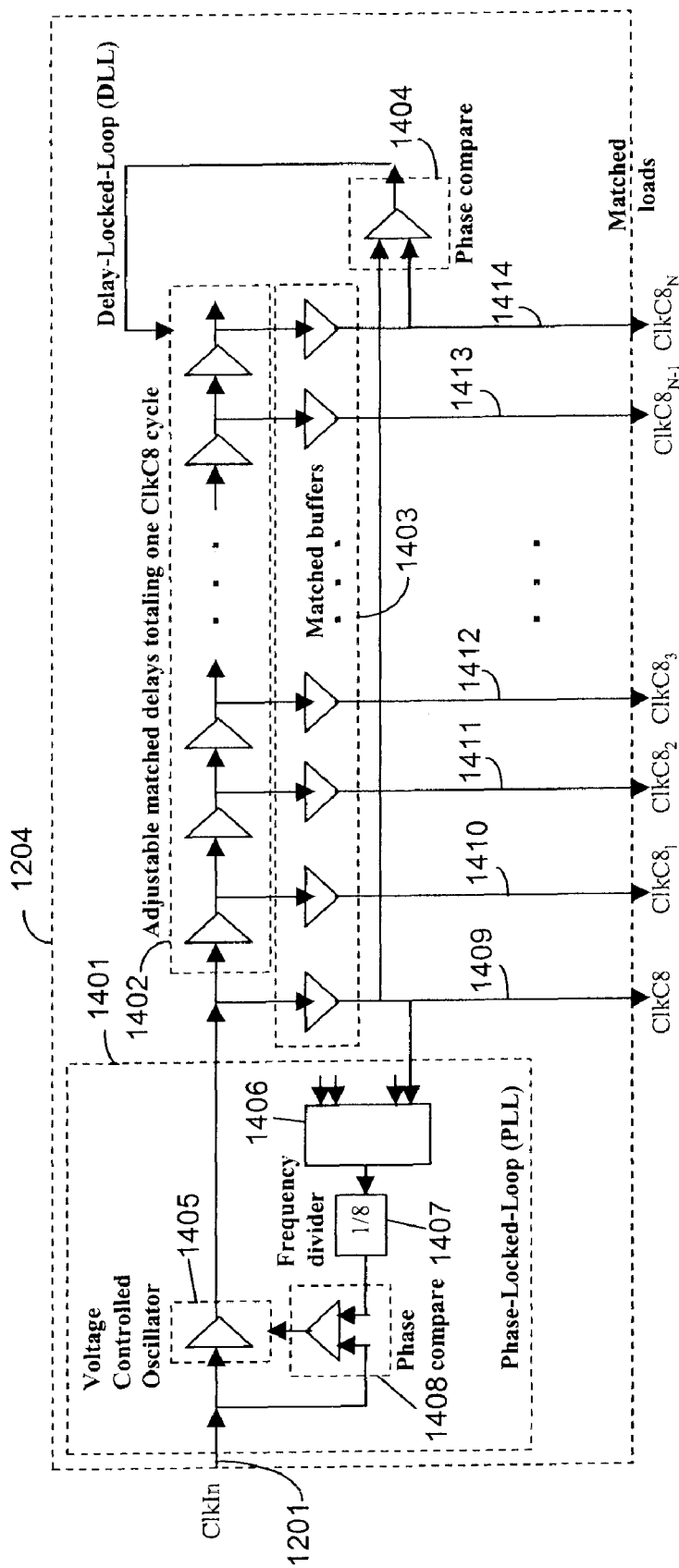
FIG. 14 is a logic diagram illustrating details of the ClkC8 block of the memory controller component such as that illustrated in FIG. 12 in accordance with an embodiment of the invention.

FIG. 14 is a logic diagram illustrating details of the PLL used to generate the ClkC8 signal as illustrated in FIG. 12 in accordance with an embodiment of the invention. PLL 1204 comprises PLL circuit 1401, adjustable matched delays 1402, matched buffers 1403, and phase comparator 1404. PLL circuit 1401 comprises VCO 1405, dummy phase offset selector 1406, frequency divider 1407, and phase comparator 1408. ClkIn clock signal 1201 is provided to VCO 1405 and phase comparator 1408. VCO 1405 provides an output to adjustable matched delays 1402 and matched buffers 1403. Adjustable matched delays 1402 provide a plurality of incrementally delayed outputs to matched buffers 1403.

Figure 15:
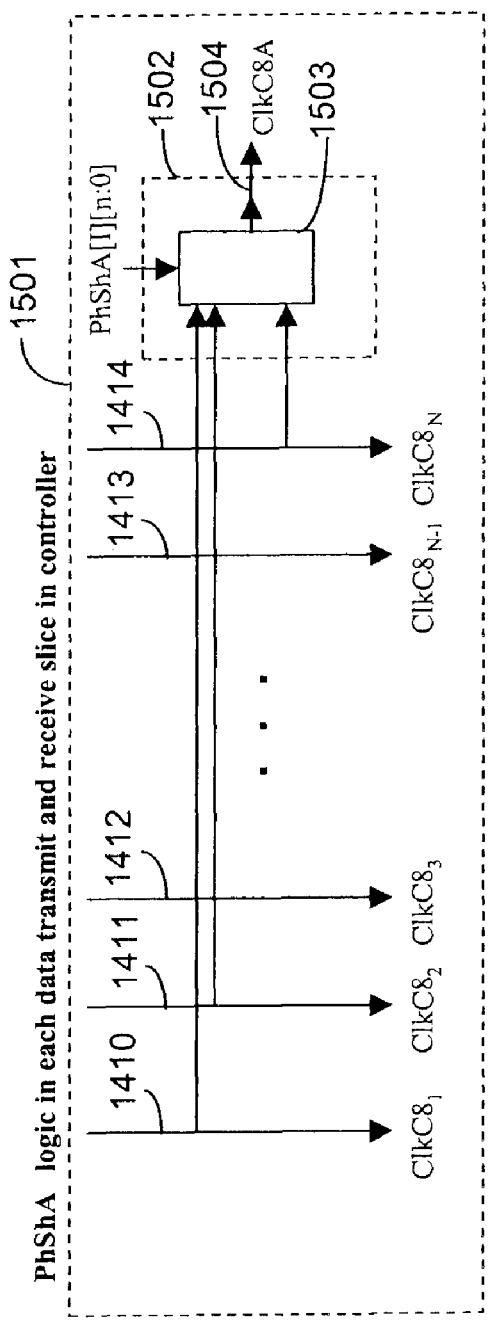
FIG. 15 is a block diagram illustrating how the ClkC8[N:1] signals are used in the transmit and receive blocks of the memory controller component such as that illustrated in FIG. 12 in accordance with an embodiment of the invention.

The PLL circuit 1401 generates a clock signal that is 8 times the frequency of the input clock signal ClkIn 1201, and the generated signal is also phase-shifted to account for delay expected to exist in the paths of the clock signals produced by the circuit in FIG. 14. As such, expected delays are compensated for during the clock generation process such that the clock signals that appear at the point of actual use are correctly phase adjusted. The remaining portion of the block 1204 outside of the PLL circuit 1401 is used to generate equally phase-spaced versions of the clock produced by the PLL circuit 1401. This is accomplished through well-known delay locked loop techniques where the delay locked loop provides the mechanism for generating the equally spaced clock signals. The clock signals produced as a result of the block 1204 in FIG. 14 are provided to the phase shifting logic described below with respect to FIG. 15. The results of the clock generation performed by the circuits of FIGS. 14 and 15 are used to perform the serial-to-parallel or parallel-to-serial conversion as described in FIG. 13 above.

Output 1409 of matched buffers 1403, which is not delayed by adjustable matched delays 1402, is provided to an input of dummy phase offset selector 1406 and an input of phase comparator 1404 and provides the ClkC8 clock signal. Delayed output 1410 provides the ClkC8$_1$ clock signal. Delayed output 1411 provides the ClkC8$_2$ clock signal. Delayed output 1412 provides the ClkC8$_3$ clock signal. Delayed output 1413 provides the ClkC8$_{N-1}$ clock signal. Delayed output 1414 provides the ClkC8$_N$ clock signal, which is provided to an input of phase comparator 1404. Phase comparator 1404 provides a feedback signal to adjustable matched delays 1402, thereby providing a delay-locked loop (DLL). Each of the matched buffers 1403 has a substantially similar propagation delay, thereby providing a buffered output without introducing unintended timing skew among output 1409 and delayed outputs 1410-1414.

The ClkIn reference clock 1201 is received and is frequency-multiplied by 8× by the PLL 1204. Several delays are included with the PLL feedback loop of PLL 1204, including a buffer delay introduced by matched buffers 1403, a dummy phase offset selection delay introduced by dummy phase offset selector 1406, and a frequency divider delay introduced by frequency divider 1407. By including these delays in the feedback loop, the clock that is used for sampling and driving bits on the DQ will be matched to the ClkIn reference, and any delay variations caused by slow drift of temperature and supply voltage will be tracked out.

The output of the PLL circuit 1401 is then passed through a delay line 1402 with N taps. The delay of each element is identical, and can be adjusted over an appropriate range so that the total delay of N elements can equal one ClkC8 cycle ($t_{CC}/8$). There is a feedback loop 1404 that compares the phase of the undelayed ClkC8 to the clock with maximum delay ClkC8[N]. The delay elements are adjusted until their signals are phase aligned, meaning there is $t_{CC}/8$ of delay across the entire delay line.

The ClkC8[N:1] signals pass through identical buffers 1403 and see identical loads from the transmit and receive slices to which they connect. The ClkC8 reference signal 1409 also has a buffer and a matched dummy load to mimic the delay.

FIG. 15 is a block diagram illustrating how the ClkC8[N:1] signals are used in the transmit and receive blocks of the memory controller component such as that illustrated in FIG. 13 in accordance with an embodiment of the invention. PhShA logic block 1501 comprises phase offset selection circuit 1502, which comprises phase offset selector 1503. Phase offset selector 1503 receives ClkC8$_1$ clock signal 1410, ClkC8$_2$ clock signal 1411, ClkC8$_3$ clock signal 1412, ClkC8$_{N-1}$ clock signal 1413, and ClkC8$_N$ clock signal 1414 (i.e., N variants of the ClkC8 clock signal) and selects and provides ClkC8A clock signal 1504. This is accomplished using the N-to-1 multiplexer 1503 which selects one of the signals depending upon the setting of the control signals PhShA[i][n:0], where N=2$^{n+1}$. This allows the phase of the ClkC8A output clock for slice [i] to be varied across one ClkC8 cycle ($t_{CC}/8$) in increments of $t_{CC}/8N$.

At initialization, a calibration procedure is performed with software and/or hardware in which test bits are sampled and driven under each combination of the control signals PhShA[i][n:0]. The combination which yields the best margin is selected for each slice. This static value compensates for the flight time of the DQ and AC signals between the controller and the memory components. This flight time is mainly a factor of trace length and propagation velocity on printed wiring boards, and does not vary much during system operation. Other delay variations due to supply voltage and temperature are automatically tracked out by the feedback loops of the PLLs in the system.

Figure 16:
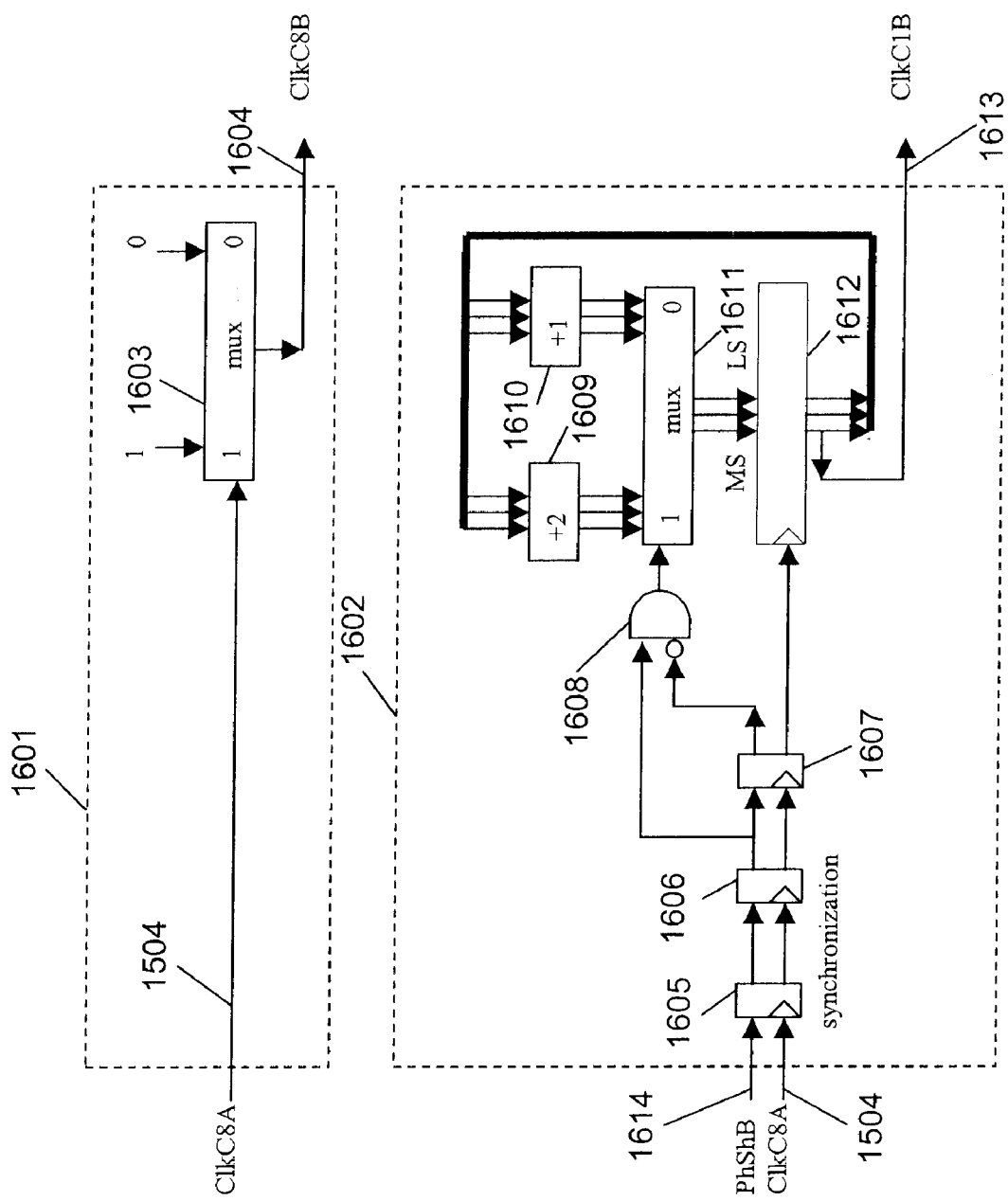
FIG. 16 is a block diagram illustrating a circuit for producing a ClkC8B clock and a ClkC1B clock based on the ClkC8A clock in accordance with an embodiment of the invention.

FIG. 16 is a block diagram illustrating the PhShB circuit 1307 and 1316 of FIG. 13. Clock conversion circuit 1601 of FIG. 16 preferably corresponds to 1/1 divider circuit 1324 and 1/1 divider circuit 1326 of FIG. 13. Similarly, clock conversion circuit 1602 of FIG. 16 preferably corresponds to 1/8 divider circuit 1325 and 1/8 divider circuit 1327 of FIG. 13. It produces a ClkC8B clock and a ClkC1B clock based on the ClkC8A clock in accordance with an embodiment of the invention. Clock conversion circuit 1601 comprises a multiplexer 1603, which receives ClkC8A signal 1504 and provides ClkC8B signal 1604. Clock conversion circuit 1602 comprises registers 1605, 1606, 1607, and 1612, logic gate 1608, multiplexer 1611, and incrementing circuits 1609 and 1610. PhShB signal 1614 is applied to register 1605, and ClkC8A clock signal 1504 is used to clock register 1605. Outputs of register 1605 are applied as an input and a clock input to register 1606. An output of register 1606 is applied as an input to register 1607 and logic gate 1608. An output of register 1606 is used to clock register 1607. An output of register 1607 is applied to logic gate 1608. An output of register 1607 is used to clock register 1612. An output of logic gate 1608 is applied to multiplexer 1611.

Incrementing circuit 1609 increments an incoming three-bit value by two. Incrementing circuit 1610 increments the incoming three-bit value by one in a binary manner such that it wraps from 111 to 000. Multiplexer 1611 selects among the three-bit outputs of incrementing circuits 1609 and 1610 and provides a three-bit output to register 1612. Register 1612 provides a three-bit output to be used as the incoming three-bit value for incrementing circuits 1609 and 1610. The most significant bit (MSB) of the three-bit output is used to provide ClkC1B clock signal 1613.

In FIG. 16, the ClkC8A clock that is produced by the PhShA (1306 and 1315 of FIG. 13) block is then used to produce a ClkC8B clock at the same frequency and to produce a ClkC1B clock at ⅛$^{th}$ the frequency. These two clocks are phase aligned with one another (each rising edge of ClkC1B is aligned with a rising edge of ClkC8B.

ClkC1B 1613 is produced by passing it through a divide-by-eight counter 1602. ClkC8A clocks a three bit register 1612 which increments on each clock edge. The most-significant bit will be ClkC1B, which is ⅛$^{th}$ the frequency of ClkC8A. The ClkC8B 1604 clock is produced by a multiplexer which mimics the clock-to-output delay of the three bit register, so that ClkC1B and ClkC8B are aligned. As is apparent to one of ordinary skill in the art, other delaying means can be used in place of the multiplexer shown in block 1601 to accomplish the task of matching the delay through the divide-by-8 counter.

As described with respect to FIG. 13, it is necessary to adjust the phase of ClkC1B 1613 so that the parallel register is loaded from/to the serial register in the transmit and receive blocks at the proper time. At initialization, a calibration procedure will transmit and receive test bits to determine the proper phasing of the ClkC1B clock. This procedure will use the PhShB control input 1614. When this input has a rising edge, the three bit counter will increment by +2 instead of +1 on one of the following ClkC8A edges (after synchronization). The phase of the ClkC1B clock will shift ⅛$^{th}$ of a cycle earlier. The calibration procedure will continue to advance the phase of the ClkC1B clock and check the position of test bits on the TD[i][7:0] and RQ[i][7:0] buses. When the test bits are in the proper position, the ClkC1B phase will be frozen.

Figure 17:
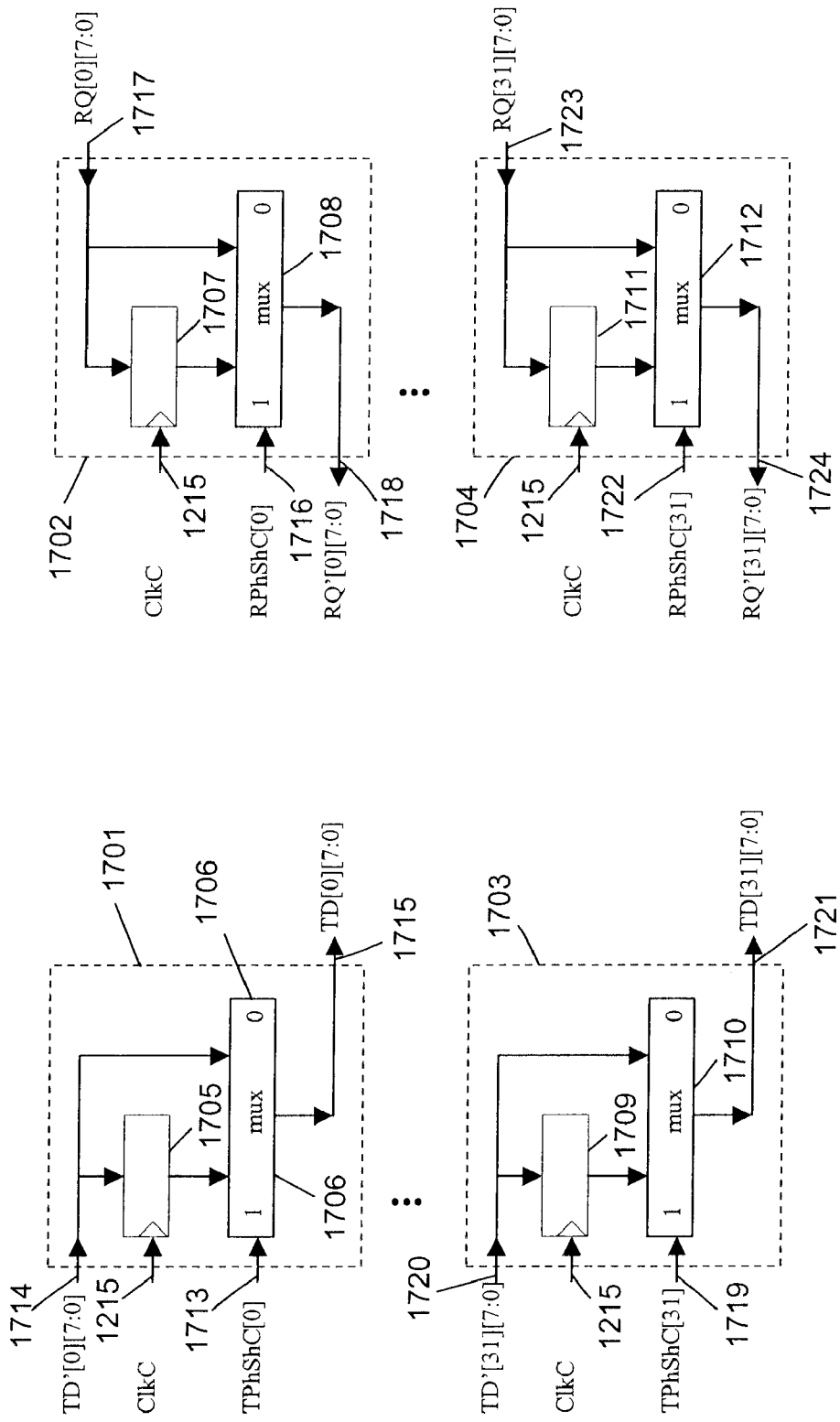
FIG. 17 is a block diagram illustrating details of the PhShC block in accordance with an embodiment of the invention.

FIG. 17 is a block diagram illustrating details of the PhShC block (1240 in FIG. 12) in accordance with an embodiment of the invention. PhShC block 1240 includes blocks 1701-1704. Block 1701 comprises register 1705 and multiplexer 1706. Write data input 1714 is provided to register 1705 and multiplexer 1706. Register 1705 is clocked by ClkC clock signal 1215 and provides an output to multiplexer 1706. Multiplexer 1706 receives TPhShC[0] selection input 1713 and provides write data output 1715. Block 1702 comprises register 1707 and multiplexer 1708. Read data input 1717 is provided to register 1707 and multiplexer 1708. Register 1707 is clocked by ClkC clock signal 1215 and provides an output to multiplexer 1708. Multiplexer 1708 receives RPhShC[0] selection input 1716 and provides read data output 1718. Block 1703 comprises register 1709 and multiplexer 1710. Write data input 1720 is provided to register 1709 and multiplexer 1710. Register 1709 is clocked by ClkC clock signal 1215 and provides an output to multiplexer 1710. Multiplexer 1710 receives TPhShC[31] selection input 1719 and provides write data output 1721. Block 1704 comprises register 1711 and multiplexer 1712. Read data input 1723 is provided to register 1711 and multiplexer 1712. Register 1711 is clocked by ClkC clock signal 1215 and provides an output to multiplexer 1712. Multiplexer 1712 receives RPhShC[31] selection input 1722 and provides read data output 1724. While only two instances of the blocks for the write data and only two instances of the blocks for the read data are illustrated, it is understood that the blocks may be replicated for each bit of write data and each bit of read data.

The PhShC block 1240 is the final logic block that is used to adjust the delay of the 32×8 read data bits and the 32×8 write data bits so that all are driven or sampled from/to the same ClkC clock edge in the controller logic block. This is accomplished with an eight bit register which can be inserted into the path of the read and write data for each slice. The insertion of the delay is determined by the two control buses TPhShC[31:0] and RPhShC[31:0]. There is one control bit for each slice, since the propagation delay of the read and write data may cross a ClkC boundary at any memory slice position. Some systems with larger skews in the read and write data across the memory slices may need more than one ClkC of adjustment. The PhShC cells shown can be easily extended to provide additional delay by adding more registers and more multiplexer inputs.

The two control buses TPhShC[31:0] and RPhShC[31:0] are configured during initialization with a calibration procedure. As with the other phase-adjusting steps, test bits are read and written to each memory slice, and the control bits are set to the values that, in the example embodiment, allow all 256 read data bits to be sampled in one ClkC cycle and all 256 write data bits to be driven in one ClkC cycle by the controller logic.

Figure 18:
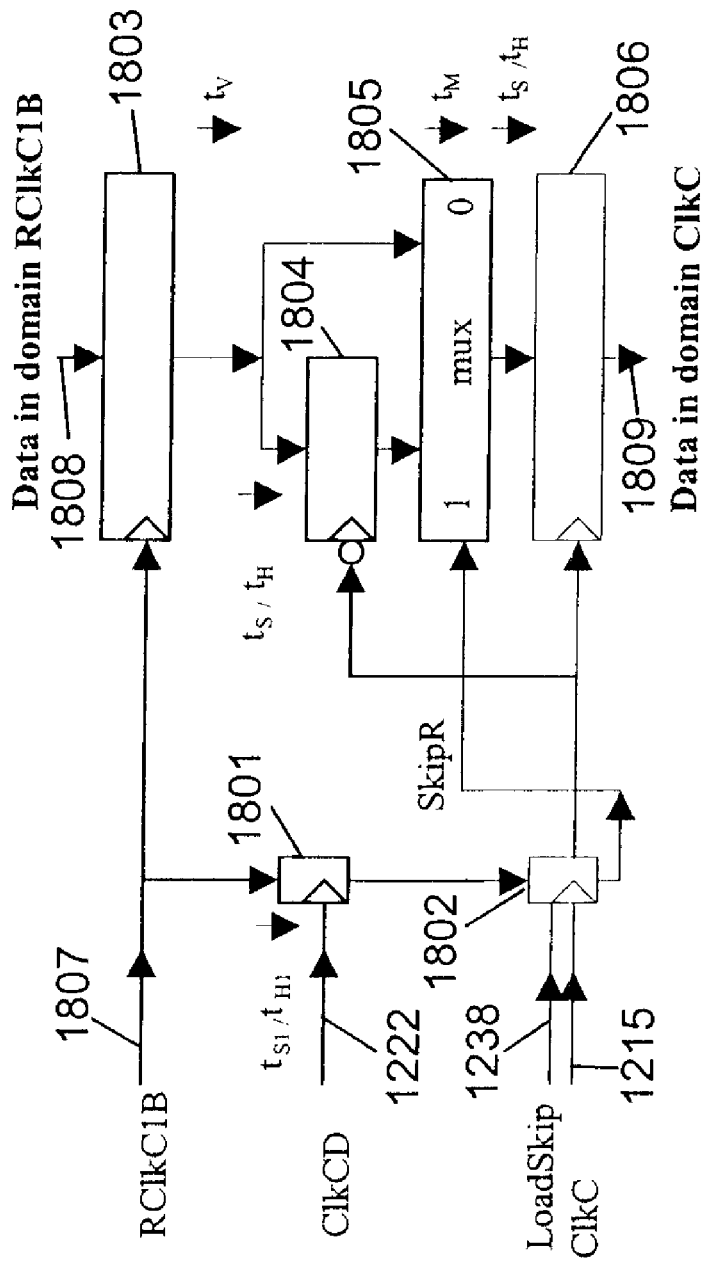
FIG. 18 is a block diagram illustrating the logic details of the skip logic in a controller slice of the receive block of a memory controller component in accordance with an embodiment of the invention.

FIG. 18 is a block diagram illustrating the logic details of the skip logic from the transmit block 203 (in FIG. 13) of a memory controller component in accordance with an embodiment of the invention. The skip logic comprises registers 1801, 1802, 1803, 1804, and 1806, and multiplexer 1805. RClkC1B clock input 1807 is provided to register 1801 and is used to clock register 1803. ClkCD clock input 1222 is used to clock register 1801, which provides an output to register 1802. Register 1802 receives LoadSkip signal 1238 and is clocked by ClkC clock signal 1215, providing an output to multiplexer 1805 and an output used to clock registers 1804 and 1806. Register 1803 receives data in domain RClkC1B at input 1808 and provides an output to register 1804 and multiplexer 1805. Register 1804 provides an output to multiplexer 1805. Multiplexer 1805 provides an output to register 1806. Register 1806 provides data in domain ClkC at output 1809.

The circuit transfers the data in the RClkC1B clock domain to the ClkC domain. These two clocks have the same frequency, but may have any phase alignment. The solution is to sample RClkC1B with a delayed version of ClkC called ClkCD (the limits on the amount of delay can be determined by the system, but in one embodiment, the nominal delay is ¼ of a ClkC cycle). This sampled value is called SkipR, and it determines whether the data in an RClkC1B register may be transferred directly to a ClkC register, or whether the data must first pass through a negative-edge-triggered ClkC register.

Regarding FIG. 18, the following worst case setup constraints can be assumed:

Case B0

$$T_{D,MAX} + t_{H1,MIN} + t_{CL,MIN} + t_{V,MAX} + t_{M,MAX} + t_{S,MIN} <= t_{CYCLE}$$

or $$t_{D,MAX} <= t_{CH,MIN} - t_{H1,MIN} - t_{V,MAX} - t_{M,MAX} - t_{S,MIN} \quad \text{constraint S}$$

Case D1

$$t_{D,MAX} + t_{H1,MIN} + t_{CYCLE} + t_{V,MAX} + t_{S,MIN} <= t_{CYCLE} + t_{CL,MIN}$$

or $$t_{D,MAX} <= t_{CL,MIN} - t_{H1,MIN} - t_{V,MAX} - t_{S,MIN}$$

The following worst case hold constraints can be assumed:
Case A1

$$t_{D,MIN} - t_{S1,MIN} + t_{V,MIN} >= t_{H,MIN}$$

or $$t_{D,MIN} >= t_{H,MIN} + t_{S1,MIN} - t_{V,MIN} \quad \text{constraint H}$$

Case C0

$$t_{D,MIN} - t_{S1,MIN} + t_{V,MIN} + t_{M,MIN} >= t_{H,MIN}$$

or $$t_{D,MIN} >= t_{H,MIN} + t_{S1,MIN} - t_{V,MIN} - t_{M,MIN}$$

Figure 19:
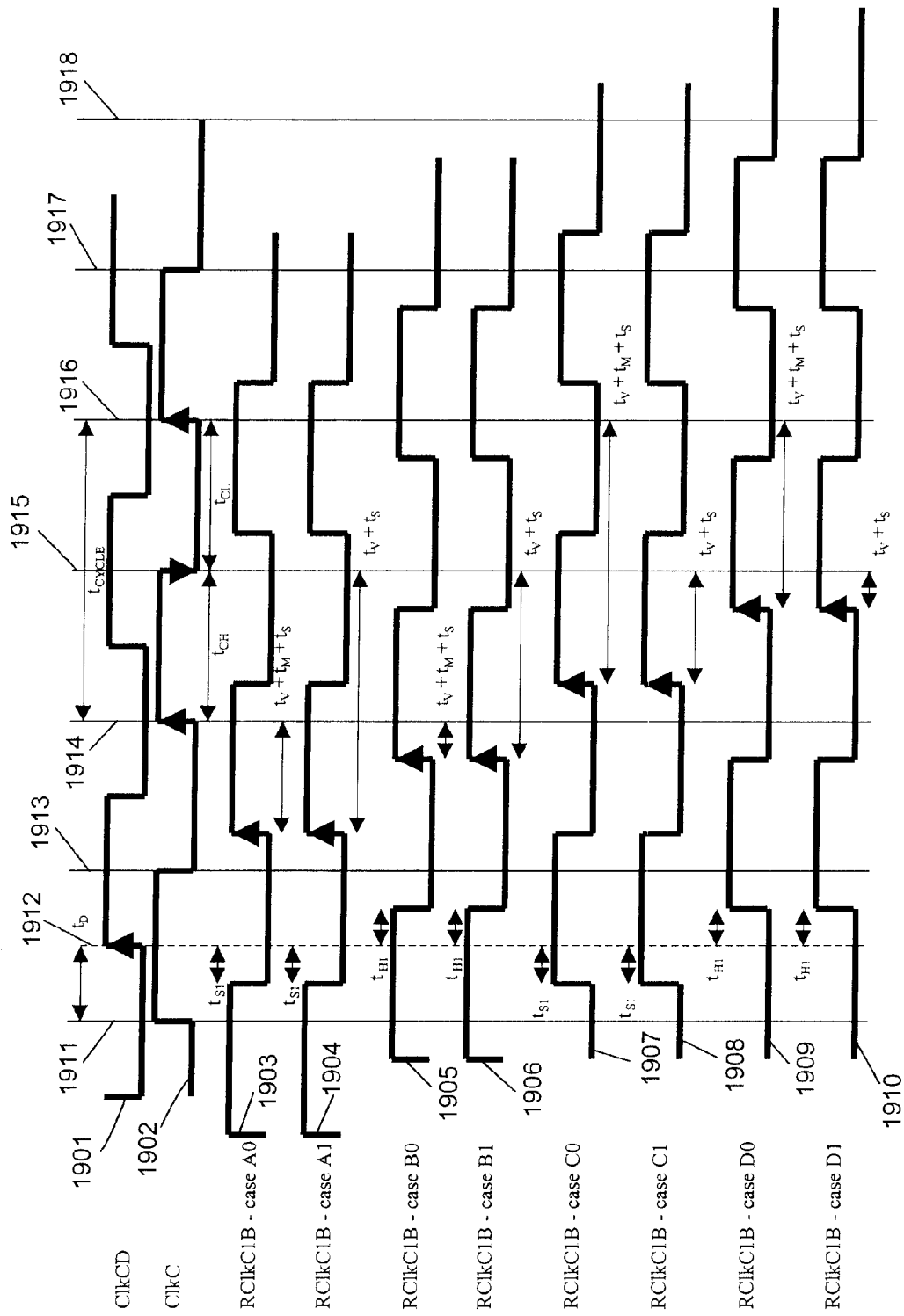
FIG. 19 is a timing diagram illustrating the timing details of the skip logic in a controller slice of the receive block of a memory controller component in accordance with an embodiment of the invention.

The timing parameters used above are defined as follow:
$t_{S1}$—Setup time for clock sampler
$t_{H1}$—Hold time for clock sampler
$t_S$—Setup time for data registers
$t_H$—Hold time for data registers
$t_V$—Valid delay (clock-to-output) of data registers
$t_M$—Propagation delay of data multiplexer
$t_{CYCLE}$—Clock cycle time (RClkC1B, ClkC, ClkCD)
$t_{CH}$—Clock high time (RClkC1B, ClkC, ClkCD)
$t_{CL}$—Clock low time (RClkC1B, ClkC, ClkCD)
$t_D$—Offset between ClkC and ClkCD (ClkCD is later)
Note:
$t_{D,NOM} \sim t_{CYCLE}/4$
$t_{CH,NOM} \sim t_{CYCLE}/2$
$t_{CL,NOM} \sim t_{CYCLE}/2$ FIG. 19 is a timing diagram illustrating the timing details of the skip logic of the receive block 203 (illustrated in FIG. 13) in accordance with an embodiment of the invention. FIG. 19 illustrates waveforms of ClkCD clock signal 1901, ClkC clock signal 1902, RClkC1B (case A0) clock signal 1903, RClkC1B (case A1) clock signal 1904, RClkC1B (case B0) clock signal 1905, RClkC1B (case B1) clock signal 1906, RClkC1B (case C0) clock signal 1907, RClkC1B (case C1) clock signal 1908, RClkC1B (case D0) clock signal 1909, and RClkC1B (case D1) clock signal 1910. Times 1911, 1912, 1913, 1914, 1915, 1916, 1917, and 1918, at intervals of one clock cycle, are illustrated to indicate the timing differences between the clock signals.

FIG. 19 generally summarizes the possible phase alignments of RClkC1B and ClkC as eight cases labeled A0 through D1. These cases are distinguished by the position of the RClkC1B rising and falling edge relative to the set/hold window of the rising edge of ClkCD which samples RClkC1B to determine the SkipR value. Clearly, if the RClkC1B rising or falling edge is outside of this window, it will be correctly sampled. If it is at the edge of the window or inside the window, then it can be sampled as either a zero or one (i.e., the validity of the sample cannot be ensured). The skip logic has been designed such that it functions properly in either case, and this then determines the limits on the delay of the ClkCD clock $t_D$.

For the receive block, case B0 1905 has the worst case setup constraint, and case A1 1904 has the worst case hold constraint:

$$t_{D,MAX} <= t_{CH,MIN} - t_{H1,MIN} - t_{V,MAX} - t_{M,MAX} - t_{S,MIN} \quad \text{constraint S}$$

$$t_{D,MIN} >= t_{H,MIN} + t_{S1,MIN} - t_{V,MIN} \quad \text{constraint H}$$

As mentioned earlier, the nominal value of $t_D$ (the delay of ClkCD relative to ClkC) is expected to be ¼ of a ClkC cycle. The value of $t_D$ can vary up to the $t_{D,MAX}$ value shown above, or down to the $t_{D,MIN}$ value, also shown above. If the setup (e.g., $t_{S1}$, $t_S$), hold (e.g., $t_{H1}$, $t_H$), multiplexer propagation delay (e.g., $t_M$), and valid (e.g., $t_V$) times all went to zero, then the $t_D$ value could vary up to $t_{CH,MIN}$ (the minimum high time of ClkC) and down to zero. However, the finite set/hold window of registers, and the finite clock-to-output (valid time) delay and multiplexer delay combine to reduce the permissible variation of the $t_D$ value.

Note that it would be possible to change some of the elements of the skip logic without changing its basic function. For example, a sampling clock ClkCD may be used that is earlier rather than later (the constraint equations are changed, but there is a similar dependency of the timing skew range of ClkC to ClkCD upon the various set, hold, and valid timing parameters). In other embodiments, a negative-edge-triggered RClkC1B register is used instead of a ClkC register into the domain-crossing path (again, the constraint equations are changed, but a similar dependency of the timing skew range of ClkC to ClkCD upon the various set, hold, and valid timing parameters remains).

Finally, it should be noted that the skip value that is used is preferably generated once during initialization and then loaded (with the LoadSkip control signal) into a register. Such a static value is preferable to rather than one that is sampled on every ClkCD edge because if the alignment of RClkC1B is such that it has a transition in the set/hold window of the ClkCD sampling register, it may generate different skip values each time it is sampled. This would not affect the reliability of the clock domain crossing (the RClkC1B date would be correctly transferred to the ClkC register), but it would affect the apparent latency of the read data as measured in ClkC cycles in the controller. That is, sometimes the read data would take a ClkC cycle longer than at other times. Sampling the skip value and using it for all domain crossings solves this problem. Also note that during calibration, every time the RClkC1B phase is adjusted, the LoadSkip control is pulsed in case the skip value changes.

Figure 20:
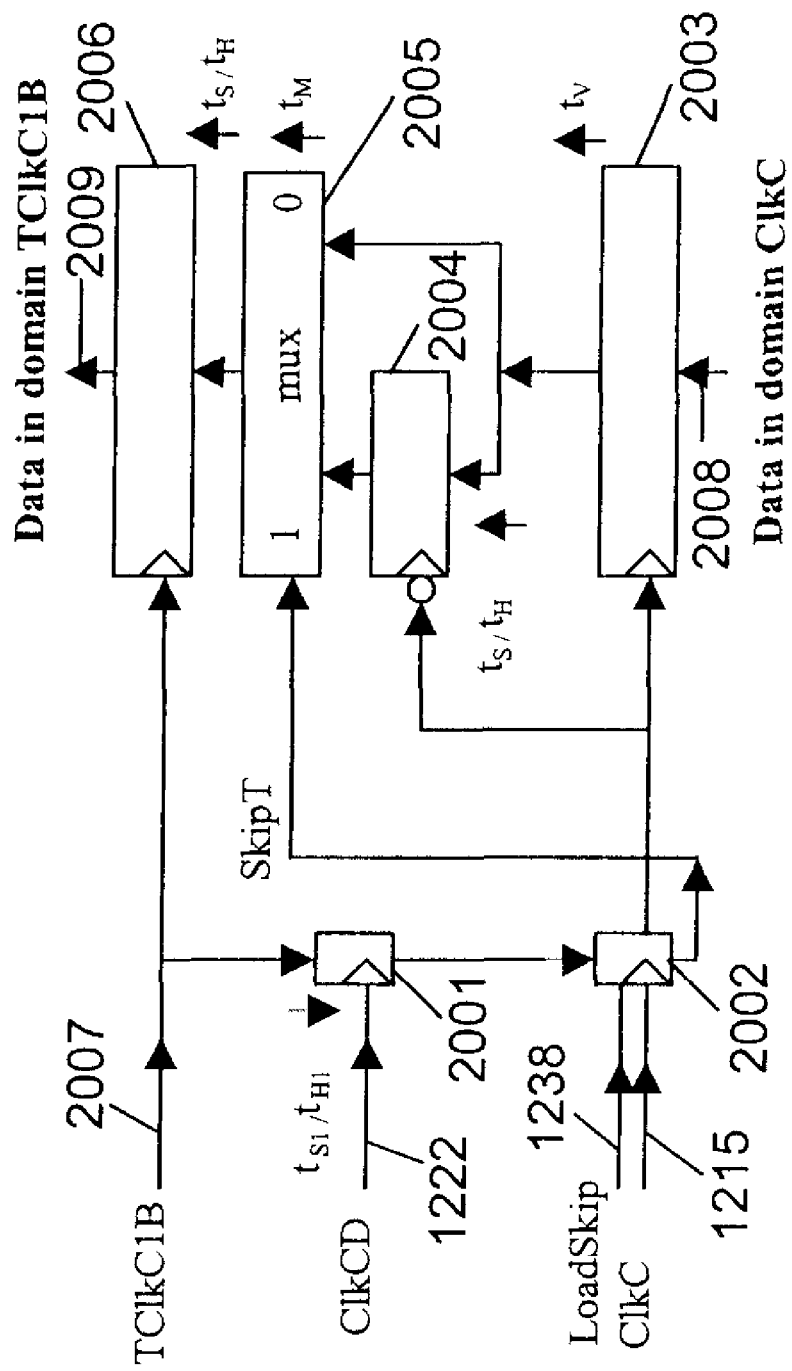
FIG. 20 is a block diagram illustrating the logic details of the skip logic in a controller slice of the transmit block of a memory controller component in accordance with an embodiment of the invention.

FIG. 20 is a block diagram illustrating the logic details of the skip logic of the transmit block 202 of FIG. 13 in accordance with an embodiment of the invention. The skip logic comprises registers 2001, 2002, 2003, 2004, and 2006, and multiplexer 2005. TClkC1B clock input 2007 is provided to register 2001 and is used to clock register 2006. ClkCD clock input 1222 is used to clock register 2001, which provides an output to register 2002. Register 2002 receives LoadSkip signal 1238 and is clocked by ClkC clock signal 1215, providing an output to multiplexer 2005 and an output used to clock registers 2003 and 2004. Register 2003 receives data in domain ClkC at input 2008 and provides an output to register 2004 and multiplexer 2005. Register 2004 provides an output to multiplexer 2005. Multiplexer 2005 provides an output to register 2006. Register 2006 provides data in domain TClkC1B at output 2009.

The circuit of FIG. 20 is used in the transfer of data in the ClkC clock domain to the TClkC1B domain. The two clocks ClkC and TClkC1B have the same frequency, but may be phase mismatched. One technique that can be used in the clock domain crossing is to sample TClkC1B with a delayed version of ClkC called ClkCD (the limits on the amount of delay can vary, but in one embodiment, the delay selected is ¼ of a ClkC cycle). The sampled value, SkipT, determines whether the data in a ClkC register is transferred directly to a TClkC1B register, or whether the data first passes through a negative-edge-triggered ClkC register.

Regarding FIG. 20, the following worst case setup constraints can be assumed:
Case C0

$$t_{D,MIN-tS1,MIN} >= t_{V,MAX} + t_{M,MAX} + t_{S,MIN}$$

or $$t_{D,MIN} >= t_{S1,MIN} + t_{V,MAX} + t_{M,MAX} + t_{S,MIN} \quad \text{constraint S}$$

Case A1

$$t_{D,MIN} - t_{S1,MIN} >= t_{V,MAX} + t_{S,MIN}$$

or $$t_{D,MIN} >= t_{S1,MIN} + t_{V,MAX} + t_{S,MIN}$$

The following worst case hold constraints can be assumed:
Case D1

$$t_{H,MIN} <= t_{CH,MIN} - t_{D,MAX} - t_{H1,MIN} - t_{V,MIN}$$

or $$t_{D,MAX} <= t_{CH,MIN} - t_{H1,MIN} - t_{V,MIN} - t_{H,MIN}$$

or $$t_{D,MAX} <= t_{CL,MIN} - t_{H1,MIN} - t_{V,MIN} - t_{M,MIN} - t_{H,MIN}$$

Case B0

$$t_{H,MIN} <= t_{CL,MIN} - t_{D,MAX} - t_{H1,MIN} - t_{V,MIN} - t_{M,MIN}$$

or $$t_{D,MAX} <= t_{CL,MIN} - t_{H1,MIN} - t_{V,MIN} - t_{M,MIN} - t_{H,MIN} \quad \text{constraint H}$$

Definitions for the timing parameters used above may be found in the discussion of FIG. 18 above.

Figure 21:
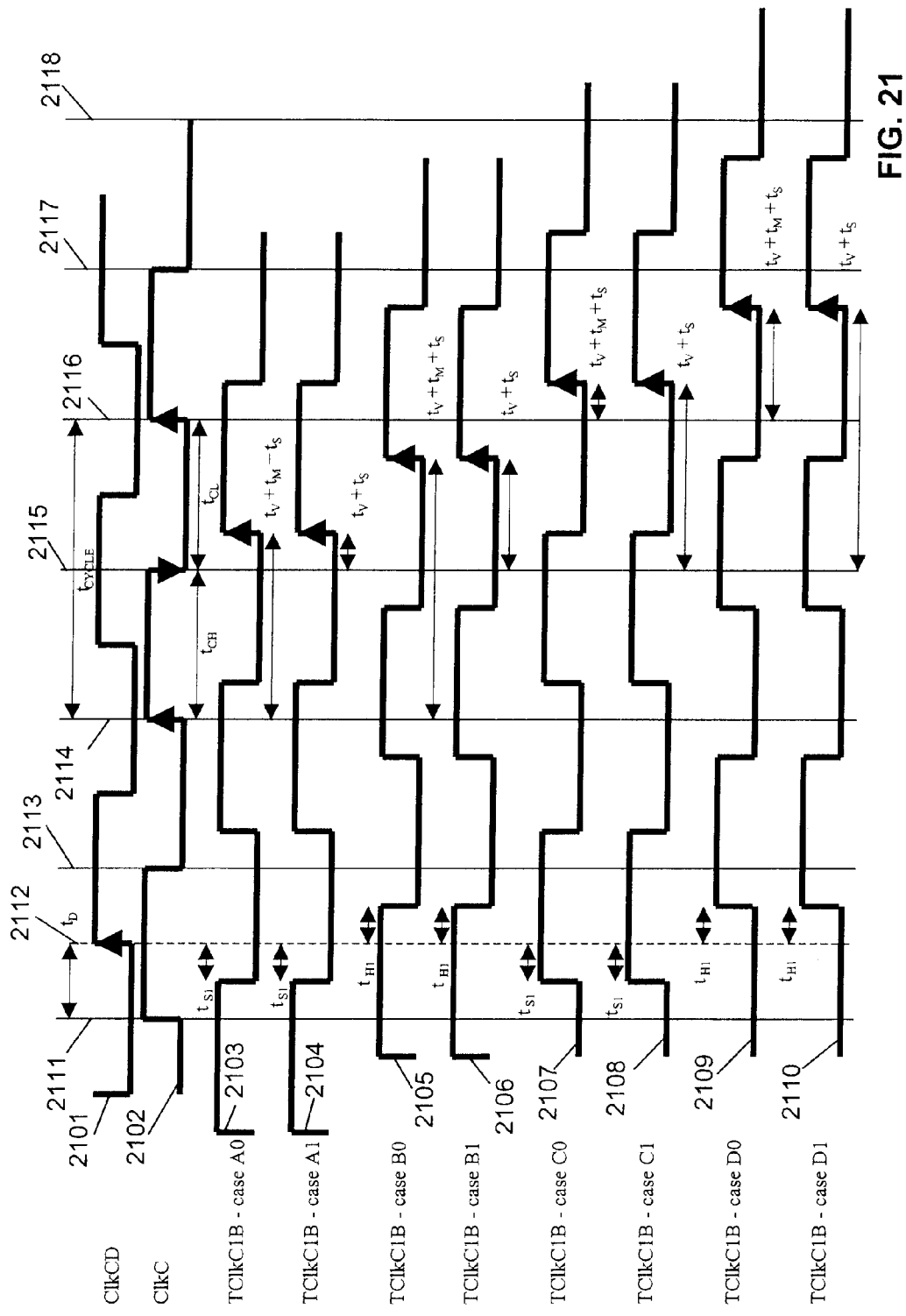
FIG. 21 is a timing diagram illustrating the timing details of the skip logic in a controller slice of the transmit block of a memory controller component in accordance with an embodiment of the invention.

FIG. 21 is a timing diagram illustrating the timing details of the skip logic of the transmit block 202 of FIG. 13 in accordance with an embodiment of the invention. FIG. 21 illustrates waveforms of ClkCD clock signal 2101, ClkC clock signal 2102, TClkC1B (case A0) clock signal 2103, TClkC1B (case A1) clock signal 2104, TClkC1B (case B0) clock signal 2105, TClkC1B (case B1) clock signal 2106, TClkC1B (case C0) clock signal 2107, TClkC1B (case C1) clock signal 2108, TClkC1B (case D0) clock signal 2109, and TClkC1B (case D1) clock signal 2110. Times 2111, 2112, 2113, 2114, 2115, 2116, 2117, and 2118, at intervals of one clock cycle, are illustrated to indicate the timing differences between the clock signals.

FIG. 21 generally summarizes the possible phase alignments of TClkC1B and ClkC as eight cases labeled A0 through D1. These cases are distinguished by the position of the TClkC1B rising and falling edge relative to the set/hold window of the rising edge of ClkCD which samples TClkC1B to determine the SkipR value. Clearly, if the TClkC1B rising or falling edge is outside of this window, it will be correctly sampled. If it is at the edge of the window or inside the window, then it can be sampled as either a zero or one (i.e., the validity of the sample cannot be ensured). The skip logic has been designed such that it functions properly in either case, and this then determines the limits on the delay of the ClkCD clock $t_D$.

For the transmit block, case C0 2107 has the worst case setup constraint, and case B0 2105 has the worst case hold constraint:

$$t_{D,MIN} >= t_{S1,MIN} + t_{V,MAX} + t_{M,MAX} + t_{S,MIN}$$ constraint S

$$t_{D,MAX} <= t_{CL,MIN} - t_{H1,MIN} - t_{V,MIN} - t_{M,MIN} - t_{H,MIN}$$ constraint H

As mentioned earlier, the nominal value of $t_D$ (the delay of ClkCD relative to Clkc) will by ¼ of a ClkC cycle. This can vary up to the $t_{D,MAX}$ value shown above, or down to the $t_{D,MIN}$ value. If the set, hold, mux (i.e., multiplexer), and valid times all went to zero, then the $t_D$ value could vary up to $t_{CH,MIN}$ (the minimum high time of ClkC) and down to zero. However, the finite set/hold window of registers, and the finite clock-to-output (valid time) delay and multiplexer delay combine to reduce the permissible variation of the $t_D$ value.

As described with respect to FIG. 19 above, some elements of the skip logic can be changed for different embodiments while preserving its general functionality. Similarly, as described with respect to the skip logic of FIG. 19, the skip value that is used is preferably generated during initialization and then loaded (with the LoadSkip control signal) into a register.

Figure 22:
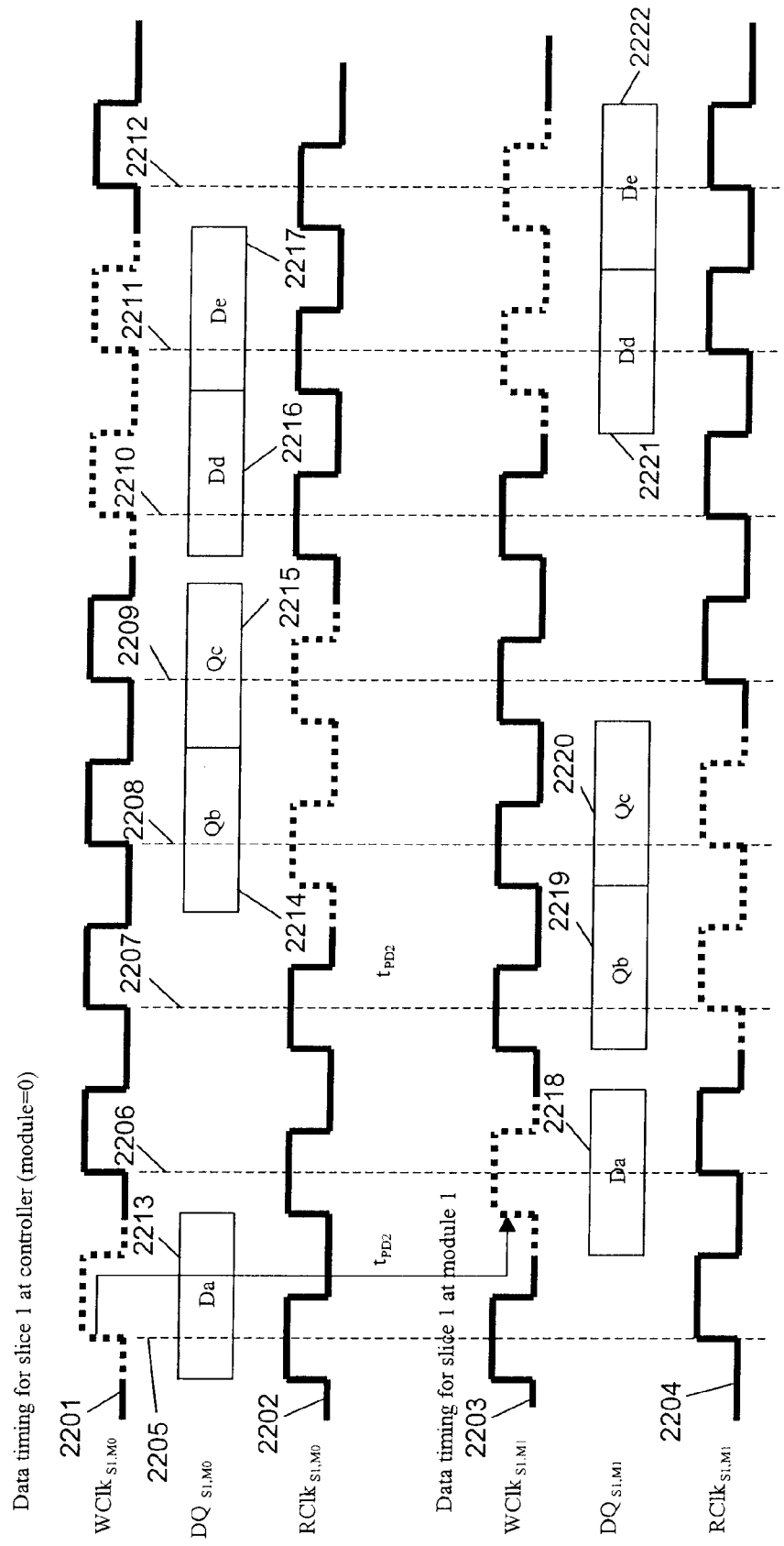
FIG. 22 is a timing diagram illustrating an example of a data clocking arrangement in accordance with an embodiment of the invention.

FIG. 22 is a timing diagram illustrating an example of a data clocking arrangement in accordance with an embodiment of the invention. However, in this example, the clock phases in the memory controller and memory components have been adjusted to a different set of values than in the example illustrated in FIGS. 5 though 21. The waveforms of WClk$_{S1,M0}$ clock signal 2201 and RClk$_{S1,M0}$ clock signal 2202 are illustrated to show the data timing for slice 1 from the perspective of the memory controller component at slice 0. The rising edges of sequential cycles of WClk$_{S1,M0}$ clock signal 2201 occur at times 2205, 2206, 2207, 2208, 2209, 2210, 2211, and 2212, respectively. Write datum information Da 2213 is present on the data lines at the controller at time 2205. Read datum information Qb 2204 is present at time 2208. Read datum information Qc 2215 is present at time 2209. Write datum information Dd 2216 is present at time 2210. Write datum information De 2217 is present at time 2211.

The waveforms of WClk$_{S1,M1}$ clock signal 2203 and RClk$_{S1,M1}$ clock signal 2204 are illustrated to show the data timing for slice 1 from the perspective of the memory component at slice 1. Write datum information Da 2218 is present on the data lines at the memory component at time 2206. Read datum information Qb 2219 is present at time 2207. Read datum information Qc 2220 is present at time 2208. Write datum information Dd 2221 is present at time 2211. Write datum information De 2222 is present at time 2212.

The examplary system illustrated in FIGS. 5 through 21 assumed that the clock for the read and write data were in phase at each memory component. FIG. 22 assumes that for each slice the read clock at each memory component is in phase with the write clock at the controller (RClk$_{Si,M0}$=WClk$_{Si,M1}$), and because the propagation delay $t_{PD2}$ is the same in each direction, the write clock at each memory component is in phase with the read clock at the controller (WClk$_{Si,M0}$=RClk$_{Si,M1}$). This phase relationship shifts the timing slots for the read and write data relative to FIG. 6, but does not change the fact that two idle cycles are inserted during a write-read-read-write sequence. The phase relationship alters the positions within the system where domain crossings occur (some domain crossing logic moves from the controller into the memory components).

FIGS. 23 through 26 are timing diagrams illustrating an example of a data clocking arrangement in accordance with an embodiment of the invention. However, in this example the clock phases in the memory controller and memory components have been adjusted to a different set of values than those in the example illustrated in FIGS. 5 though 21. The example in FIGS. 23 through 26 also uses a different set of clock phase values than the example in FIG. 22.

Figure 23:
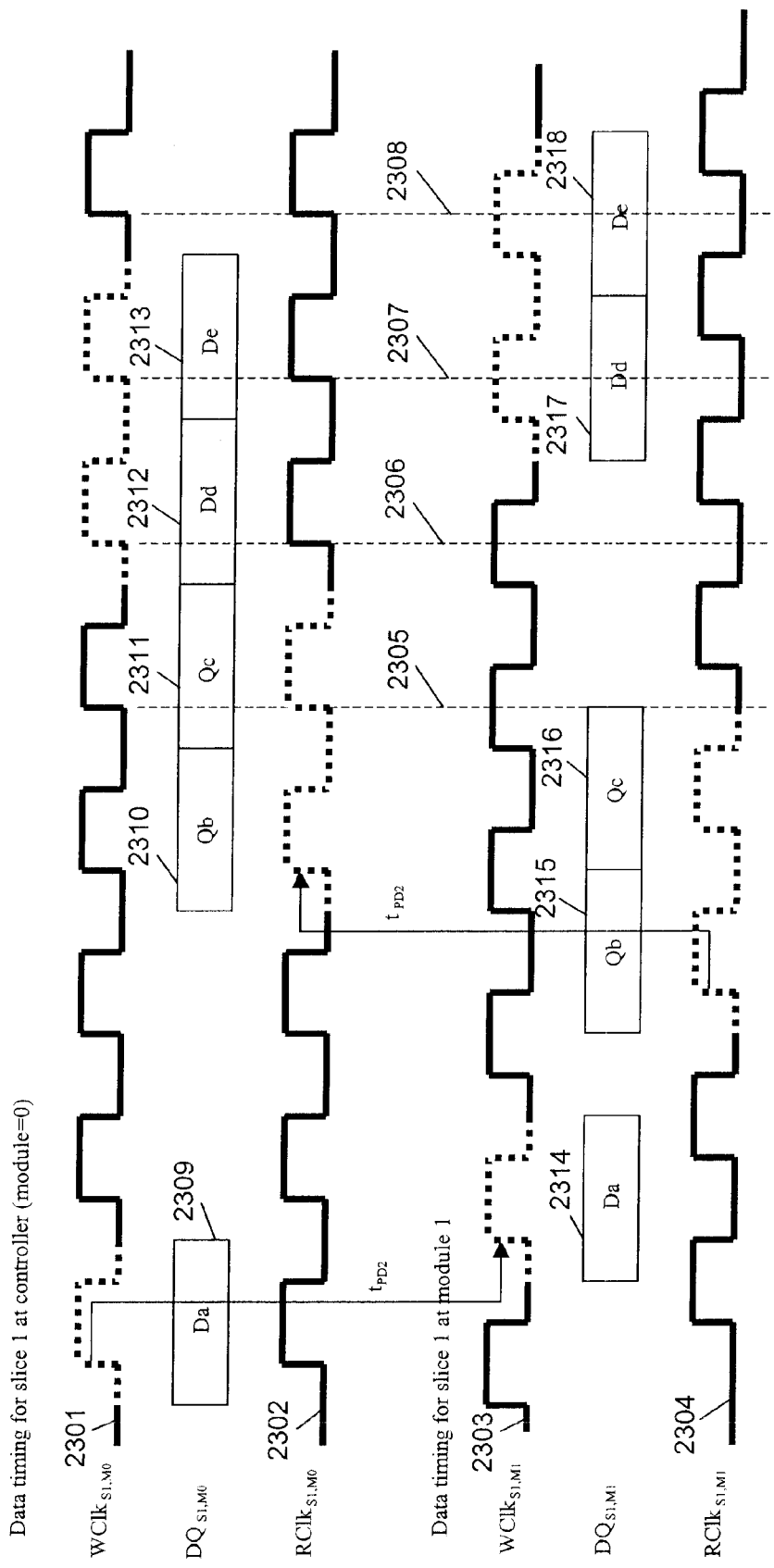
FIG. 23 is a timing diagram illustrating an example of a data clocking arrangement in accordance with an embodiment of the invention.

FIG. 23 is a timing diagram illustrating an example of a data clocking arrangement in accordance with an embodiment of the invention. The waveforms of WClk$_{S1,M0}$ clock signal 2301 and RClk$_{S1,M0}$ clock signal 2302 are illustrated to show the data timing for slice 1 from the perspective of the memory controller component at slice 0. Rising edges of sequential cycles of WClk$_{S1,M0}$ clock signal 2301 occur at times 2305, 2306, 2307, and 2308, respectively. Write datum information Da 2309 is present on the data bus at the controller during a first cycle of WClk$_{S1,M0}$ clock signal 2301. Read datum information Qb 2310 is present at a fourth cycle of WClk$_{S1,M0}$ clock signal 2301. Read datum information Qc 2311 is present at time 2305. Write datum information Dd 2312 is present at time 2306. Write datum information De 2313 is present at time 2307.

The waveforms of WClk$_{S1,M1}$ clock signal 2303 and RClk$_{S1,M1}$ clock signal 2304 are illustrated to show the data timing for slice 1 from the perspective of the memory component at slice 1. Write datum information Da 2314 is advanced one clock cycle relative to its position from the perspective of the memory controller component at slice 0. In other words, the write data appears on the data bus at the memory device approximately one clock cycle later than when it appears on the data bus at the controller. Read datum information Qb 2315 is delayed one clock cycle relative to its position from the perspective of the memory controller component at slice 0. Read datum information Qc 2316 is also delayed one clock cycle relative to its position from the perspective of the memory controller component at slice 0. Write datum information Dd 2317 is present at time 2317. Write datum information De 2318 is present at time 2308.

The example system assumes that the clock for the read and write data are in phase at each memory component. FIG. 23 assumes that for each slice the read clock and write clock are in phase at the controller (RClk$_{Si,M0}$=WClk$_{Si,M0}$), and also that each slice is in phase with every other slice at the controller (WClk$_{Si,M0}$=WClk$_{Sj,M0}$). This shifts the timing slots for the read and write data relative to FIG. 6 and FIG. 22, but it does not change the fact that two idle cycles are used during a write-read-read-write sequence. The phase relationship alters the positions within the system where domain crossings occur (all the domain crossing logic moves from the controller into the memory components).

FIG. 6 represents the case in which all three clock phases (address, read data, and write data) are made the same at each memory component, FIG. 23 represents the case in which all three clock phases (address, read data, and write data) are made the same at the memory controller, and FIG. 22 represents one possible intermediate case. This range of cases is shown to emphasize that various embodiments of the invention may be implemented with various phasing. The memory controller and memory components can be readily configured to support any combination of clock phasing.

Figure 24:
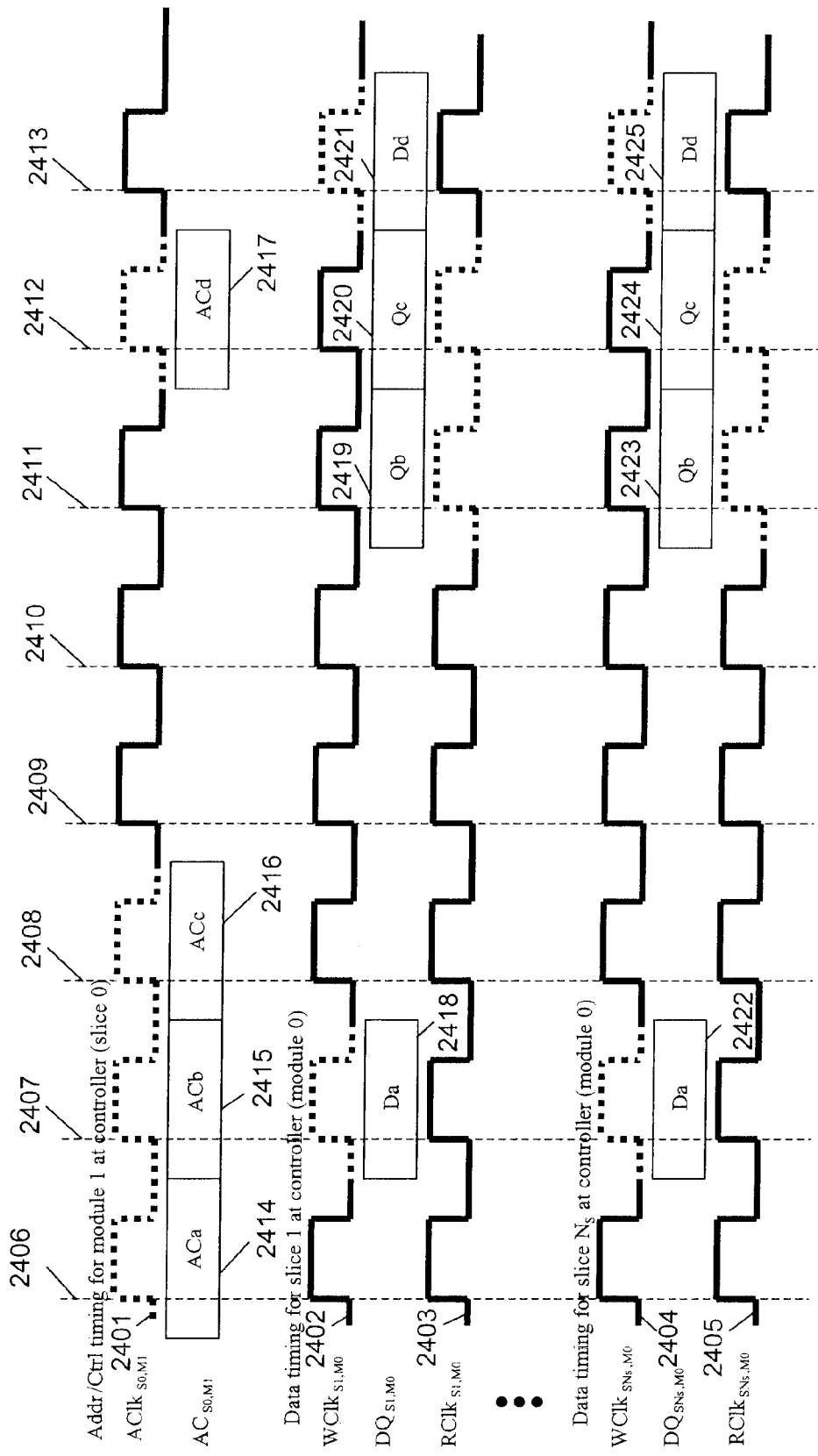
FIG. 24 is a timing diagram illustrating timing at the memory controller component for the example of the data clocking arrangement illustrated in FIG. 23 in accordance with an embodiment of the invention.
Figure 25:
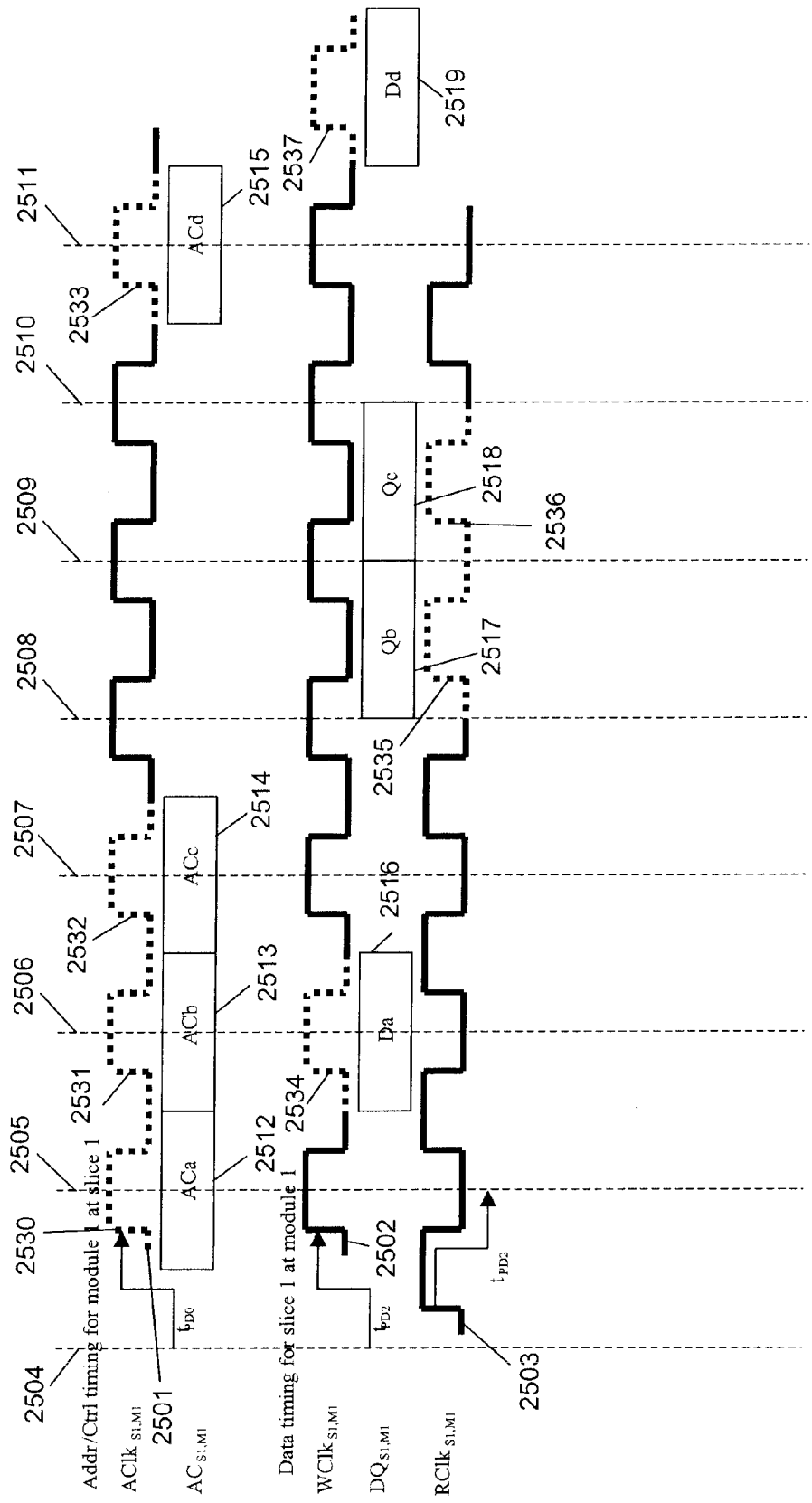
FIG. 25 is a timing diagram illustrating timing at a first slice of a rank of memory components for the example of the data clocking arrangement illustrated in FIG. 23 in accordance with an embodiment of the invention.
Figure 26:
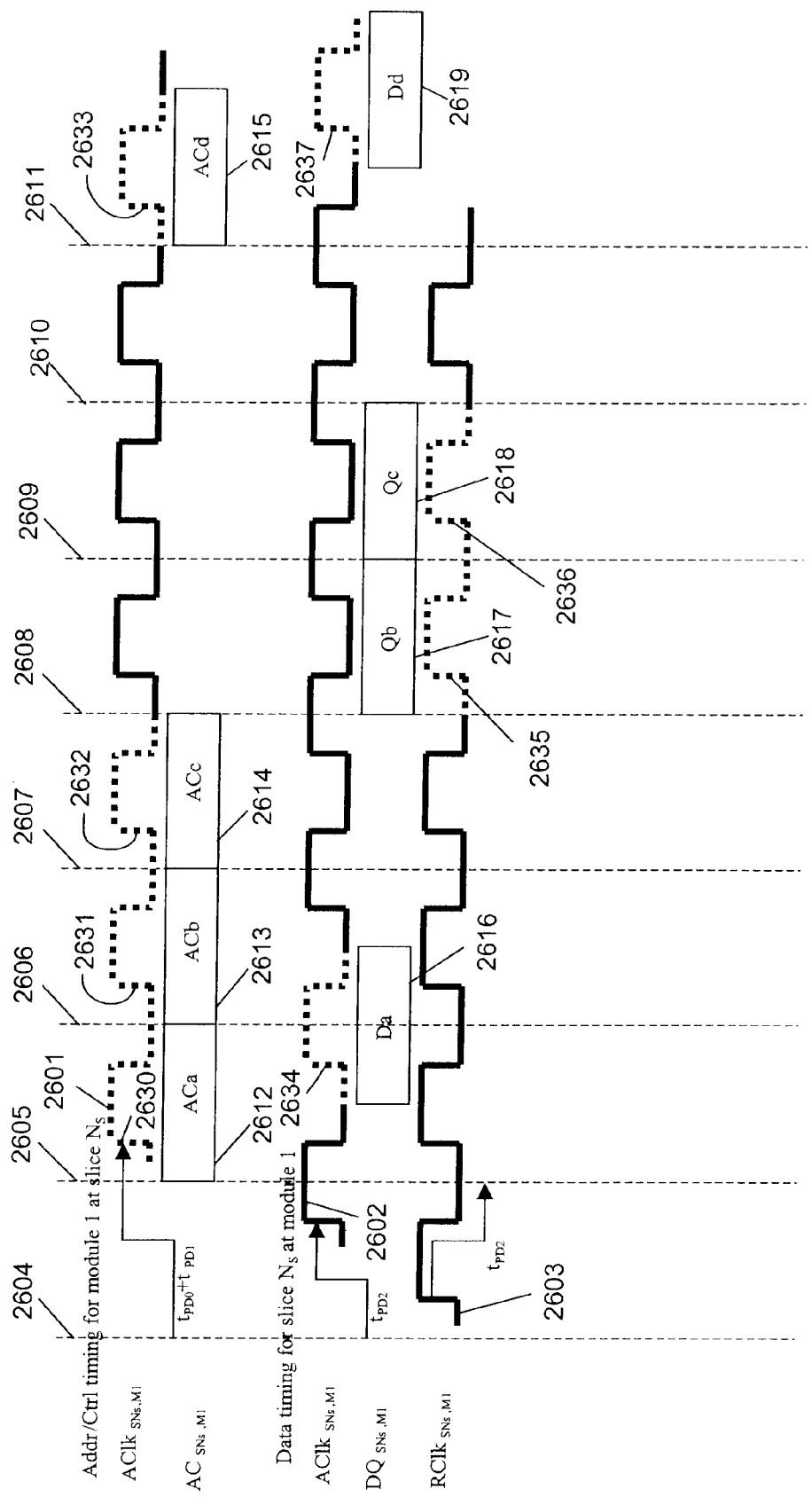
FIG. 26 is a timing diagram illustrating timing a last slice of a rank of memory components for the example of the data clocking arrangement illustrated in FIG. 23 in accordance with an embodiment of the invention.

The one extreme case in which all three clock phases (address, read data, and write data) are made the same at each memory component (illustrated in FIGS. 5 through 21) is important because there is a single clock domain within each memory component. The other extreme case in which all three clock phases (address, read data, and write data) are made the same at the memory controller (FIG. 23) is also important because there is a single clock domain within the controller. FIGS. 24 through 26 further illustrate this case.

FIG. 24 is a timing diagram illustrating timing at the memory controller component for the example of the data clocking arrangement illustrated in FIG. 23 in accordance with an embodiment of the invention. The waveforms of $ACIk_{S0,M1}$ clock signal 2401 are illustrated to show the address/control timing for memory module one from the perspective of the memory controller component at slice 0. The rising edges of sequential cycles of $ACIk_{S0,M1}$ clock signal 2401 occur at times 2406, 2407, 2408, 2409, 2410, 2411, 2412, and 2413, respectively. Address information ACa 2414 is present on the address signal lines at the controller at time 2406. Address information ACb 2415 is present at time 2407. Address information ACc 2416 is present at time 2408. Address information ACd 2417 is present at time 2412.

The waveforms of $WCIk_{S1,M0}$ clock signal 2402 and $RCIk_{S1,M0}$ clock signal 2403 are illustrated to show the data timing for slice 1 from the perspective of the memory controller component at module 0. Write datum information Da 2418 is present on the data lines at the controller at time 2407. Read datum information Qb 2419 is present at time 2411. Read datum information Qc 2420 is present at time 2412. Write datum information Dd 2421 is present at time 2413.

The waveforms of $WCIk_{SNs,M0}$ clock signal 2404 and $RCIk_{SNs,M0}$ clock signal 2405 are illustrated to show the data timing for slice $N_S$ from the perspective of the memory controller component at module 0. Write datum information Da 2422 is present on the data lines at the controller at time 2407. Read datum information Qb 2423 is present at time 2411. Read datum information Qc 2424 is present at time 2412. Write datum information Dd 2425 is present at time 2413.

FIGS. 24 through 26 show the overall system timing for the case in which all clock phases are aligned at the controller. FIG. 24 is the timing at the controller, and is analogous to FIG. 7, except for the fact that the clocks are all common at the controller instead of at each memory slice. As a result, the clocks are all aligned in FIG. 24, and the two-cycle gap that the controller inserts into the write-read-read-write sequence is apparent between address packets ACc and ACd.

FIG. 25 is a timing diagram illustrating timing at a first slice of a rank of memory components for the example of the data clocking arrangement illustrated in FIG. 23 in accordance with an embodiment of the invention. The waveforms of $ACIk_{S1,M1}$ clock signal 2501 is illustrated to show the address/control timing for memory module one from the perspective of the memory component at slice 1. Times 2504, 2505, 2506, 2507, 2508, 2509, 2510, and 2511 correspond to times 2406, 2407, 2408, 2409, 2410, 2411, 2412, and 2413, respectively, of FIG. 24. Signal $ACIk_{S1,M1}$ 2501 is delayed by a delay of $t_{PD0}$ relative to signal $ACIk_{S0,M1}$ 2401 in FIG. 24. In other words, the AClk signal takes a time period $t_{PD0}$ to propagate from the controller to the memory component. Address information ACa 2512 is associated with edge 2530 of signal 2501. Address information ACb 2513 is associated with edge 2531 of signal 2501. Address information ACc 2514 is associated with edge 2532 of signal 2501. Address information ACd 2515 is associated with edge 2533 of signal 2501.

The waveforms of $WCIk_{S1,M1}$ clock signal 2502 and $RCIk_{S1,M1}$ clock signal 2503 are illustrated to show the data timing for slice 1 from the perspective of the memory component at module 1. FIG. 25 shows the timing at the first memory component (slice 1), and the clocks have become misaligned because of the propagation delays $t_{PD2}$ and $t_{PD0}$. Signal $WCIk_{S1,M1}$ 2502 is delayed by a delay of $t_{PD2}$ relative to signal $WCIk_{S1,M1}$ 2402 of FIG. 24. Write datum information Da 2516 is associated with edge 2534 of signal 2502. Write datum information Dd 2519 is associated with edge 2537 of signal 2502. Signal $RCIk_{S1,M1}$ 2503 precedes by $t_{PD2}$ signal $RCIk_{S1,M0}$ 2403 of FIG. 24. Read datum information Qb 2517 is associated with edge 2535 of signal 2503. Read datum information Qc 2518 is associated with edge 2536 of signal 2503.

FIG. 26 is a timing diagram illustrating timing a last slice of a rank of memory components for the example of the data clocking arrangement illustrated in FIG. 23 in accordance with an embodiment of the invention. The waveforms of $ACIk_{SNs,M1}$ clock signal 2601 are illustrated to show the address/control timing for memory module one from the perspective of the memory component at slice $N_S$. Times 2604, 2605, 2606, 2607, 2608, 2609, 2610, and 2611 correspond to times 2406, 2407, 2408, 2409, 2410, 2411, 2412, and 2413, respectively, of FIG. 24. Signal $ACIk_{SNs,M1}$ 2601 is delayed by a delay of $t_{PD0}+t_{PD1}$ relative to signal $ACIk_{S0,M1}$ 2401 of FIG. 24. In other words, address information ACa 2612 is associated with edge 2630 of signal 2601. Address information ACb 2613 is associated with edge 2631 of signal 2601. Address information ACc 2614 is associated with edge 2632 of signal 2601. Address information ACd 2615 is associated with edge 2633 of signal 2601.

The waveforms of $WCIk_{SNs,M1}$ clock signal 2602 and $RCIk_{SNs,M1}$ clock signal 2603 are illustrated to show the data timing for slice $N_S$ from the perspective of the memory component at module 1. Signal $WCIk_{SNs,M1}$ 2602 is delayed by a delay of $t_{PD2}$ relative to signal $WCIk_{S1,M0}$ 2402 of FIG. 24. Write datum information Da 2616 is associated with edge 2634 of signal 2602 (e.g., the write datum information Da 2616 is present on the data bus at the memory component when edge 2634 of signal 2602 is present on the AClk clock conductor at the memory component). Write datum information Dd 2619 is associated with edge 2637 of signal 2602. Signal $RCIk_{SNs,M1}$ 2603 precedes by $t_{PD2}$ signal $RCIk_{S1,M0}$ 2603 of FIG. 24. Read datum information Qb 2617 is associated with edge 2635 of signal 2603. Read datum information Qc 2618 is associated with edge 2636 of signal 2603.

FIG. 26 shows the timing at the last memory component (slice $N_S$), and the clocks have become further misaligned because of the propagation delays $t_{PD1}$. As a result, each memory component will have domain crossing hardware similar to that which is in the controller, as described with respect to FIGS. 12-21.

As a reminder, the example system described in FIG. 2 included single memory module, a single rank of memory components on that module, a common address and control bus (so that each controller pin connects to a pin on each of two or more memory components), and a sliced data bus (wherein each controller pin connects to a pin on exactly one memory component). These characteristics were chosen for the example embodiment in order to simplify the discussion of the details and because this configuration is an illustrative special case. However, the clocking methods that have been discussed can be extended to a wider range of system topologies. Thus, it should be understood that embodiments of the invention may be practiced with systems having features that differ from the features of the example system of FIG. 2.

The rest of this discussion focuses on systems with multiple memory modules or multiple memory ranks per module (or both). In these systems, each data bus wire connects to one controller pin and to one pin on each of two or more memory components. Since the $t_{PD2}$ propagation delay between the controller and each of the memory components will be different, the clock domain crossing issue in the controller becomes more complicated. If the choice is made to align all clocks in each memory component, then the controller will need a set of domain crossing hardware for each rank or module of memory components in a slice. This suffers from a drawback in that it requires a large amount of controller area and that it adversely affects critical timing paths. As such, in a multiple module or multiple rank system, it may be preferable to keep all of the clocks aligned in the controller, and to place the domain crossing logic in the memory components.

Figure 27:
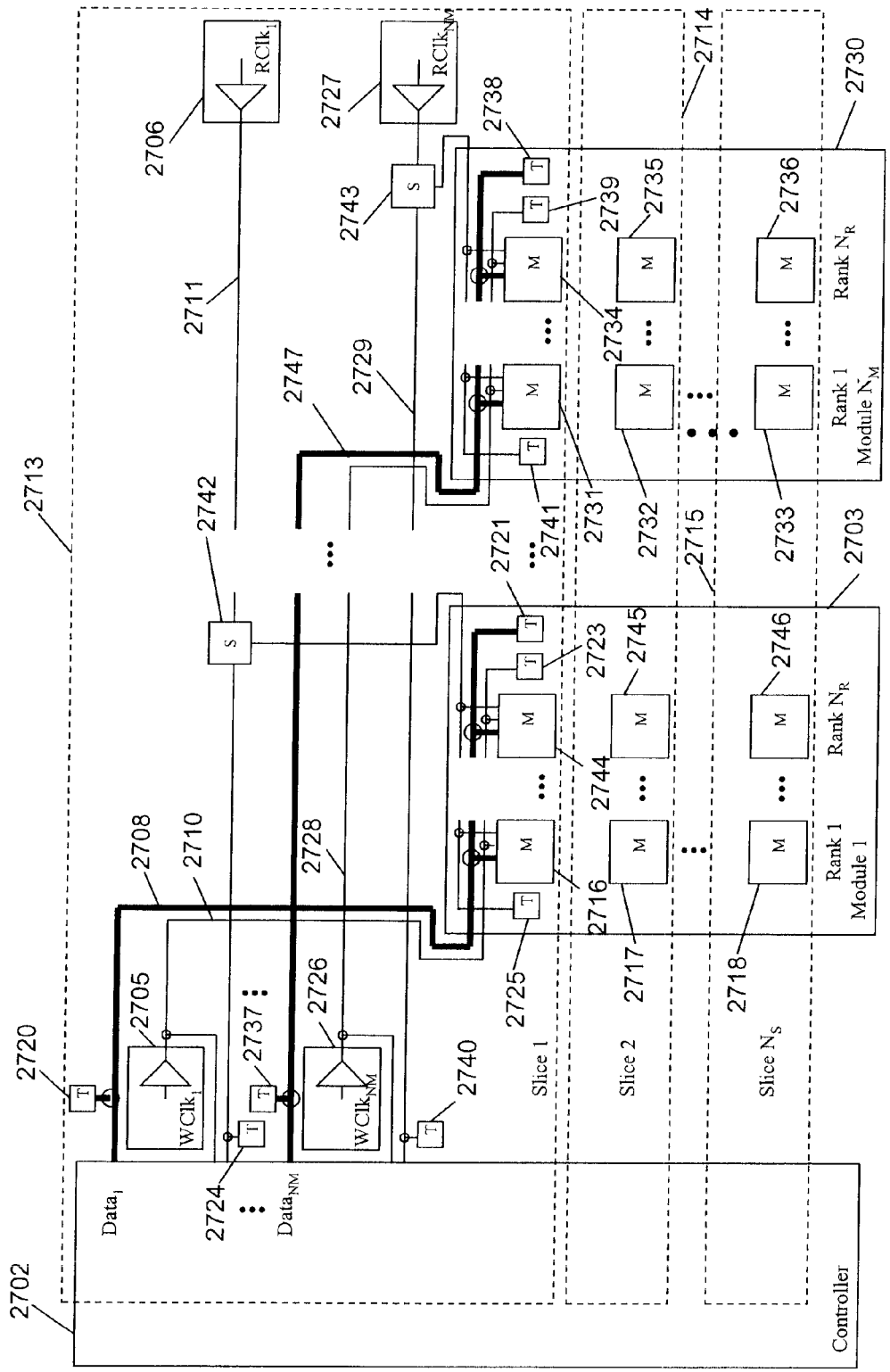
FIG. 27 is a block diagram illustrating a memory system that may comprise multiple ranks of memory components and multiple memory modules in accordance with an embodiment of the invention.

FIG. 27 is a block diagram illustrating a memory system that includes multiple ranks of memory components and multiple memory modules in accordance with an embodiment of the invention. The memory system comprises memory controller component 2702, memory module 2703, memory module 2730, write clock 2705, read clock 2706, write clock 2726, read clock 2727, splitting component 2742, splitting component 2743, termination component 2720, termination component 2724, termination component 2737, and termination component 2740. It should be understood that there is at least one write clock per slice in the example system shown.

Within each memory module, memory components are organized in ranks. A first rank of memory module 2703 includes memory components 2716, 2717, and 2718. A second rank of memory module 2703 includes memory components 2744, 2745, and 2746. A first rank of memory module 2730 includes memory components 2731, 2732, and 2733. A second rank of memory module 2730 includes memory components 2734, 2735, and 2736.

The memory system is organized into slices across the memory controller component and the memory modules. Examples of these slices include slice 2713, slice 2714, and slice 2715. Each slice comprises one memory component of each rank. In this embodiment, each slice within each memory module is provided with its own data bus 2708, write clock conductor 2710, and read clock conductor 2711. Data bus 2708 is coupled to memory controller component 2702, memory component 2716, and memory component 2744. A termination component 2720 is coupled to data bus 2708 near memory controller component 2702, and may, for example, be incorporated into memory controller component 2702. A termination component 2721 is coupled near an opposite terminus of data bus 2708, and is preferably provided within memory module 2703. Write clock 2705 is coupled to write clock conductor 2710, which is coupled to memory controller component 2702 and to memory components 2716 and 2744. A termination component 2723 is coupled near a terminus of write clock conductor 2710 near memory components 2716 and 2744, preferably within memory module 2703. Read clock 2706 is coupled to read clock conductor 2711, which is coupled through splitting component 2742 to memory controller component 2702 and memory components 2716 and 2744. Splitting components are described in additional detail below. A termination component 2724 is coupled near memory controller component 2702, and may, for example, be incorporated into memory controller component 2702. A termination component 2725 is coupled near a terminus of read clock conductor 2711 near memory components 2716 and 2744, preferably within memory module 2703.

Slice 2713 of memory module 2730 is provided with data bus 2747, write clock conductor 2728, read clock conductor 2729. Data bus 2747 is coupled to memory controller component 2702, memory component 2731, and memory component 2734. A termination component 2737 is coupled to data bus 2747 near memory controller component 2702, and may, for example, be incorporated into memory controller component 2702. A termination component 2738 is coupled near an opposite terminus of data bus 2747, and is preferably provided within memory module 2730. Write clock 2726 is coupled to write clock conductor 2728, which is coupled to memory controller component 2702 and to memory components 2731 and 2734. A termination component 2739 is coupled near a terminus of write clock conductor 2728 near memory components 2731 and 2734, preferably within memory module 2730. Read clock 2727 is coupled to read clock conductor 2729, which is coupled through splitting component 2743 to memory controller component 2702 and memory components 2731 and 2734. A termination component 2740 is coupled near memory controller component 2702, and may, for example, be incorporated into memory controller component 2702. A termination component 2741 is coupled near a terminus of read clock conductor 2729 near memory components 2731 and 2734, preferably within memory module 2730.

The sliced data bus can be extended to multiple ranks of memory component and multiple memory components in a memory system. In this example, there is a dedicated data bus for each slice of each module. Each data bus is shared by the ranks of memory devices on each module. It is preferable to match the impedances of the wires as they transition from the main printed wiring board onto the modules so that they do not differ to an extent that impairs performance. In some embodiments, the termination components are on each module. A dedicated read and write clock that travels with the data is shown for each data bus, although these could be regarded as virtual clocks; i.e. the read and write clocks could be synthesized from the address/control clock as in the example system that has already been described.

Figure 28:
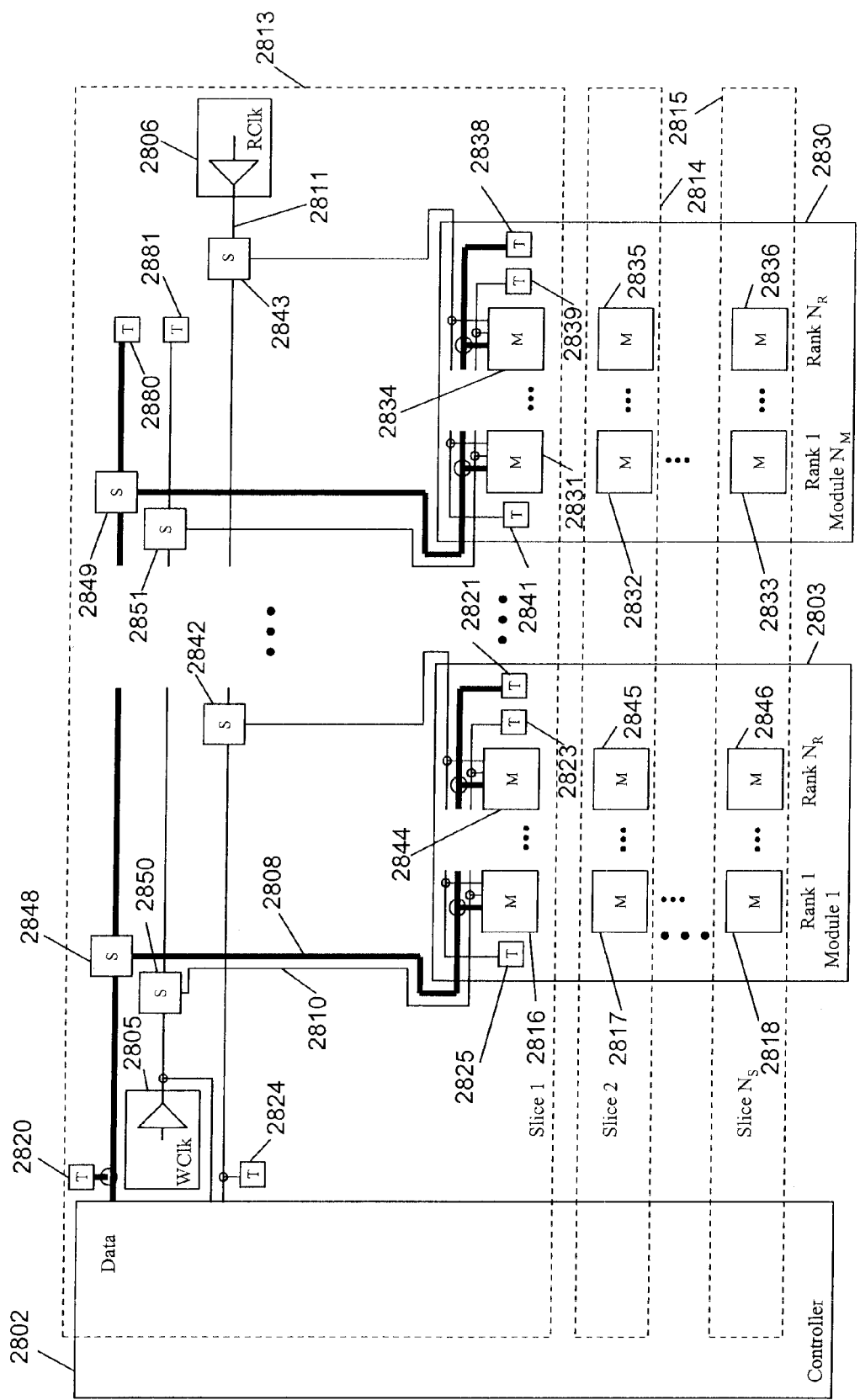
FIG. 28 is a block diagram illustrating a memory system that may comprise multiple ranks of memory components and multiple memory modules in accordance with an embodiment of the invention.

FIG. 28 is a block diagram illustrating a memory system that includes multiple ranks of memory components and multiple memory modules in accordance with an embodiment of the invention. The memory system comprises memory controller component 2802, memory module 2803, memory module 2830, write clock 2805, read clock 2806, splitting component 2842, splitting component 2843, splitting component 2848, splitting component 2849, splitting component 2850, splitting component 2851, termination component 2820, termination component 2824, termination component 2880, and termination component 2881.

Within each memory module, memory components are organized in ranks. A first rank of memory module 2803 includes memory components 2816, 2817, and 2818. A second rank of memory module 2803 includes memory components 2844, 2845, and 2846. A first rank of memory module 2830 includes memory components 2831, 2832, and 2833. A second rank of memory module 2830 includes memory components 2834, 2835, and 2836.

The memory system is organized into slices across the memory controller component and the memory modules. Examples of these slices include slice 2813, slice 2814, and slice 2815. Each slice comprises one memory component of each rank. In this embodiment, each slice across multiple memory modules is provided with a data bus 2808, write clock conductor 2810, and read clock conductor 2811. Data bus 2808 is coupled to memory controller component 2802, via splitter 2848 to memory components 2816 and 2844, and via splitter 2849 to memory components 2831 and 2834. A termination component 2820 is coupled to data bus 2808 near memory controller component 2802, and may, for example, be incorporated into memory controller component 2802. A termination component 2880 is coupled near an opposite terminus of data bus 2808, near splitter 2849. A termination component 2821 is coupled near memory components 2816 and 2844 and is preferably provided within memory module 2803. A termination component 2838 is coupled near memory components 2831 and 2834 and is preferably provided within memory module 2830.

Write clock 2805 is coupled to write clock conductor 2810, which is coupled to memory controller component 2802, via splitter 2850 to memory components 2816 and 2844, and via splitter 2851 to memory components 2831 and 2834. A termination component 2881 is coupled near a terminus of write clock conductor 2810, near splitter 2851. A termination component 2823 is coupled near memory components 2816 and 2844, preferably within memory module 2803. A termination component 2839 is coupled near memory components 2831 and 2834, preferably within memory module 2830.

Read clock 2806 is coupled to read clock conductor 2811, which is coupled through splitting component 2843 to memory components 2831 and 2834 and through splitting component 2842 to memory controller component 2802 and memory components 2816 and 2844. A termination component 2824 is coupled near memory controller component 2802, and may, for example, be incorporated into memory controller component 2802. A termination component 2825 is coupled near a terminus of read clock conductor 2811 near memory components 2816 and 2844, preferably within memory module 2803. A termination component 2841 is coupled near a terminus of read clock conductor 2811 near memory components 2831 and 2834, preferably within memory module 2830.

As illustrated, this example utilizes a single data bus per data slice that is shared by all the memory modules, as in FIG. 28. In this example, each data wire is tapped using some form of splitting component S. This splitter could be a passive impedance matcher (three resistors in a delta- or y-configuration) or some form of active buffer or switch element. In either case, the electrical impedance of each wire is maintained down its length (within manufacturing limits) so that signal integrity is kept high. As in the previous configuration, each split-off data bus is routed onto a memory module, past all the memory components in the slice, and into a termination component.

Figure 29:
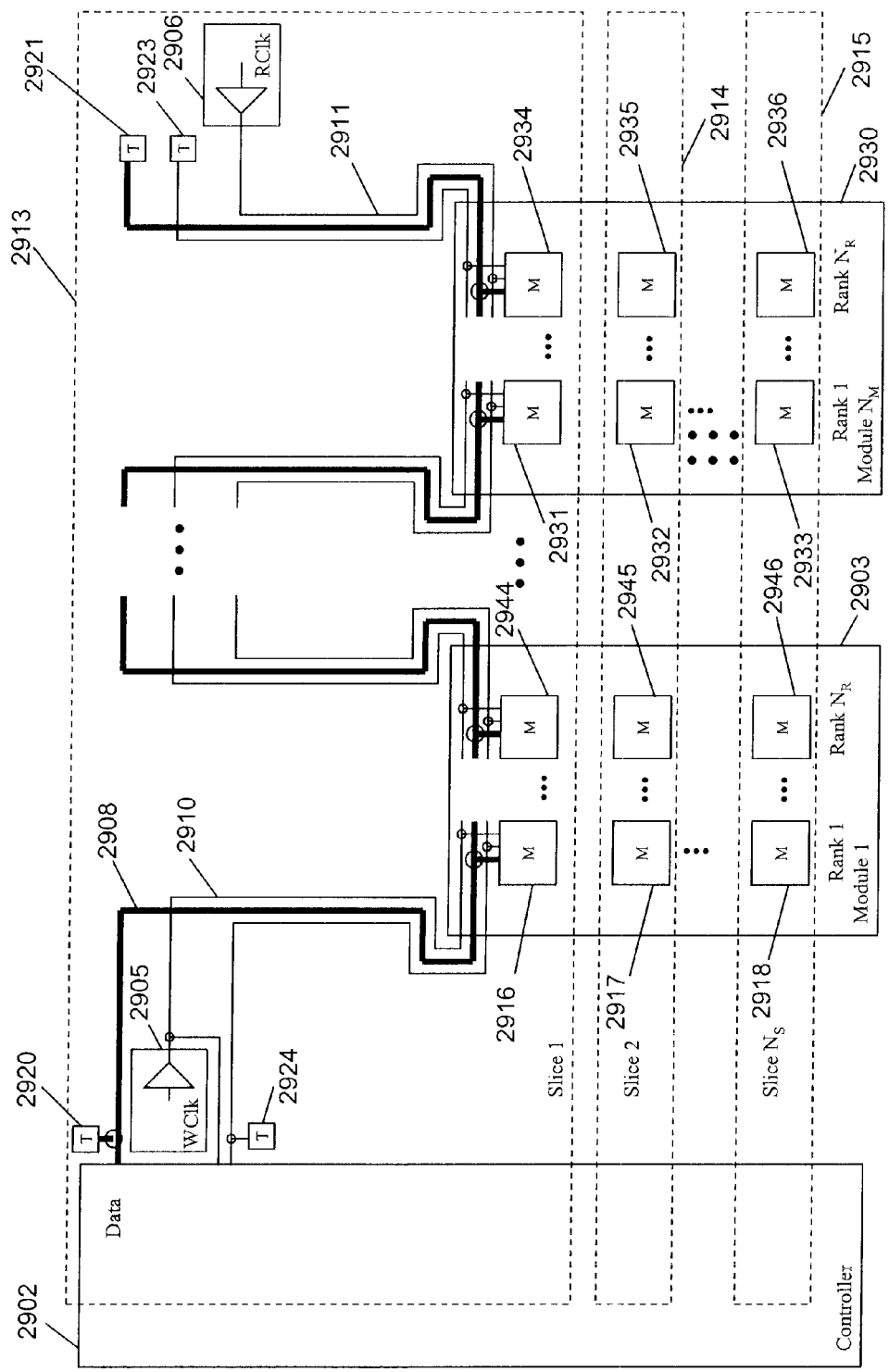
FIG. 29 is a block diagram illustrating a memory system that comprises multiple ranks of memory components and multiple memory modules in accordance with an embodiment of the invention.

FIG. 29 is a block diagram illustrating a memory system that comprises multiple ranks of memory components and multiple memory modules in accordance with an embodiment of the invention. The memory system comprises memory controller component 2902, memory module 2903, memory module 2930, write clock 2905, read clock 2906, termination component 2920, termination component 2921, termination component 2923, and termination component 2924.

Within each memory module, memory components are organized in ranks. A first rank of memory module 2903 includes memory components 2916, 2917, and 2918. A second rank of memory module 2903 includes memory components 2944, 2945, and 2946. A first rank of memory module 2930 includes memory components 2931, 2932, and 2933. A second rank of memory module 2930 includes memory components 2934, 2935, and 2936.

The memory system is organized into slices across the memory controller component and the memory modules. Examples of these slices include slice 2913, slice 2914, and slice 2915. Each slice comprises one memory component of each rank. In this embodiment, each slice across memory modules shares a common daisy-chained data bus 2908, a common daisy-chained write clock conductor 2910, and a common daisy-chained read clock conductor 2911. Data bus 2908 is coupled to memory controller component 2902, memory component 2916, memory component 2944, memory component 2931, and memory component 2934. A termination component 2920 is coupled to data bus 2908 near memory controller component 2902, and may, for example, be incorporated into memory controller component 2902. A termination component 2921 is coupled near an opposite terminus of data bus 2908.

Write clock 2905 is coupled to write clock conductor 2910, which is coupled to memory controller component 2902 and to memory components 2916, 2944, 2931, and 2934. A termination component 2923 is coupled near a terminus of write clock conductor 2910. Read clock 2906 is coupled to read clock conductor 2911, which is coupled to memory controller component 2902 and memory components 2916, 2944, 2931, and 2934. A termination component 2924 is coupled near memory controller component 2902, and may, for example, be incorporated into memory controller component 2902.

In this embodiment, there is a single data bus per data slice, but instead of using splitting components, each data wire is routed onto a memory module, past all the memory components of the slice, and back off the module and onto the main board to "chain" through another memory module or to pass into a termination component. The same three configuration alternatives described above with respect to the data bus are also applicable to a common control/address bus in a multi-module, multi-rank memory system.

Figure 30:
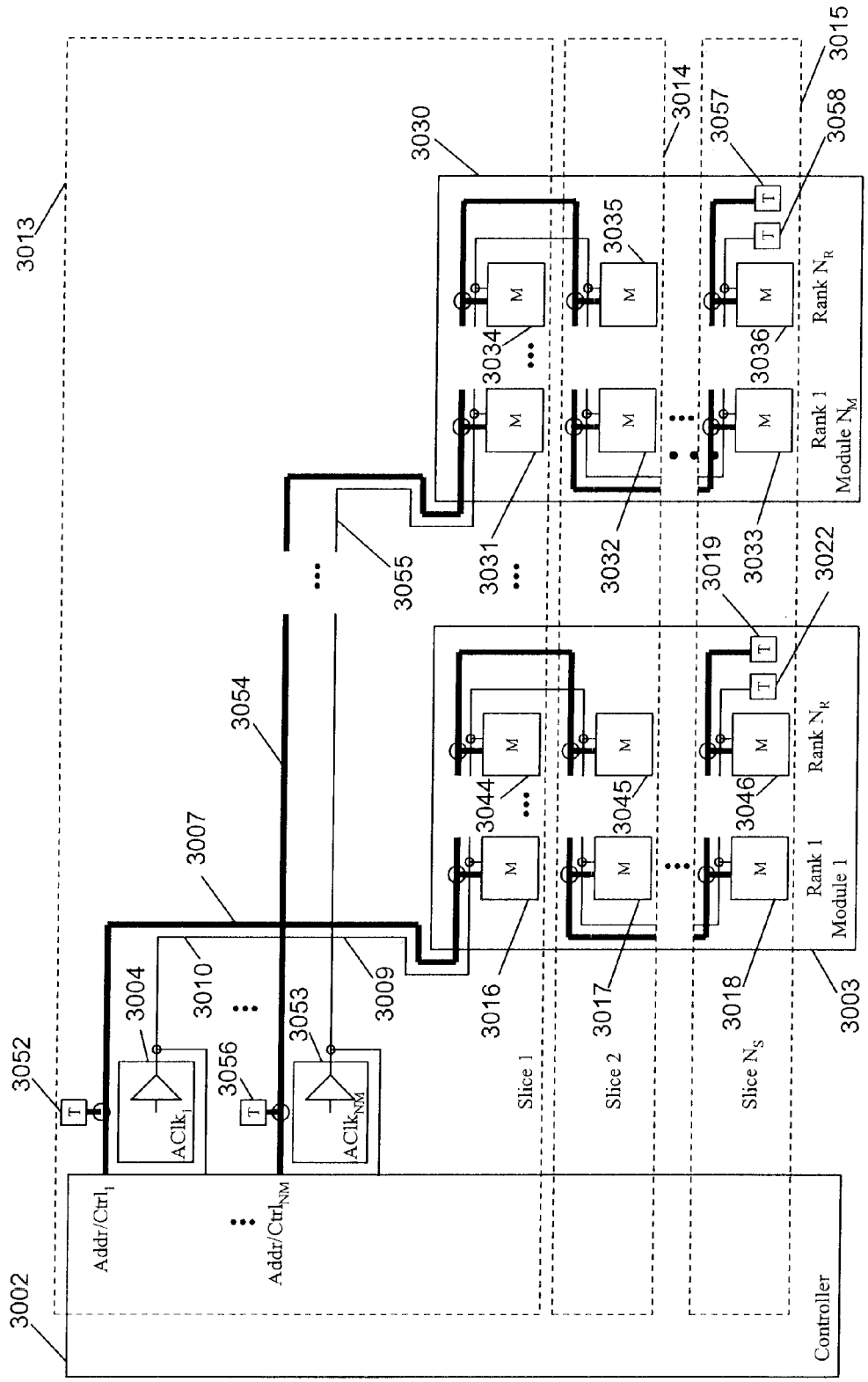
FIG. 30 is a block diagram illustrating a memory system that comprises multiple ranks of memory components and multiple memory modules with a dedicated control/address bus per memory module in accordance with an embodiment of the invention.

FIG. 30 is a block diagram illustrating a memory system that comprises multiple ranks of memory components and multiple memory modules with a dedicated control/address bus per memory module in accordance with an embodiment of the invention. The memory system comprises memory controller component 3002, memory module 3003, memory module 3030, address/control clock 3004, address/control clock 3053, termination component 3052, and termination component 3056.

Within each memory module, memory components are organized in ranks. A first rank of memory module 3003 includes memory components 3016, 3017, and 3018. A second rank of memory module 3003 includes memory components 3044, 3045, and 3046. A first rank of memory module 3030 includes memory components 3031, 3032, and 3033. A second rank of memory module 3030 includes memory components 3034, 3035, and 3036.

The memory system is organized into slices across the memory controller component and the memory modules. Examples of these slices include slice 3013, slice 3014, and slice 3015. Each slice comprises one memory component of each rank. In this embodiment, each memory module is provided with its own address bus 3007 and address/control clock conductor 3010. Address bus 3007 is coupled to memory controller component 3002 and memory components 3016, 3017, 3018, 3044, 3045, and 3046. A termination component 3052 is coupled to address bus 3007 near memory controller component 3002, and may, for example, be incorporated into memory controller component 3002. A termination component 3019 is coupled near an opposite terminus of address bus 3007, and is preferably provided within memory module 3003. Address/control clock 3004 is coupled to address/control clock conductor 3009, which is coupled to memory controller component 3002 and to memory components 3016, 3017, 3018, 3044, 3045, and 3046. A termination component 3022 is coupled near a terminus of address/control clock conductor 3009, preferably within memory module 3003.

Memory module 3030 is provided with address bus 3054 and address/control clock conductor 3055. Address bus 3054 is coupled to memory controller component 3002 and to memory components, 3031, 3032, 3033, 3034, 3035, and 3036. A termination component 3056 is coupled to address bus 3054 near memory controller component 3002, and may, for example, be incorporated into memory controller component 3002. A termination component 3057 is coupled near an opposite terminus of address bus 3054 and is preferably provided within memory module 3030. Address/control clock 3053 is coupled to address/control clock conductor 3055, which is coupled to memory controller component 3002 and to memory components 3031, 3032, 3033, 3034, 3035, and 3036. A termination component 3058 is coupled near a terminus of address/control clock conductor 3055, preferably within memory module 3030.

Each control/address wire is routed onto a memory module, past all the memory components, and into a termination component. The wire routing is shown in the direction of the ranks on the module, but it could also be routed in the direction of slices.

Figure 31:
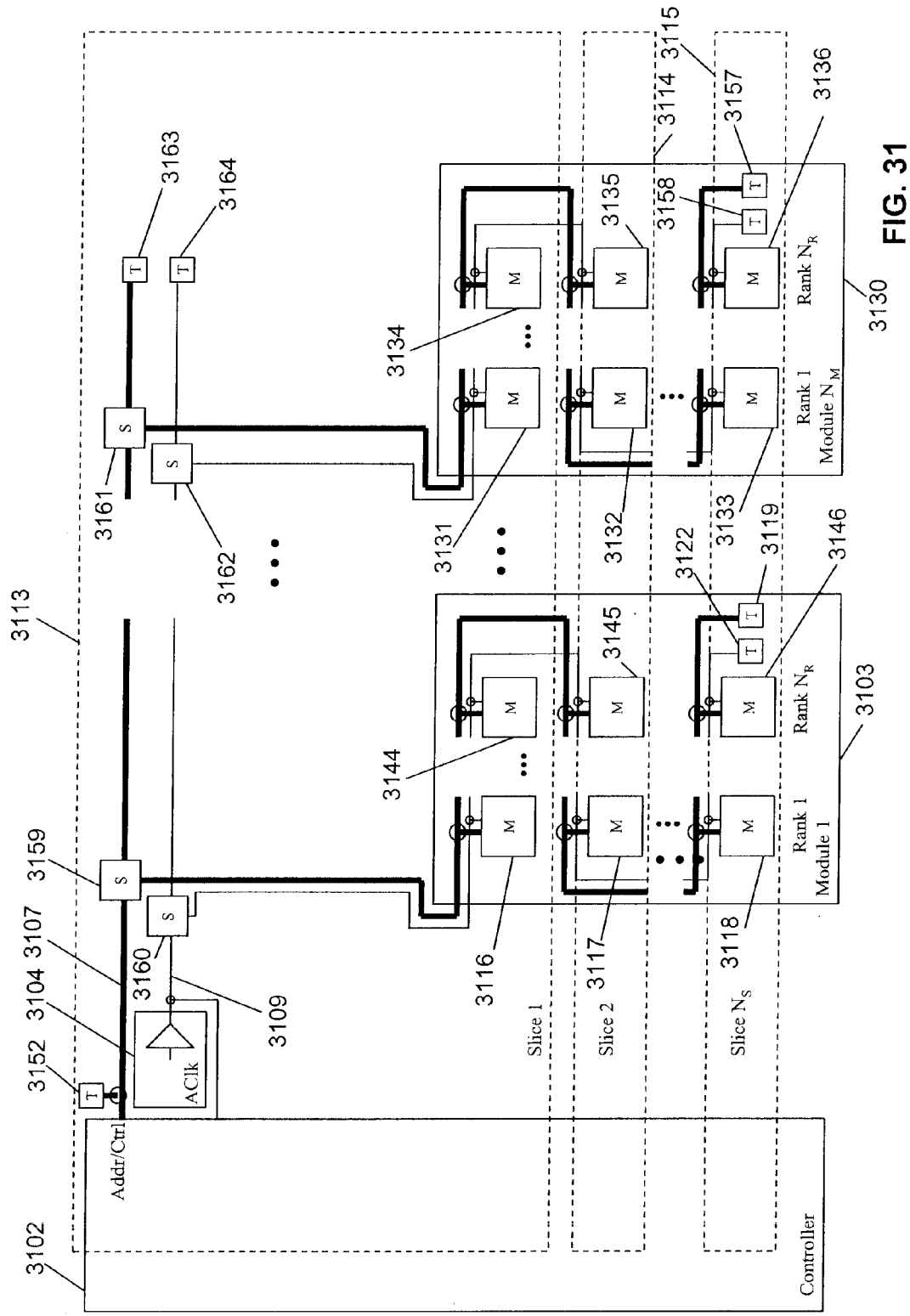
FIG. 31 is a block diagram illustrating a memory system that comprises multiple ranks of memory components and multiple memory modules with a single control/address bus that is shared among the memory modules in accordance with an embodiment of the invention.

FIG. 31 is a block diagram illustrating a memory system that comprises multiple ranks of memory components and multiple memory modules with a single control/address bus that is shared among the memory modules in accordance with an embodiment of the invention. The memory system comprises memory controller component 3102, memory module 3103, memory module 3130, address/control clock 3104, splitting component 3159, splitting component 3160, splitting component 3161, splitting component 3162, termination component 3163, and termination component 3164.

Within each memory module, memory components are organized in ranks. A first rank of memory module 3103 includes memory components 3116, 3117, and 3118. A second rank of memory module 3103 includes memory components 3144, 3145, and 3146. A first rank of memory module 3130 includes memory components 3131, 3132, and 3133. A second rank of memory module 3130 includes memory components 3134, 3135, and 3136.

The memory system is organized into slices across the memory controller component and the memory modules. Examples of these slices include slice 3113, slice 3114, and slice 3115. Each slice comprises one memory component of each rank. In this embodiment, an address bus 3107 and an address/control clock conductor 3109 are coupled to each memory component among multiple memory modules. Address bus 3107 is coupled to memory controller component 3102, via splitter 3159 to memory components 3116, 3117, 3118, 3144, 3145, and 3146, and via splitter 3161 to memory components 3131, 3132, 3133, 3134, 3135, and 3136. A termination component 3152 is coupled to address bus 3107 near memory controller component 3102, and may, for example, be incorporated into memory controller component 3102. A termination component 3163 is coupled near an opposite terminus of address bus 3107, near splitter 3161. A termination component 3119 is coupled to address bus 3107, preferably within memory module 3103. A termination component 3157 is coupled to address bus 3107, preferably within memory module 3130.

Address/control clock 3104 is coupled to address/control clock conductor 3109, which is coupled to memory controller component 3102, via splitter 3160 to memory components 3116, 3117, 3118, 3144, 3145, and 3146, and via splitter 3162 to memory components 3131, 3132, 3133, 3134, 3135, and 3136. A termination component 3164 is coupled near a terminus of address/control clock conductor 3109, near splitter 3162. A termination component 3122 is coupled to the address/control clock conductor 3109, preferably within memory module 3103. A termination component 3158 is coupled to the address/control clock conductor 3109, preferably within memory module 3130.

In this example, each control/address wire is tapped using some form of splitting component S. This splitter could be a passive impedance matcher (three resistors in a delta- or y-configuration) or some form of active buffer or switch element. In either case, the electrical impedance of each wire is maintained down its length (within manufacturing limits) so that signal integrity is kept high. As in the previous configuration, each split-off control/address bus is routed onto a memory module, past all the memory components, and into a termination component.

Figure 32:
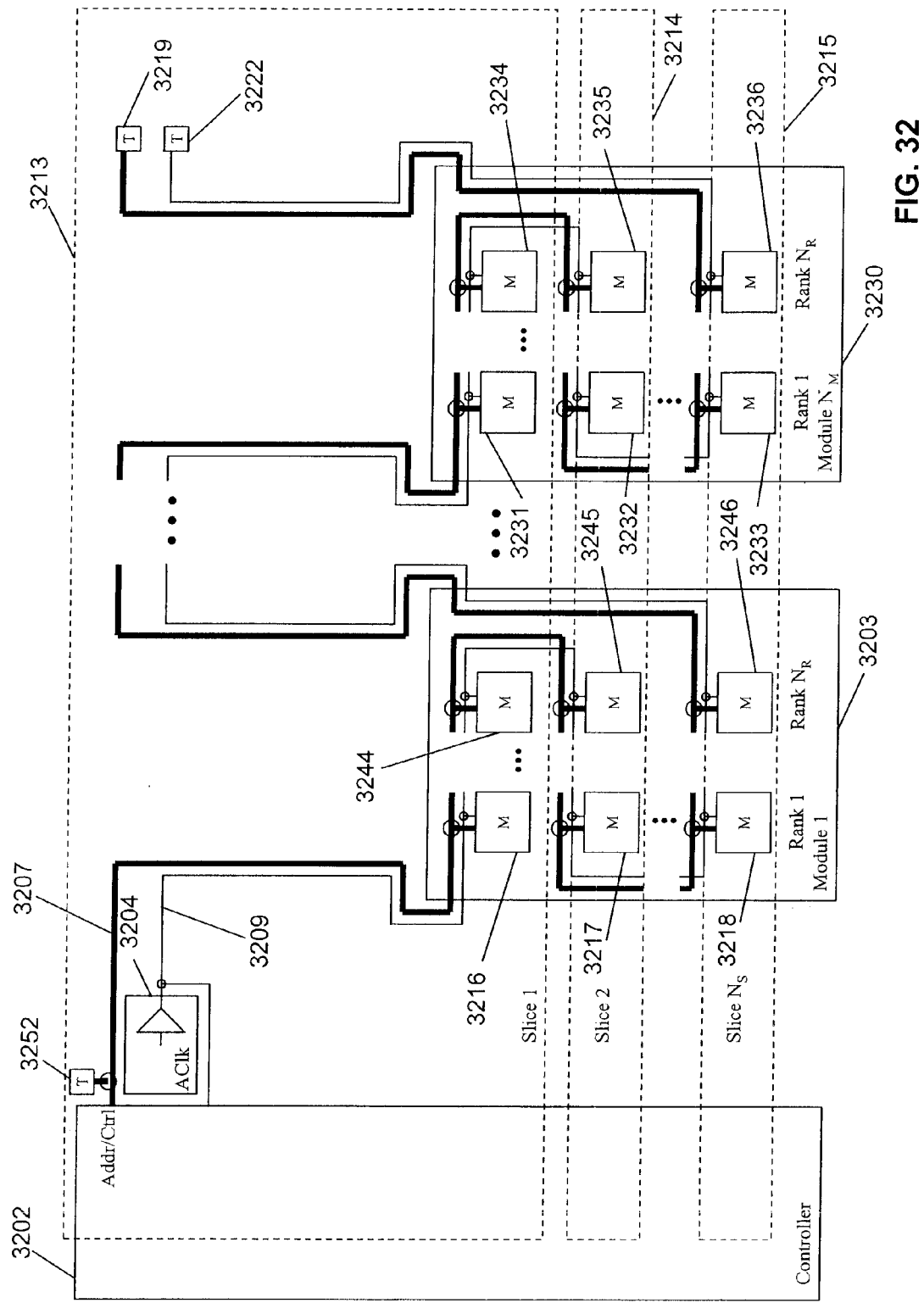
FIG. 32 is a block diagram illustrating a memory system that comprises multiple ranks of memory components and multiple memory modules with a single control/address bus that is shared by all the memory modules in accordance with an embodiment of the invention.

FIG. 32 is a block diagram illustrating a memory system that comprises multiple ranks of memory components and multiple memory modules with a single control/address bus that is shared by all the memory modules in accordance with an embodiment of the invention. The memory system comprises memory controller component 3202, memory module 3203, memory module 3230, address/control clock 3204, termination component 3219, and termination component 3222.

Within each memory module, memory components are organized in ranks. A first rank of memory module 3203 includes memory components 3216, 3217, and 3218. A second rank of memory module 3203 includes memory components 3244, 3245, and 3246. A first rank of memory module 3230 includes memory components 3231, 3232, and 3233. A second rank of memory module 3230 includes memory components 3234, 3235, and 3236.

The memory system is organized into slices across the memory controller component and the memory modules. Examples of these slices include slice 3213, slice 3214, and slice 3215. Each slice comprises one memory component of each rank. In this embodiment, the memory components of the memory modules share a common daisy-chained address bus 3207 and a common daisy-chained address/control clock conductor 3209. Address bus 3207 is coupled to memory controller component 3202 and memory components 3216, 3217, 3218, 3244, 3245, 3246, 3231, 3232, 3233, 3234, 3235, and 3236. A termination component 3252 is coupled to address bus 3207 near memory controller component 3202, and may, for example, be incorporated into memory controller component 3202. A termination component 3219 is coupled near an opposite terminus of address bus 3207.

Address/control clock 3204 is coupled to address/control clock conductor 3209, which is coupled to memory controller component 3202 and to memory components 3216, 3217, 3218, 3244, 3245, 3246, 3231, 3232, 3233, 3234, 3235, and 3236. A termination component 3222 is coupled near a terminus of address/control clock conductor 3209.

Unlike the memory system of FIG. 31, instead of using some kind of splitting component, each control/address wire is routed onto a memory module, past all the memory components, and back off the module and onto the main board to chain through another memory module or to pass into a termination component.

The same three configuration alternatives are possible for a sliced control/address bus in a multi-module, multi-rank memory system. This represents a departure from the systems that have been discussed up to this point—the previous systems all had a control/address bus that was common across the memory slices. It is also possible to instead provide an address/control bus per slice. Each bus is preferably routed along with the data bus for each slice, and preferably has the same topological characteristics as a data bus which only performs write operations.

Figure 33:
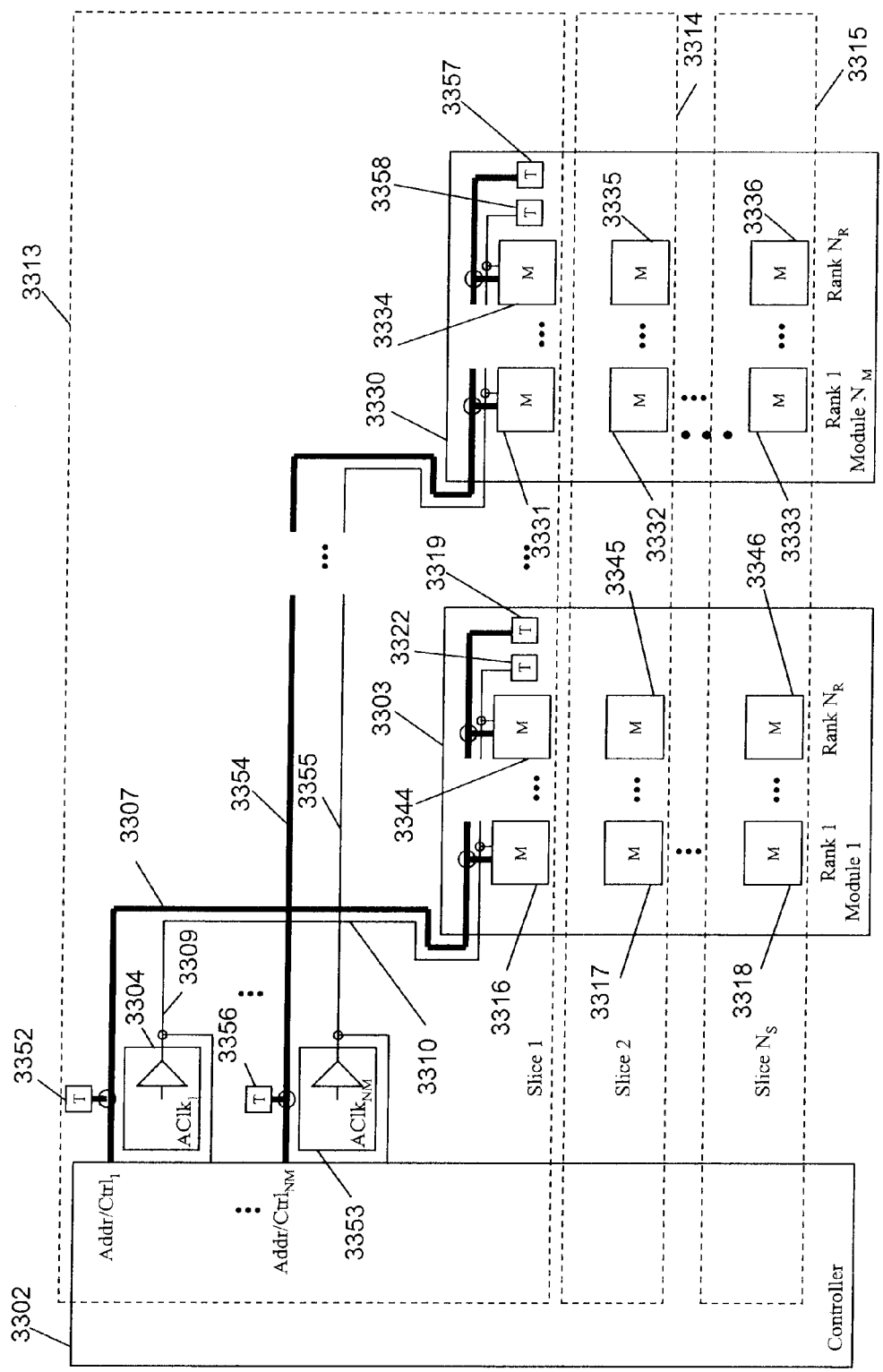
FIG. 33 is a block diagram illustrating a memory system that comprises multiple ranks of memory components and multiple memory modules with a dedicated, sliced control/address bus per memory module in accordance with an embodiment of the invention.

FIG. 33 is a block diagram illustrating a memory system that comprises multiple ranks of memory components and multiple memory modules with a dedicated, sliced control/address bus per memory module in accordance with an embodiment of the invention. The memory system comprises memory controller component 3302, memory module 3303, memory module 3330, address/control clock 3304, address/control clock 3353, termination component 3352, and termination component 3356.

Within each memory module, memory components are organized in ranks. A first rank of memory module 3303 includes memory components 3316, 3317, and 3318. A second rank of memory module 3303 includes memory components 3344, 3345, and 3346. A first rank of memory module 3330 includes memory components 3331, 3332, and 3333. A second rank of memory module 3330 includes memory components 3334, 3335, and 3336.

The memory system is organized into slices across the memory controller component and the memory modules. Examples of these slices include slice 3313, slice 3314, and slice 3315. Each slice comprises one memory component of each rank. In this embodiment, each slice within each memory module is provided with its own address bus 3307 and address/control clock conductor 3310. Address bus 3307 is coupled to memory controller component 3302 and memory components 3316 and 3344. A termination component 3352 is coupled to address bus 3307 near memory controller component 3302, and may, for example, be incorporated into memory controller component 3302. A termination component 3319 is coupled near an opposite terminus of address bus 3307, and is preferably provided within memory module 3303. Address/control clock 3304 is coupled to address/control clock conductor 3309, which is coupled to memory controller component 3302 and to memory components 3316 and 3344. A termination component 3322 is coupled near a terminus of address/control clock conductor 3309, preferably within memory module 3303.

Memory module 3330 is provided with address bus 3354 and address/control clock conductor 3355. Address bus 3354 is coupled to memory controller component 3302 and to memory components, 3331 and 3334. A termination component 3356 is coupled to address bus 3354 near memory controller component 3302, and may, for example, be incorporated into memory controller component 3302. A termination component 3357 is coupled near an opposite terminus of address bus 3354 and is preferably provided within memory module 3330. Address/control clock 3353 is coupled to address/control clock conductor 3355, which is coupled to memory controller component 3302 and to memory components 3331 and 3334. A termination component 3358 is coupled near a terminus of address/control clock conductor 3355, preferably within memory module 3330. Each control/address wire is routed onto a memory module, past all the memory components in the slice, and into a termination component.

Figure 34:
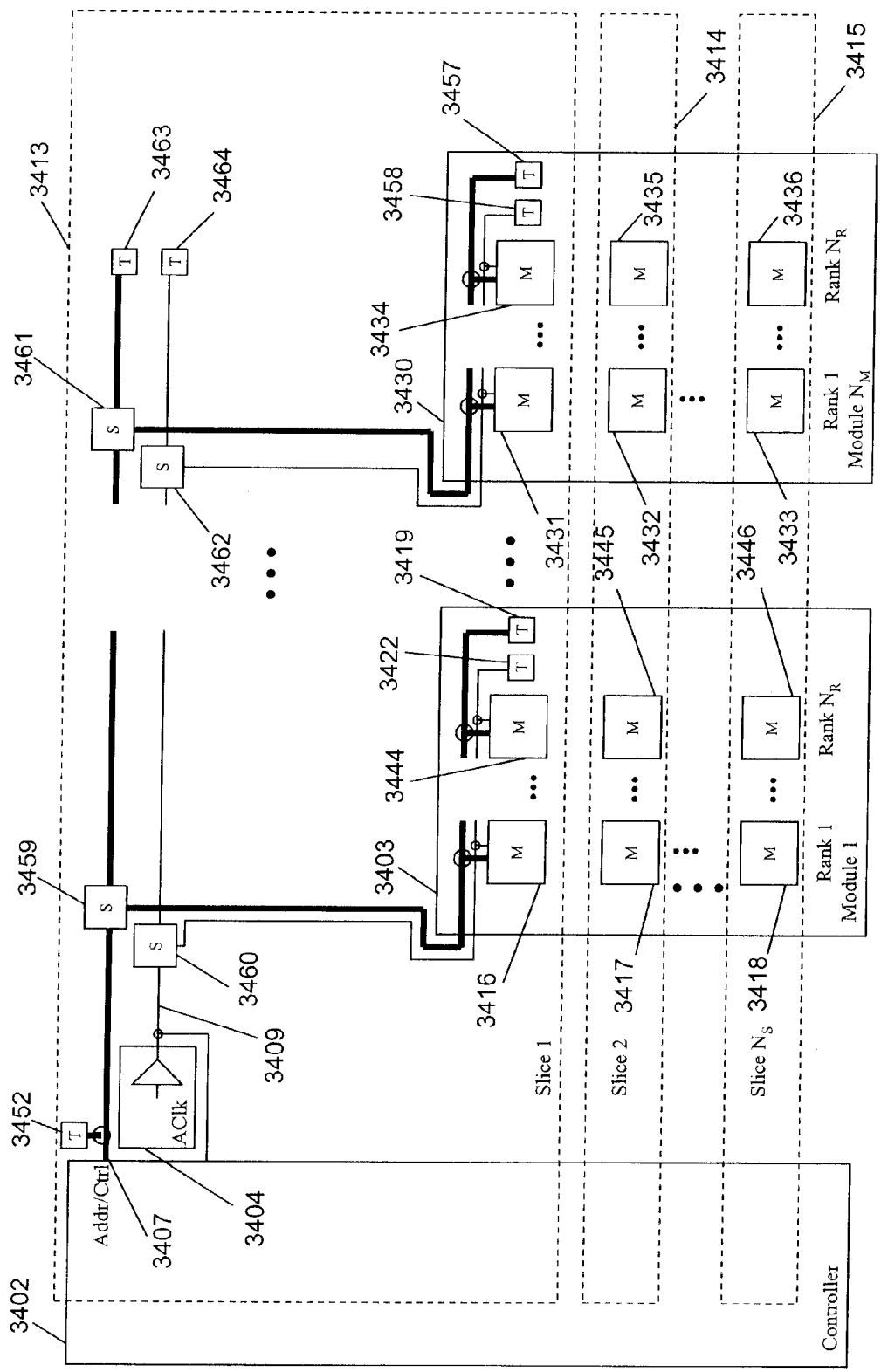
FIG. 34 is a block diagram illustrating a memory system that comprises multiple ranks of memory components and multiple memory modules with a single control/address bus that is shared by all the memory modules in accordance with an embodiment of the invention.

FIG. 34 is a block diagram illustrating a memory system that comprises multiple ranks of memory components and multiple memory modules with a single control/address bus that is shared by all the memory modules in accordance with an embodiment of the invention. The memory system comprises memory controller component 3402, memory module 3403, memory module 3430, address/control clock 3404, splitting component 3459, splitting component 3460, splitting component 3461, splitting component 3462, termination component 3463, and termination component 3464.

Within each memory module, memory components are organized in ranks. A first rank of memory module 3403 includes memory components 3416, 3417, and 3418. A second rank of memory module 3403 includes memory components 3444, 3445, and 3446. A first rank of memory module 3130 includes memory components 3431, 3432, and 3433. A second rank of memory module 3430 includes memory components 3434, 3435, and 3436.

The memory system is organized into slices across the memory controller component and the memory modules. Examples of these slices include slice 3413, slice 3414, and slice 3415. Each slice comprises one memory component of each rank. In this embodiment, an address bus 3407 and an address/control clock conductor 3409 are coupled to each memory component in a slice among multiple memory modules. Address bus 3407 is coupled to memory controller component 3402, via splitter 3459 to memory components 3416 and 3444, and via splitter 3461 to memory components 3431 and 3434. A termination component 3452 is coupled to address bus 3407 near memory controller component 3402, and may, for example, be incorporated into memory controller component 3402. A termination component 3463 is coupled near an opposite terminus of address bus 3407, near splitter 3461. A termination component 3419 is coupled to address bus 3407, preferably within memory module 3403. A termination component 3457 is coupled to address bus 3407, preferably within memory module 3430.

Address/control clock 3404 is coupled to address/control clock conductor 3409, which is coupled to memory controller component 3402, via splitter 3460 to memory components 3416 and 3444, and via splitter 3462 to memory components 3431 and 3434. A termination component 3464 is coupled near a terminus of address/control clock conductor 3409, near splitter 3462. A termination component 3422 is coupled to the address/control clock conductor 3409, preferably within memory module 3403. A termination component 3458 is coupled to the address/control clock conductor 3409, preferably within memory module 3430.

In this example, each control/address wire is tapped using some form of splitting component S. This splitter could be a passive impedance matcher (three resistors in a delta- or y-configuration) or some form of active buffer or switch element. In either case, the electrical impedance of each wire is maintained down its length (within manufacturing limits) so that signal integrity is kept high. As in the previous configuration, each split-off control/address bus is routed onto a memory module, past all the memory components, and into a termination component.

Figure 35:
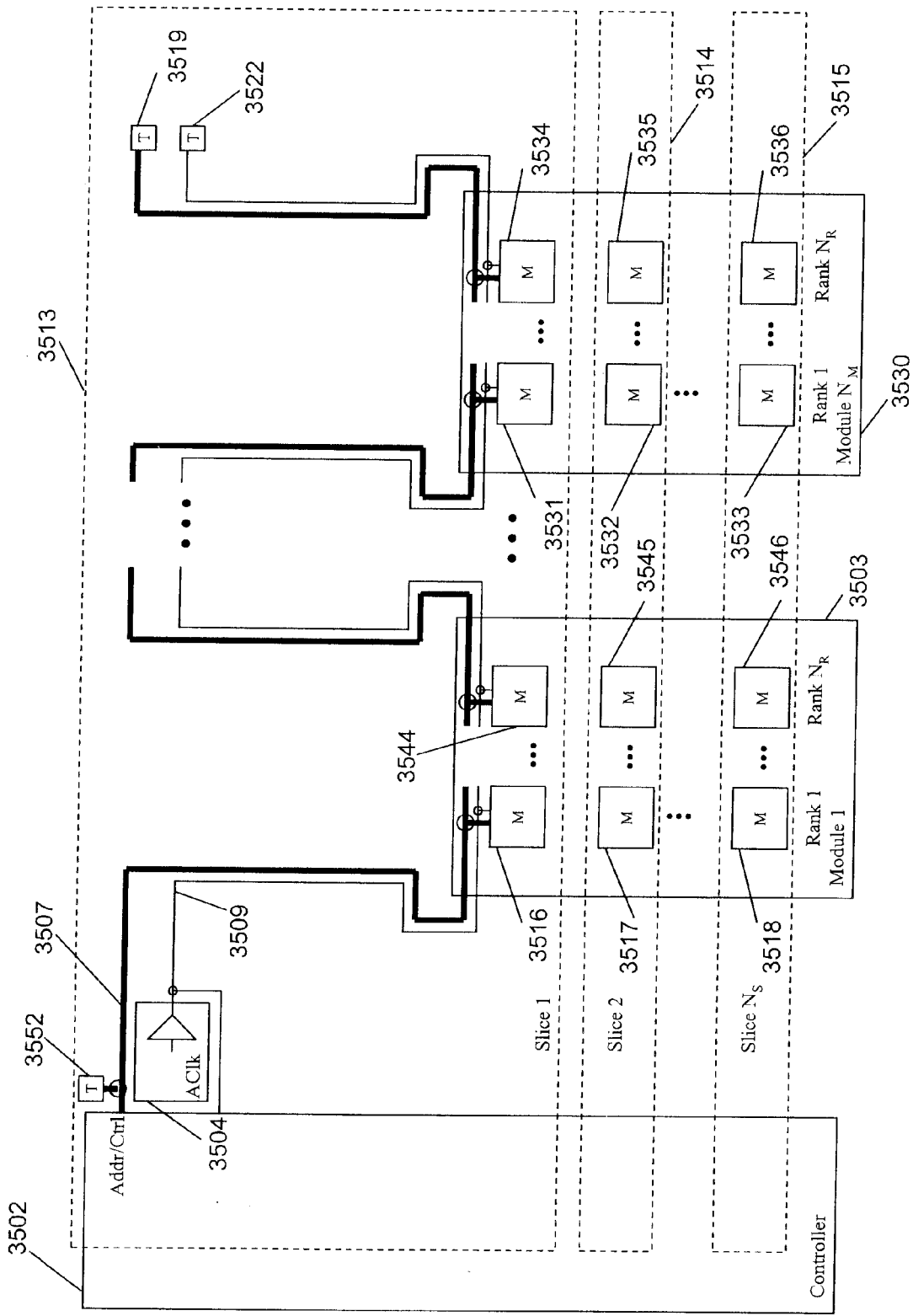
FIG. 35 is a block diagram illustrating a memory system that comprises multiple ranks of memory components and multiple memory modules with a single control/address bus that is shared by all the memory modules in accordance with an embodiment of the invention.

FIG. 35 is a block diagram illustrating a memory system that comprises multiple ranks of memory components and multiple memory modules with a single control/address bus that is shared by all the memory modules in accordance with an embodiment of the invention. The memory system comprises memory controller component 3502, memory module 3503, memory module 3530, address/control clock 3504, termination component 3519, and termination component 3522.

Within each memory module, memory components are organized in ranks. A first rank of memory module 3503 includes memory components 3516, 3517, and 3518. A second rank of memory module 2903 includes memory components 3544, 3545, and 3546. A first rank of memory module 3530 includes memory components 3531, 3532, and 3533. A second rank of memory module 3530 includes memory components 3534, 3535, and 3536.

The memory system is organized into slices across the memory controller component and the memory modules. Examples of these slices include slice 3513, slice 3514, and slice 3515. Each slice comprises one memory component of each rank. In this embodiment, each slice across memory modules shares a common daisy-chained address bus 3507 and a common daisy-chained address/control clock conductor 3509. Address bus 3507 is coupled to memory controller component 3502 and memory components 3516, 3544, 3531, and 3534. A termination component 3552 is coupled to address bus 3507 near memory controller component 3502, and may, for example, be incorporated into memory controller component 3502. A termination component 3519 is coupled near an opposite terminus of address bus 3507.

Address/control clock 3504 is coupled to address/control clock conductor 3509, which is coupled to memory controller component 3502 and to memory components 3516, 3544, 3531, and 3534. A termination component 3522 is coupled near a terminus of address/control clock conductor 3509.

Unlike the memory system of FIG. 34, instead of using some kind of splitting component, each control/address wire is routed onto a memory module, past all the memory components, and back off the module and onto the main board to chain through another memory module or to pass into a termination component.

As can be seen with reference to the Figures described above, embodiments of the invention allow implementation of a memory system, a memory component, and/or a memory controller component. Within these embodiments skew may be measured according to bit time and/or according to a timing signal. In some embodiments, logic in the memory controller component accommodates skew, while in other embodiments, logic in a memory component accommodates skew. The skew may be greater than a bit time or greater than a cycle time.

One embodiment of the invention provides a memory module with a first wire carrying a first signal. The first wire is connected to a first module contact pin. The first wire is connected to a first pin of a first memory component. The first wire is connected to a first termination device. The first wire maintains an approximately constant first impedance value along its full length on the memory module. The termination component approximately matches this first impedance value. Optionally, there is a second memory component to which the first wire does not connect. Optionally, the first signal carries principally information selected from control information, address information, and data information during normal operation. Optionally, the termination device is a component separate from the first memory component on the memory module. Optionally, the termination device is integrated into first memory component on the memory module. Such a memory module may be connected to a memory controller component and may be used in a memory system.

One embodiment of the invention provides a memory module with a first wire carrying a first signal and a second wire carrying a second signal. The first wire connects to a first module contact pin. The second wire connects to a second module contact pin. The first wire connects to a first pin of a first memory component. The second wire connects to a second pin of the first memory component. The first wire connects to a third pin of a second memory component. The second wire does not connect to a pin of the second memory component. The first wire connects to a first termination device. The second wire connects to a second termination device. The first wire maintains an approximately constant first impedance value along its full length on the memory module. The second wire maintains an approximately constant second impedance value along its full length on the memory module. The first termination component approximately matches the first impedance value. The second termination component approximately matches the second impedance value. Optionally, the first and/or second termination device is a component separate from the first memory component on the memory module. Optionally, the first and/or second termination device is a integrated into the first memory component on the memory module. Optionally, the first signal carries address information and the second signal carries data information. Such a memory module may be connected to a memory controller component and may be used in a memory system.

One embodiment of the invention provides a method for conducting memory operations in a memory system. The memory system includes a memory controller component and a rank of memory components. The memory components include slices. The slices include a first slice and a second slice. The memory controller component is coupled to conductors, including a common address bus connecting the memory controller component to the first slice and the second slice, a first data bus connecting the memory controller component to the first slice, and a second data bus connecting the memory controller component to the second slice. The first data bus is separate from the second data bus The method includes the step of providing a signal to one of the conductors. The signal may be an address signal, a write data signal, or a read data signal. The propagation delay of the one of the conductors is longer than an amount of time that an element of information represented by the signal is applied to that conductor. Optionally, the method may include the step of providing a first data signal to the first data bus and a second data signal to the second data bus. The first data signal relates specifically to the first slice and the second data signal relates specifically to the second slice. In one example, the first data signal carries data to or from the first slice, while the second data signal carries data to or from the second slice.

One embodiment of the invention provides a method for coordinating memory operations among a first memory component and a second memory component. The method includes the step of applying a first address signal relating to the first memory component to a common address bus over a first time interval. The common address bus is coupled to the first memory component and the second memory component. The method also includes the step of applying a second address signal relating to the second memory component to the common address bus over a second time interval. The first time interval is shorter than a propagation delay of the common address bus, and the second time interval is shorter than a common address bus propagation delay of the common address bus. The method also includes the step of controlling a first memory operation of the first memory component using a first memory component timing signal. The first memory component timing signal is dependent upon a first relationship between the common address bus propagation delay and a first data bus propagation delay of a first data bus coupled to the first memory component. The method also includes the step of controlling a second memory operation of the second memory component using a second memory component timing signal. The second memory component timing signal is dependent upon a second relationship between the common address bus propagation delay and a second data bus propagation delay of a second data bus coupled to the second memory component.

One embodiment of the invention (referred to as description B) provides a memory system with a memory controller component, a single rank of memory components on a single memory module, a common address bus connecting controller to all memory components of the rank in succession, separate data buses connecting controller to each memory component (slice) of the rank, an address bus carrying control and address signals from controller past each memory component in succession, data buses carrying read data signals from each memory component (slice) of the rank to the controller, data buses carrying write data signals from controller to each memory component (slice) of the rank, data buses carrying write mask signals from controller to each memory component (slice) of the rank, the read data and write data signals of each slice sharing the same data bus wires (bidirectional), the buses designed so that successive pieces of information transmitted on a wire do not interfere, a periodic clock signal accompanying the control and address signals and used by the controller to transmit information and by the memory components to receive information, a periodic clock signal accompanying each slice of write data signals and optional write mask signals and which is used by the controller to transmit information and by a memory component to receive information, and a periodic clock signal accompanying each slice of read data signals and which is used by a memory component to transmit information and by the controller to receive information.

One embodiment of the invention (referred to as description A) provides a memory system with features taken from the above description (description B) and also a timing signal associated with control and address signals which duplicates the propagation delay of these signals and which is used by the controller to transmit information and by the memory components to receive information, a timing signal associated with each slice of write data signals and optional write mask signals which duplicates the propagation delay of these signals and which is used by the controller to transmit information and by a memory component to receive information, a timing signal associated with each slice of read data signals which duplicates the propagation delay of these signals and which is used by a memory component to transmit information and by the controller to receive information, wherein a propagation delay of a wire carrying control and address signals from the controller to the last memory component is longer than the length of time that a piece of information is transmitted on the wire by the controller.

One embodiment of the invention provides a memory system with features taken from the above description (description A) wherein a propagation delay of a wire carrying write data signals and optional write mask signals from the controller to a memory component is longer than the length of time that a piece of information is transmitted on the wire by the controller.

One embodiment of the invention provides a memory system with features taken from the above description (description A) wherein a propagation delay of a wire carrying read data signals from a memory component to the controller is longer than the length of time that a piece of information is transmitted on the wire by the memory component.

One embodiment of the invention provides a memory system with features taken from the above description (description A) wherein the alignments of the timing signals of the write data transmitter slices of the controller are adjusted to be approximately the same regardless of the number of slices in the rank, wherein the alignments of timing signals of the read data receiver slices of the controller are adjusted to be approximately the same regardless of the number of slices in the rank, and the alignments of timing signals of the read data receiver slices of the controller are adjusted to be approximately the same as the timing signals of the write data transmitter slices.

One embodiment of the invention provides a memory system with features taken from the above description (description A) wherein the alignments of the timing signals of the write data transmitter slices of the controller are adjusted to be mostly different from one another.

One embodiment of the invention provides a memory system with features taken from the above description (description A) wherein the alignments of timing signals of the read data receiver slices of the controller are adjusted to be mostly different from one another.

One embodiment of the invention provides a memory system with features taken from the above description (description A) wherein the alignments of the timing signals of the read data transmitter of each memory component is adjusted to be the approximately the same as the timing signals of the write data receiver in the same memory component and wherein the alignments of the timing signals will be different for each memory component slice in the rank.

One embodiment of the invention provides a memory system with features taken from the above description (description A) wherein the alignments of the timing signals of the write data transmitter of each memory component is adjusted to be different from the timing signals of the read data receiver in the same memory component.

Numerous variations to the embodiments described herein are possible without deviating from the scope of the claims set forth herein. Examples of these variations are described below. These examples may be applied to control and address signals, read data signals, write data signals, and optional write mask signals. For example, a timing signal associated with the such signals may be generated by an external clock component or by a controller component. That timing signal may travel on wires that have essentially the same topology as the wires carrying such signals. That timing signal may be generated from the information contained on the wires carrying such signals or from a timing signal associated with any of such signals. That timing signal may be asserted an integral number of times during the interval that each piece of information is present on a wire carrying such signals. As another variation, an integral number of pieces of information may be asserted on a wire carrying such signals each time the timing signal associated with such signals is asserted. As yet another variation, an integral number of pieces of information may be asserted on a wire carrying such signals each time the timing signal associated with such signals is asserted an integral number of times. The point when a timing signal associated with such signals is asserted may have an offset relative to the time interval that each piece of information is present on a wire carrying such signals.

As examples of other variations, the termination components for some of the signals may be on any of a main printed wiring board, a memory module board, a memory component, or a controller component. Also, two or more ranks of memory components may be present on the memory module and with some control and address signals connecting to all memory components and with some control and address signals connecting to some of the memory components. It is also possible for two or more modules of memory components to be present in the memory system, with some control and address signals connecting to all memory components and with some control and address signals connecting to some of the memory components.

Various aspects of the subject-matter described herein are set out non-exhaustively in the following numbered clauses:

1. A memory system comprising:
   a memory controller component;
   a rank of memory components comprising slices; and
   conductors coupling the memory controller component to the rank of memory components and coupling the memory controller component to the slices of the rank of memory components, wherein a propagation delay of one of the conductors carrying a signal selected from a group consisting of an address signal, a write data signal, and a read data signal is longer than an amount of time that an element of information represented by the signal is applied to the conductor, wherein the conductors comprise:
   a common address bus connecting the memory controller component to each of the slices of the rank in succession; and
   separate data buses connecting the memory controller component to each of the slices of the rank.

2. The memory system of clause 1 wherein the common address bus is coupled to a plurality of the slices.

3. The memory system of clause 2 wherein the separate data buses comprise:
   a first data bus connecting the memory controller component to a first slice of the slices; and
   a second data bus connecting the memory controller component to a second slice of the slices, wherein the first data bus and the second data bus carry different signals independently of each other.

4. A memory system comprising:
   a memory controller component;
   a rank of memory components comprising slices; and
   conductors coupling the memory controller component to the slices of the rank of memory components, wherein the conductors comprise a first data bus coupled to the memory controller component and the first slice and a second data bus coupled to the memory controller component and the second slice, the first data bus being separate from the second data bus, wherein first elements of information relating to the first slice are driven on a first conductor of the conductors coupled to the first slice for a first element time interval from a first time to a second time, wherein second elements of information relating to the second slice are driven on a second conductor of the conductors coupled to the second slice for a second element time interval from a third time to a fourth time, and wherein the memory controller component comprises a logic circuit adapted to accommodate a difference between the first time and the third time that is greater than a first duration of the first element time interval.

5. A memory system comprising:
   a memory controller component;
   a rank of memory components comprising slices, the slices comprising a first slice and a second slice;
   conductors coupling the memory controller component to the slices of the rank of memory components, wherein the conductors comprise a first data bus coupled to the memory controller component and the first slice and a second data bus coupled to the memory controller component and the second slice, the first data bus being separate from the second data bus, wherein first elements of information relating to the first slice are driven on a first conductor of the conductors coupled to the first slice for a first element time interval from a first time to a second time, wherein second elements of information relating to the second slice are driven on a second conductor of the conductors coupled to the second slice for a second element time interval from a third time to a fourth time; and
   a logic circuit adapted to accommodate a difference between the first time and the third time that is greater than a cycle time of a clock circuit of the memory controller component.

6. The memory system of clause 5 wherein the logic circuit is incorporated into the memory controller component.

7. The memory system of clause 5 wherein the logic circuit is incorporated into at least one of the memory components.

8. A memory system comprising:
   a memory controller component;
   a rank of memory components comprising slices, the slices comprising a first slice and a second slice;
   a common address bus connecting the memory controller component to the first slice and the second slice in succession;
   a first data bus connecting the memory controller component to the first slice; and
   a second data bus connecting the memory controller component to the second slice, the first data bus being separate from the second data bus, wherein first elements of information are driven on the first data bus for a first element time interval from a first time to a second time, wherein second elements of information are driven on the second data bus for a second element time interval from a third time to a fourth time, wherein third elements of information are driven on the common address bus for a third element time interval from a fifth time to a sixth time, wherein there is a first access time interval between the fifth time and the first time, wherein fourth elements of information are driven on the common address bus for a fourth element time interval from a seventh time to an eighth time, wherein there is a second access time interval between the seventh time and the third time, and wherein at least one of the memory components of the rank of memory components comprises a logic circuit adapted to accommodate a difference between the first access time interval and the second access time interval that is greater than a first duration of the first element time interval.

9. A memory system comprising:
   a memory controller component;
   a rank of memory components comprising slices, the slices comprising a first slice and a second slice;
   conductors coupling the memory controller component to the slices of the rank of memory components, wherein the conductors comprise a first data bus coupled to the memory controller component and the first slice and a second data bus coupled to the memory controller component and the second slice, the first data bus being separate from the second data bus, wherein first elements of information relating to the first slice are driven on a first conductor of the conductors coupled to the first slice for a first element time interval, the first element time interval associated with a first timing signal event, wherein second elements of information relating to the second slice are driven on a second conductor of the conductors coupled to the second slice for a second element time interval, the second element time interval associated with a second timing signal event; and
a logic circuit adapted to accommodate a difference between the first timing signal event and the second timing signal event that is greater than a duration selected from a group consisting of the first element time interval and a cycle time of a clock circuit of the memory controller component.

10. The memory system of clause 9 wherein the logic circuit is incorporated into the memory controller component.

11. The memory system of clause 9 wherein the logic circuit is incorporated into at least one of the memory components.

12. A memory system comprising:
a memory controller component;
a rank of memory components comprising slices, the slices comprising a first slice and a second slice;
a common address bus connecting the memory controller component to the first slice and the second slice in succession;
a first data bus connecting the memory controller component to the first slice; and
a second data bus connecting the memory controller component to the second slice, wherein first elements of information are driven on the first data bus for a first element time interval, the first element time interval associated with a first timing signal event, wherein second elements of information are driven on the second data bus for a second element time interval, the second element time interval associated with a second timing signal event, wherein third elements of information are driven on the common address bus for a third element time interval, the third element time interval associated with a third timing signal event, wherein there is a first access time interval between the third timing signal event and the first timing signal event, wherein fourth elements of information are driven on the common address bus for a fourth element time interval, the fourth element time interval associated with a fourth timing signal event, wherein there is a second access time interval between the fourth timing signal event and the second timing signal event, and wherein at least one of the memory components of the rank of memory components comprises a logic circuit adapted to accommodate a difference between the first access time interval and the second access time interval that is greater than a first duration of the first element time interval.

13. A memory component adapted to be coupled to a memory controller component as a first slice of a rank of memory components, the rank further comprising a second slice, wherein conductors couple the memory controller component to the first slice and the second slice, the conductors comprising a first data bus coupling the first slice to the memory controller component and a second data bus coupling the second slice to the memory controller component, the first data bus being separate from the second data bus, the memory component comprising:
a logic circuit adapted to cause the memory controller component to accommodate a difference between a first time and a third time that is greater than a first duration of a first element time interval, wherein first elements of information are driven on a first conductor of the conductors coupled to the first slice for the first element time interval from the first time to a second time, wherein second elements of information relating to the second slice are driven on a second conductor of the conductors coupled to the second slice for a second element time interval from the third time to a fourth time.

14. A memory component adapted to be coupled to a memory controller component as a first slice of a rank of memory components, the rank further comprising a second slice, a common address bus connecting the memory controller component to the first slice and the second slice in succession, a first data bus connecting the memory controller component to the first slice, a second data bus connecting the memory controller component to the second slice, the first data bus being separate from the second data bus, the memory component comprising:
a logic circuit adapted to accommodate a difference between a first access time interval and a second access time interval that is greater than a first duration of a first element time interval, wherein first elements of information are driven on the first data bus for the first element time interval from a first time to a second time, wherein second elements of information are driven on the second data bus for a second element time interval from a third time to a fourth time, wherein third elements of information are driven on the common address bus for a third element time interval from a fifth time to a sixth time, wherein the first access time interval occurs between the fifth time and the first time, wherein fourth elements of information are driven on the common address bus for a fourth element time interval from a seventh time to an eighth time, wherein the second access time interval occurs between the seventh time and the third time.

15. A memory component adapted to be coupled to a memory controller component as a first slice of a rank of memory components, the rank further comprising a second slice, wherein conductors couple the memory controller component to the slices of the rank of memory components, the conductors comprising a first data bus coupled to the memory controller component and the first slice and a second data bus coupled to the memory controller component and the second slice, the first data bus being separate from the second data bus, the memory component comprising:
a logic circuit adapted to cause the memory controller component to accommodate a difference between a first timing signal event and a second timing signal event that is greater than a first duration of a first element time interval, wherein first elements of information are driven on a first conductor of the conductors coupled to the first slice for the first element time interval, the first element time interval associated with the first timing signal event, wherein second elements of information relating to the second slice are driven on a second conductor of the conductors coupled to the second slice for a second element time interval, the second element time interval associated with the second timing signal event.

16. A memory component adapted to be coupled to a memory controller component as a first slice of a rank of memory components, the rank of memory components further comprising a second slice, a common address bus connecting the memory controller component to the first slice and the second slice in succession, a first data bus connecting the memory controller component to the first slice, a second data bus connecting the memory controller component to the second slice, the memory component comprising:
a logic circuit adapted to accommodate a difference between a first access time interval and a second access time interval that is greater than a first duration of a first element time interval, wherein first elements of information are driven on the first data bus for the first element time interval, the first element time interval associated with a first timing signal event, wherein second elements of information are driven on the second data bus for a second element time interval, the second element time interval associated with a second timing signal event, wherein third elements of information are driven on the common address bus for a third element time interval, the third element time interval associated with a third timing signal event, wherein the first access time interval occurs between the third timing signal event and the first timing signal event, wherein fourth elements of information are driven on the common address bus for a fourth element time interval, the fourth element time interval associated with a fourth timing signal event, wherein the second access time interval occurs between the fourth timing signal event and the second timing signal event.

17. A method for conducting memory operations in a memory system comprising a memory controller component and a rank of memory components comprising slices, the slices comprising a first slice and a second slice, the memory controller component coupled to conductors, the conductors including a common address bus connecting the memory controller component to the first slice and the second slice, a first data bus connecting the memory controller component to the first slice, and a second data bus connecting the memory controller component to the second slice, the first data bus being separate from the second data bus, the method comprising the step of:
providing a signal to one of the conductors, the signal selected from a group consisting of an address signal, a write data signal, and a read data signal, wherein the propagation delay of the one of the conductors is longer than an amount of time that an element of information represented by the signal is applied to the conductor.

18. The method of clause 17 further comprising the step of:
providing a first data signal to the first data bus and a second data signal to the second data bus, the first data signal relating specifically to the first slice and the second data signal relating specifically to the second slice.

19. A method for coordinating memory operations among a first memory component and a second memory component, the method comprising the steps of:
applying a first address signal relating to the first memory component to a common address bus over a first time interval, the common address bus coupled to the first memory component and the second memory component;
applying a second address signal relating to the second memory component to the common address bus over a second time interval, the first time interval being shorter than a propagation delay of the common address bus and the second time interval being shorter than a common address bus propagation delay of the common address bus; and
controlling a first memory operation of the first memory component using a first memory component timing signal, the first memory component timing signal dependent upon a first relationship between the common address bus propagation delay and a first data bus propagation delay of a first data bus coupled to the first memory component; and
controlling a second memory operation of the second memory component using a second memory component timing signal, the second memory component timing signal dependent upon a second relationship between the common address bus propagation delay and a second data bus propagation delay of a second data bus coupled to the second memory component.

20. A module comprising:
a first memory device having a memory array;
a first signal line coupled to the first memory device, the first signal line to provide first data to the first memory device, the first data to be stored in the memory array of the first memory device during a write operation;
a second memory device having a memory array;
a second signal line coupled to the second memory device, the second signal line to provide second data to the second memory device, the second data to be stored in the memory array of the second memory device during the write operation;
a first termination component; and
a control signal path coupled to the first memory device, the second memory device, and the first termination component such that a write command propagating on the control signal path propagates past the first memory device and the second memory device before reaching the first termination component, wherein the write command specifies the write operation.

21. The module of clause 20, further comprising a third signal line to convey a clock signal that indicates when the write command propagating on the control signal path is to be sampled by the first memory device, wherein the clock signal also indicates when the write command propagating on the control signal path is to be sampled by the second memory device.

22. The module of clause 20, further comprising:
a third signal line coupled to the first memory device, the third signal line to convey a first signal that indicates when the first memory device is to sample the first data in response to the write command; and
a second signal line coupled to the second memory device, the second signal line to convey a second signal that indicates when the second memory device is to sample the second data in response to the write command.

23. The module of clause 20, further comprising:
a second termination component coupled to the first signal line, wherein the second termination component is disposed on the first memory device; and
a third termination component coupled to the second signal line, wherein the third termination component is disposed on the second memory device.

24. A module comprising:
a first rank of memory devices including a first memory device, and a second memory device;
a second rank of memory devices including a third memory device, and a fourth memory device;
a first data signal line coupled to the first memory device and the third memory device;
a second data signal line coupled to the second memory device and the fourth memory device;
a termination component; and
a signal path coupled to the first rank of memory devices and the second rank of memory devices memory device, and the termination component such that control information propagating on the control signal path propagates past the first rank of memory devices and the second rank of memory devices before reaching the termination component.

25. The module of clause 24, wherein the control information specifies a write operation such that data is provided, via the first and second signal lines, to one of the first rank of memory devices and the second rank of memory device.

26. The module of clause 24, wherein the control information propagating on the signal path propagates past the first memory device before reaching the third memory device and propagates past the third memory device before reaching the second memory device, propagates past the second memory device before reaching the fourth memory device and propagates past the fourth memory device before reaching the termination component.

27. A module comprising:
a first memory device, a second memory device, a third memory device, and a fourth memory device;
a first signal line coupled to the first memory device and the third memory device, the first signal line being dedicated to data transfers involving one of the first memory device and the third memory device;
a second signal line coupled to the second memory device and the fourth memory device, the second signal line being dedicated to data transfers involving one of the second memory device and the fourth memory device;
a first termination component; and
a control signal path coupled to the first memory device, second memory device, third memory device, fourth memory device, and the first termination component such that a command propagating on the control signal path propagates past the first memory device before reaching the third memory device, propagates past the third memory device before reaching the second memory device, propagates past the second memory device before reaching the fourth memory device, and propagates past the fourth memory device before reaching the first termination component.

28. The module of clause 27, further comprising:
a second termination component disposed on the first memory device, wherein the second termination component is coupled to the first signal line; and
a third termination component disposed on the second memory device, wherein the third termination component is coupled to the second signal line.

29. The module of clause 27, wherein
the first memory device and the second memory device are included in a first rank of memory devices; and
the third memory device and fourth memory device are included in a second rank of memory devices.

30. The module of clause 29, wherein the control signal path includes signal lines to carry address information, such that the address information propagating on the control signal path propagates past the first memory device before reaching the third memory device, propagates past the third memory device before reaching the second memory device, propagates past the second memory device before reaching the fourth memory device, and propagates past the fourth memory device before reaching the first termination component.

Accordingly, a method and apparatus for coordinating memory operations among diversely-located memory components has been described. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A memory controller component that generates a timing signal, the memory controller component to control a dynamic random access memory component (DRAM), the memory controller component comprising:
transmit circuitry to transmit, to the DRAM:
write data to be sampled by the DRAM on one or more edges of the timing signal, the timing signal requiring a first time interval to propagate from the memory controller component to the DRAM;
a first clock signal that requires a second time interval to propagate from the memory controller component to the DRAM; and
a write command to be sampled by the DRAM on one or more edges of the first clock signal, the write command associated with the write data; and
adjusting circuitry to control transmit timing within the transmit circuitry, the adjusting circuitry to adjust transmit timing of the write data and timing of the timing signal based on a difference between the first and second time intervals such that a rising edge of the timing signal at the DRAM is aligned with a rising edge of the first clock signal at the DRAM.

2. The memory controller component of claim 1, wherein the write data accompanies the timing signal while the write data and the timing signal propagate from the memory controller component to the DRAM.

3. The memory controller component of claim 1, wherein the timing signal is a strobe signal.

4. The memory controller component of claim 1, wherein the timing signal is a second clock signal.

5. The memory controller component of claim 1, wherein the transmit timing of the write data is adjusted by an amount that increases a signaling margin of the write data being sampled by the DRAM.

6. The memory controller component of claim 1, wherein the adjusting circuitry comprises circuitry to adjust a phase of a transmit clock signal that times transmission of the write data.

7. The memory controller component of claim 1, wherein the rising edge of the timing signal is aligned with the rising edge of the first clock signal to enable the DRAM to receive both the write data and the write command in a single clock domain.

8. The memory controller component of claim 1, wherein the rising edge of the timing signal is aligned with the rising edge of the first clock signal by adjusting timing of the timing signal such that the timing signal and the first clock signal transition from a low state to a high state at substantially the same time at respective timing signal inputs of the DRAM.

9. The memory controller component of claim 1, wherein the adjusting circuitry comprises clock generation circuitry to generate a plurality of phase-distributed clock signals and an internal clock signal, the plurality of phase-distributed clock signals having phase offsets that are substantially evenly distributed within a cycle time of the internal clock signal, wherein the memory controller adjusts the transmit timing of the write data using clock signals selected from the plurality of phase-distributed clock signals.

10. The memory controller of claim 9, wherein the clock generation circuitry comprises a phase-locked loop circuit to generate the internal clock signal based on a reference clock signal that has a lower frequency than the internal clock signal.

11. The memory controller component of claim 9, wherein the adjusting circuitry further comprises a plurality of phase offset selection circuits, and wherein a phase offset selection circuit of the plurality of phase offset selection circuits selects a phase-distributed clock signal from the plurality of phase-distributed clock signals to be a timing reference for transmission of the write data.

12. The memory controller of component of claim 11, wherein the phase offset selection circuit comprises a multiplexer to select the phase-distributed clock signal.

13. The memory controller component of claim 11, wherein the phase offset selection circuit comprises a phase interpolator to select the phase-distributed clock signal.

14. The memory controller component of claim 1, wherein the timing signal is transmitted such that the propagation of the timing signal from the memory controller component to the DRAM tracks propagation of the write data from the memory controller component to the DRAM.

15. The memory controller component of claim 1, wherein the first clock signal is transmitted such that the propagation of the first clock signal from the memory controller component to the DRAM via a first signal path tracks propagation of the write command from the memory controller component to the DRAM via a second signal path.

16. The memory controller component of claim 1, wherein the first clock signal is provided to the memory controller component from an external clock signal generator circuit.

17. The memory controller component of claim 1, wherein the transmit circuitry comprises:
  a first transmitter circuit to transmit the first clock signal; and
  a second transmitter circuit to transmit the write command, wherein transmission of the write command is timed using the first clock signal.

18. A memory controller component that generates a first timing signal and second timing signal, the memory controller for controlling a first dynamic random access memory component (DRAM) and a second DRAM, the memory controller component comprising:
  transmit circuitry to transmit:
    a first clock signal to the first DRAM and second DRAM, the first clock signal requiring a first time interval to propagate from the memory controller component to the first DRAM and a second time interval to propagate from the memory controller component to the second DRAM, wherein the second time interval is longer than the first time interval;
    first write data to the first DRAM but not the second DRAM, the first write data to be sampled by the first DRAM on one or more edges of the first timing signal, the first timing signal requiring a third time interval to propagate from the memory controller component to the first DRAM;
    second write data to the second DRAM but not the first DRAM, the second write data to be sampled by the second DRAM on one or more edges of the second timing signal, the second timing signal requiring a fourth time interval to propagate from the memory controller component to the second DRAM; and
    a write command to the first DRAM and second DRAM, the write command to be sampled by the first DRAM and second DRAM on one or more edges of the first clock signal and the write command indicating that the first write data is to be stored within the first DRAM and the second write data is to be stored within the second DRAM; and
  adjusting circuitry to control transmit timing within the transmit circuitry, the adjusting circuitry to adjust (i) transmit timing of the first write data and timing of the first timing signal based on a difference between the first and third time intervals such that a rising edge of the first timing signal at the first DRAM is aligned with a first rising edge of the first clock signal at the first DRAM, and (ii) transmit timing of the second write data and timing of the second timing signal based on a difference between the second and fourth time intervals such that a rising edge of the second timing signal at the second DRAM is aligned with a second rising edge of the first clock signal at the second DRAM.

19. The memory controller component of claim 18 wherein the first write data accompanies the first timing signal while the first write data and the first timing signal propagate from the memory controller component to the first DRAM, and the second write data accompanies the second timing signal while the second write data and the second timing signal propagate from the memory controller component to the second DRAM.

20. The memory controller component of claim 18, wherein the write command and the first clock signal are transmitted to the first and second DRAMs via respective sets of one or more signal lines, wherein each signal line of the respective sets of one or more signal lines is coupled to the first and second DRAMs at different points along its length such that the first clock signal and write command propagate from the memory controller component past the first DRAM to the second DRAM, wherein the first clock signal arrives at the first DRAM before arriving at any other DRAM and the write command arrives at the first DRAM before arriving at any other DRAM.

21. The memory controller component of claim 18, wherein the first rising edge of the first clock signal is the same edge as the second rising edge of the first clock signal.

22. The memory controller component of claim 18, wherein the first timing signal and second timing signal are strobe signals.

23. The memory controller component of claim 18, wherein the first timing signal and second timing signal are a second clock signal and third clock signal, respectively.

24. The memory controller component of claim 18, wherein the transmit timings of the first write data and second write data are adjusted by amounts that increase the signaling margin when the first write data and second write data are respectively sampled by the first DRAM and second DRAM.

25. A memory controller component for controlling a dynamic random access memory (DRAM), the memory controller component comprising:
  a first transmitter circuit to transmit a first clock signal to the DRAM, wherein the first clock signal requires a first time interval to propagate from the memory controller component to the DRAM;
  a second transmitter circuit to transmit a write command to the DRAM to indicate that write data is to be stored within the DRAM, wherein the write command is sampled by the DRAM on one or more edges of the first clock signal; and
  a third transmitter circuit to transmit the write data to the DRAM, wherein the write data is sampled by the DRAM on one or more edges of a timing signal, wherein the timing signal requires a second time interval to propagate from the memory controller component to the DRAM; and adjusting circuitry to adjust transmit timing of the write data and timing of the timing signal based on a difference between the first and second time intervals such that a rising edge of the timing signal is aligned with a rising edge of the first clock signal at the DRAM.

26. The memory controller component of claim 25, wherein the write data accompanies the timing signal while the write data and timing signal propagate from the memory controller component to the DRAM.

27. The memory controller component of claim 25, wherein the transmit timing of the write data is adjusted by an amount that increases a signaling margin of the write data being sampled by the DRAM.

28. The memory controller component of claim 25, wherein the adjusting circuitry comprises circuitry to adjust a phase of a first transmit clock signal that times transmission of the write data.

29. The memory controller component of claim 25, wherein the adjusting circuitry comprises circuitry to adjust the timing of the timing signal such that the timing signal and the first clock signal transition from a low state to a high state at substantially the same time at respective timing signal inputs of the DRAM.

30. The memory controller component of claim 25, wherein the adjusting circuitry comprises clock generation circuitry to generate a plurality of phase-distributed clock signals and an internal clock signal, the plurality of phase-distributed clock signals having phase offsets that are substantially evenly distributed within a cycle time of the internal clock signal, wherein the memory controller adjusts the transmit timing of the write data using clock signals selected from the plurality of phase-distributed clock signals.

31. The memory controller component of claim 25, wherein the timing signal is transmitted such that the propagation of the timing signal from the memory controller component to the DRAM tracks propagation of the write data from the memory controller component to the DRAM.

32. The memory controller component of claim 25, wherein the first clock signal is transmitted such that the propagation of the first clock signal from the memory controller component to the DRAM via a first signal path tracks propagation of the write command from the memory controller component to the DRAM via a second signal path.

33. The memory controller component of claim 25, wherein the second transmitter circuit to transmit the write command to the DRAM comprises circuitry to transmit address information to the DRAM, the address information indicating one or more storage locations within the DRAM at which the write data is to be stored.

34. A memory controller component for controlling a first dynamic random access memory (DRAM) and a second DRAM, the memory controller component comprising:
a first transmitter circuit to transmit a first clock signal to the first DRAM and second DRAM, wherein the first clock signal requires a first time interval to propagate from the memory controller component to the first DRAM and a second time interval to propagate from the memory controller component to the second DRAM, the second time interval being greater than the first time interval;
a second transmitter circuit to transmit a write command to the first DRAM and second DRAM to indicate that first write data is to be stored within the first DRAM and second write data is to be stored within the second DRAM, wherein the write command is sampled by the first DRAM and second DRAM on one or more edges of the first clock signal;
a third transmitter circuit to transmit the first write data to the first DRAM but not the second DRAM, wherein the first write data is sampled by the first DRAM on one or more edges of a first timing signal, wherein the first timing signal requires a third time interval, different from the first time interval, to propagate on a first timing signal wire from the memory controller component to the first DRAM;
a fourth transmitter circuit to transmit the second write data to the second DRAM but not the first DRAM, wherein the second write data is sampled by the second DRAM on one or more edges of a second timing signal, wherein the second timing signal requires a fourth time interval, different from the second time interval, to propagate on a second timing signal wire from the memory controller component to the second DRAM; and
an adjusting circuit to align a rising edge of the first timing signal with a first rising edge of the first clock signal at the first DRAM by adjusting timing of the first timing signal based on the difference between the first time interval and third time interval, and to align a rising edge of the second timing signal with a second rising edge of the first clock signal at the second DRAM by adjusting timing of the second timing signal based on the difference between the second time interval and fourth time interval.

35. The memory controller component of claim 34, wherein the first write data accompanies the first timing signal while the first write data and the first timing signal propagate from the memory controller component to the first DRAM, and the second write data accompanies the second timing signal while the second write data and the second timing signal propagate from the memory controller component to the second DRAM.

36. The memory controller component of claim 34, wherein the first timing signal and second timing signal are a second clock signal and third clock signal, respectively.

37. The memory controller component of claim 34, wherein the adjusting circuit comprises (i) circuitry to adjust the timing of the first timing signal by an amount that increases the signaling margin when the first write data is sampled by the first DRAM, and (ii) circuitry to adjust the timing of the second timing signal by an amount that increases the signaling margin when the second write data is sampled by the second DRAM.

38. The memory controller component of claim 34, wherein the write command and the first clock signal are transmitted to the first and second DRAMs via respective sets of one or more signal lines, wherein each signal line of the respective sets of one or more signal lines is coupled to the first and second DRAMs at different points along its length such that the first clock signal and write command propagate from the memory controller component past the first DRAM to the second DRAM, wherein the first clock signal arrives at the first DRAM before arriving at any other DRAM and the write command arrives at the first DRAM before arriving at any other DRAM.

\* \* \* \* \*